(12) United States Patent
Takiguchi et al.

(10) Patent No.: US 11,686,956 B2
(45) Date of Patent: Jun. 27, 2023

(54) LIGHT-EMITTING DEVICE

(71) Applicant: HAMAMATSU PHOTONICS K.K., Hamamatsu (JP)

(72) Inventors: Yuu Takiguchi, Hamamatsu (JP); Kazuyoshi Hirose, Hamamatsu (JP); Yoshitaka Kurosaka, Hamamatsu (JP); Takahiro Sugiyama, Hamamatsu (JP); Yoshiro Nomoto, Hamamatsu (JP); Soh Uenoyama, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 580 days.

(21) Appl. No.: 16/622,497

(22) PCT Filed: Jun. 13, 2018

(86) PCT No.: PCT/JP2018/022609
§ 371 (c)(1),
(2) Date: Dec. 13, 2019

(87) PCT Pub. No.: WO2018/230612
PCT Pub. Date: Dec. 20, 2018

(65) Prior Publication Data
US 2020/0209653 A1    Jul. 2, 2020

(30) Foreign Application Priority Data

Jun. 15, 2017    (JP) .................................. 2017-117736

(51) Int. Cl.
| | | |
|---|---|---|
| *G02F 1/015* | (2006.01) | |
| *H01S 5/00* | (2006.01) | |
| *H01S 5/068* | (2006.01) | |

(52) U.S. Cl.
CPC ............ *G02F 1/015* (2013.01); *H01S 5/0085* (2013.01); *H01S 5/06821* (2013.01); *G02F 1/0154* (2021.01)

(58) Field of Classification Search
CPC ...... G02F 1/015; G02F 1/0154; G02F 1/0156; G02F 1/0157; G02F 1/0158; G02F 1/0151; G02F 1/073
See application file for complete search history.

(56) References Cited

U.S. PATENT DOCUMENTS

| | | |
|---|---|---|
| 5,561,683 A | 10/1996 | Kwon |
| 5,583,351 A | 12/1996 | Brown et al. |

(Continued)

FOREIGN PATENT DOCUMENTS

| | | |
|---|---|---|
| CN | 1908764 A | 2/2007 |
| CN | 101040409 A | 9/2007 |

(Continued)

OTHER PUBLICATIONS

JP Office Action dated Aug. 17, 2021 from counterpart Japanese patent application No. P2019-509823 (with attached English-language translation).

(Continued)

*Primary Examiner* — Christopher Stanford
*Assistant Examiner* — Journey F Sumlar
(74) *Attorney, Agent, or Firm* — Faegre Drinker Biddle & Reath LLP

(57) ABSTRACT

The present embodiment relates to a light-emitting device that enables reduction in attenuation or diffraction effect caused by a semiconductor light-emitting device with respect to modulated light outputted from a spatial light modulator, and the light-emitting device includes the semiconductor light-emitting device that outputs light from a light output surface and the reflection type spatial light (Continued)

modulator that modulates the light. The spatial light modulator includes a light input/output surface having the area larger than the area of a light input surface of the semiconductor light-emitting device, modulates light taken through a region facing the light output surface of the semiconductor light-emitting device in the light input/output surface, and outputs the modulated light from another region of the light input/output surface to a space other than the light input surface of the semiconductor light-emitting device.

13 Claims, 60 Drawing Sheets

(56) References Cited

U.S. PATENT DOCUMENTS

| | | | |
|---|---|---|---|
| 6,005,262 | A | 12/1999 | Cunningham et al. |
| 6,810,056 | B1 | 10/2004 | Lipson et al. |
| 6,826,223 | B1 | 11/2004 | Meyer et al. |
| 9,531,160 | B2 | 12/2016 | Noda et al. |
| 9,991,669 | B2 | 6/2018 | Hirose et al. |
| 10,734,786 | B2 | 8/2020 | Hirose et al. |
| 11,031,747 | B2 | 6/2021 | Kurosaka et al. |
| 11,031,751 | B2 | 6/2021 | Kurosaka et al. |
| 2003/0010763 | A1 | 1/2003 | Fukuchi et al. |
| 2003/0235229 | A1 | 12/2003 | Deng et al. |
| 2004/0247009 | A1 | 12/2004 | Noda et al. |
| 2004/0252741 | A1 | 12/2004 | Meyer et al. |
| 2007/0008998 | A1 | 1/2007 | Ohta et al. |
| 2007/0019099 | A1 | 1/2007 | Lieberman et al. |
| 2007/0030873 | A1 | 2/2007 | Deng |
| 2007/0075318 | A1 | 4/2007 | Noda et al. |
| 2007/0177647 | A1 | 8/2007 | Noda et al. |
| 2008/0175286 | A1 | 7/2008 | Kamijima |
| 2008/0240179 | A1 | 10/2008 | Otsuka et al. |
| 2008/0259981 | A1 | 10/2008 | Wang et al. |
| 2009/0010298 | A1 | 1/2009 | Kiyota |
| 2009/0074024 | A1 | 3/2009 | Noda et al. |
| 2009/0135869 | A1 | 5/2009 | Noda et al. |
| 2009/0175304 | A1 | 7/2009 | Noda et al. |
| 2009/0232179 | A1 | 9/2009 | Ikuta |
| 2009/0289266 | A1 | 11/2009 | Lee et al. |
| 2010/0220763 | A1 | 9/2010 | Ikuta |
| 2011/0188526 | A1 | 8/2011 | Noda et al. |
| 2012/0002692 | A1 | 1/2012 | Noda et al. |
| 2012/0050694 | A1 | 3/2012 | Huang et al. |
| 2013/0039375 | A1 | 2/2013 | Noda et al. |
| 2013/0121358 | A1 | 5/2013 | Hirose et al. |
| 2013/0163626 | A1 | 6/2013 | Seurin et al. |
| 2013/0243026 | A1 | 9/2013 | Noda et al. |
| 2013/0343415 | A1 | 12/2013 | Hori et al. |
| 2014/0211822 | A1 | 7/2014 | Fattal et al. |
| 2014/0299742 | A1 | 10/2014 | Fujii |
| 2014/0348195 | A1 | 11/2014 | Sakaguchi et al. |
| 2014/0355635 | A1 | 12/2014 | Iwahashi et al. |
| 2015/0185523 | A1 | 7/2015 | Matsumoto et al. |
| 2016/0020580 | A1 | 1/2016 | Takiguchi et al. |
| 2016/0020581 | A1 | 1/2016 | Hirose et al. |
| 2016/0036201 | A1 | 2/2016 | Takiguchi et al. |
| 2016/0072258 | A1 | 3/2016 | Seurin et al. |
| 2016/0075258 | A1 | 3/2016 | Kim |
| 2016/0248224 | A1 | 8/2016 | Noda et al. |
| 2016/0257036 | A1 | 9/2016 | Fang et al. |
| 2016/0261093 | A1 | 9/2016 | Noda et al. |
| 2016/0327906 | A1 | 11/2016 | Futterer |
| 2016/0380405 | A1 | 12/2016 | Takiguchi et al. |
| 2018/0006426 | A1 | 1/2018 | Takiguchi et al. |
| 2018/0109075 | A1 | 4/2018 | Kurosaka et al. |
| 2019/0165546 | A1 | 5/2019 | Hogg et al. |
| 2019/0181613 | A1 | 6/2019 | Kurosaka et al. |
| 2019/0288483 | A1 | 9/2019 | Sugiyama et al. |
| 2019/0312410 | A1 | 10/2019 | Sugiyama et al. |
| 2020/0373739 | A1 | 11/2020 | Hirose et al. |
| 2021/0249841 | A1 | 8/2021 | Aoki et al. |

FOREIGN PATENT DOCUMENTS

| | | |
|---|---|---|
| CN | 101258652 | 9/2008 |
| CN | 101685941 A | 3/2010 |
| CN | 102447028 A | 5/2012 |
| CN | 102638003 A | 8/2012 |
| CN | 103038959 A | 4/2013 |
| CN | 103988379 A | 8/2014 |
| CN | 104471465 A | 3/2015 |
| CN | 104852278 A | 8/2015 |
| CN | 105191029 A | 12/2015 |
| CN | 105960744 A | 9/2016 |
| JP | S49-24190 U | 3/1974 |
| JP | S59-177282 A | 10/1984 |
| JP | H7-297110 A | 11/1995 |
| JP | H09-139540 A | 5/1997 |
| JP | H9-282437 A | 10/1997 |
| JP | H9-311614 A | 12/1997 |
| JP | 2006-026726 A | 2/2006 |
| JP | 2007-019277 A | 1/2007 |
| JP | 2008-256823 A | 10/2008 |
| JP | 2009-111360 A | 5/2009 |
| JP | 2009-212359 A | 9/2009 |
| JP | 2009-540593 A | 11/2009 |
| JP | 2010-283335 A | 12/2010 |
| JP | 2012-195341 A | 10/2012 |
| JP | 2013-161965 A | 8/2013 |
| JP | 2014-026083 A | 2/2014 |
| JP | 2014-027264 A | 2/2014 |
| JP | 2014-197665 A | 10/2014 |
| JP | 2014-202867 A | 10/2014 |
| JP | 2014-236127 A | 12/2014 |
| JP | 2016-122711 A | 7/2016 |
| JP | 2016-129208 A | 7/2016 |
| JP | 2016-167639 A | 9/2016 |
| JP | 2018-026463 A | 2/2018 |
| WO | WO-01/53876 A1 | 7/2001 |
| WO | WO 2008/041138 A2 | 4/2008 |
| WO | WO 2012/035620 A1 | 3/2012 |
| WO | WO 2012/036300 A1 | 3/2012 |
| WO | WO-2014/017289 A1 | 1/2014 |
| WO | WO-2014/136607 A1 | 9/2014 |
| WO | WO-2014/136955 A1 | 9/2014 |
| WO | WO-2014/136962 A1 | 9/2014 |
| WO | WO 2014/175447 A1 | 10/2014 |
| WO | WO-2015/008627 A1 | 1/2015 |
| WO | WO 2015/118741 A1 | 8/2015 |
| WO | WO 2016/031965 A1 | 3/2016 |
| WO | WO-2016/111332 A1 | 7/2016 |
| WO | WO-2016/148075 A1 | 9/2016 |
| WO | WO-2017/191320 A1 | 11/2017 |

OTHER PUBLICATIONS

English-language translation of International Preliminary Report on Patentability (IPRP) dated Jun. 18, 2020 that issued in WO Patent Application No. PCT/JP2018/043843.

English-language translation of International Preliminary Report on Patentability (IPRP) dated Dec. 17, 2020 that issued in WO Patent Application No. PCT/JP2019/022363.

Kurosaka et al., "Phase-modulating lasers toward on-chip integration", Scientific Reports, Jul. 26, 2016, vol. 6, p. 30138.

Kurosaka et al., "Effects of non-lasing band in two-dimensional photonic-crystal lasers clarified using omnidirectional band structure", Optics Express, Sep. 2012, vol. 20, No. 19, p. 21773-p. 21783.

Peng, et al., "Coupled-wave analysis for photonic-crystal surfaceemitting lasers on air holes with arbitrary sidewalls", Optics Express, vol. 19, No. 24, 2011, p. 24672-p. 24686.

K. Sakai et al., "Coupled-Wave Theory for Square-Lattice Photonic Crystal Lasers with TE Polarization", IEEE J.Q.E.46, 2010, p. 788-p. 795.

Lee, "Sampled Fourier Transform Hologram Generated by Computer", Applied Optics, Mar. 1970, vol. 9, No. 3, p. 639-p. 644.

International Preliminary Report on Patentability dated Mar. 21, 2019 for PCT/JP2017/031466.

(56) References Cited

OTHER PUBLICATIONS

International Preliminary Report on Patentability dated Oct. 10, 2019 for PCT/JP2018/012188.
International Preliminary Report on Patentability dated Oct. 10, 2019 for PCT/JP2018/012191.
International Preliminary Report on Patentability dated Feb. 21, 2019 for PCT/JP2017/029152.
International Preliminary Report on Patentability dated Dec. 26, 2019 for PCT/JP2018/022609.
JP Office Action dated Mar. 23, 2021 from counterpart Japanese patent application No. 2017-117736 (with attached English-language translation).

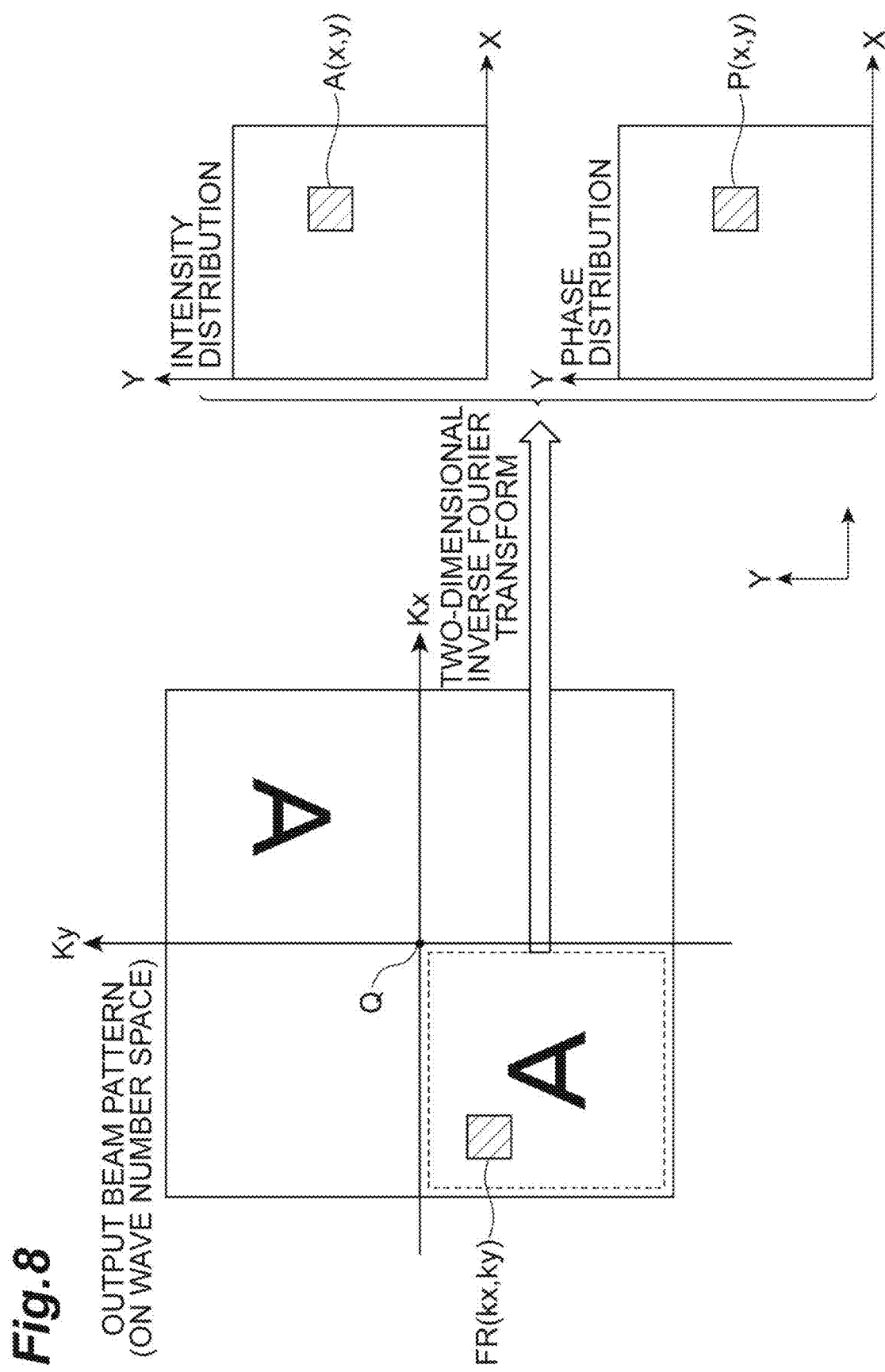

ORIGINAL IMAGE

OBTAINED BEAM PATTERN

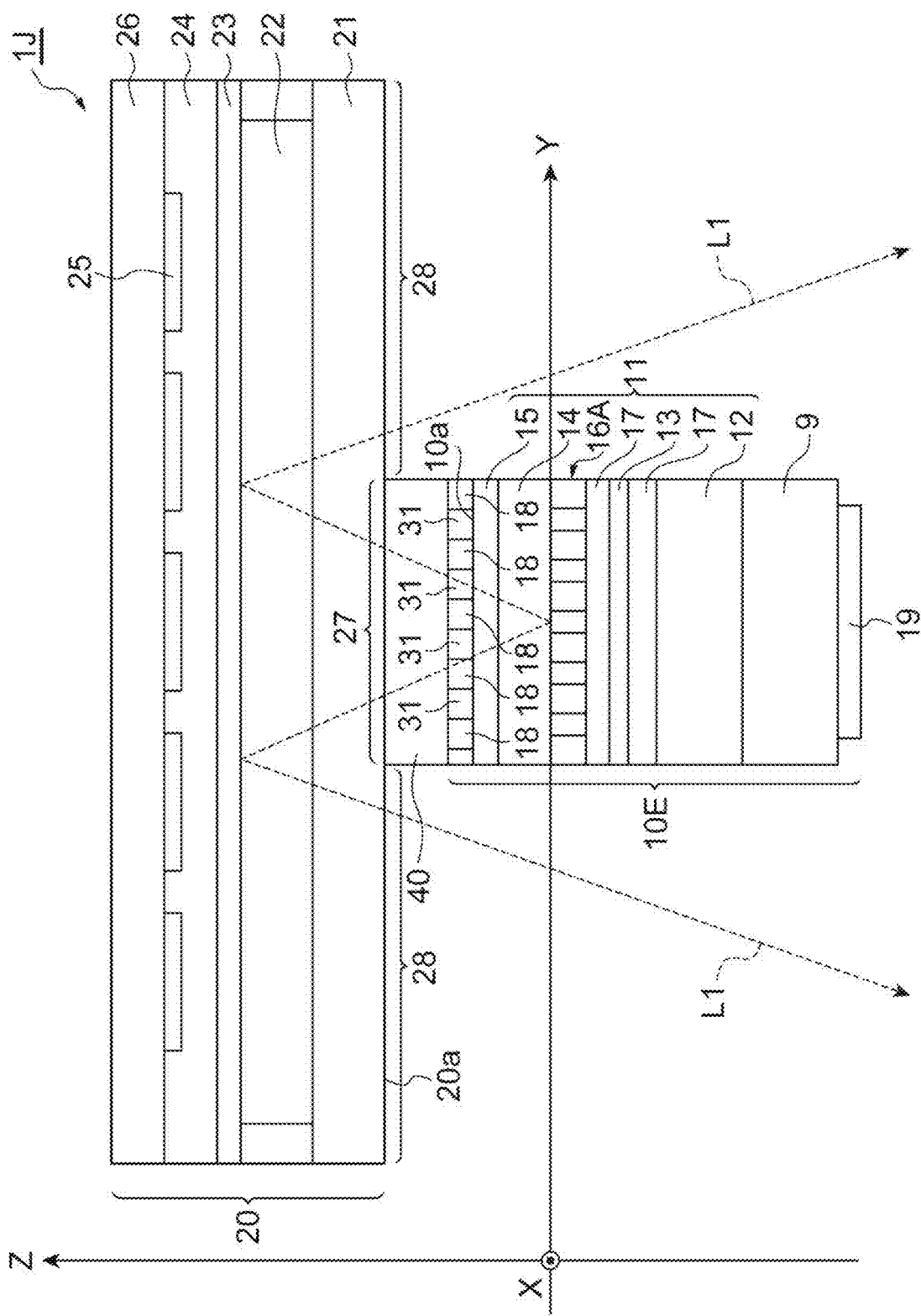

Fig.44A

| R | R | R |
|---|---|---|
| G | G | G |
| B | B | B |

Fig.44B

| R | G | B |
|---|---|---|
| R | G | B |
| R | G | B |

Fig.44C

| R | G | B |
|---|---|---|
| B | R | G |
| G | B | R |

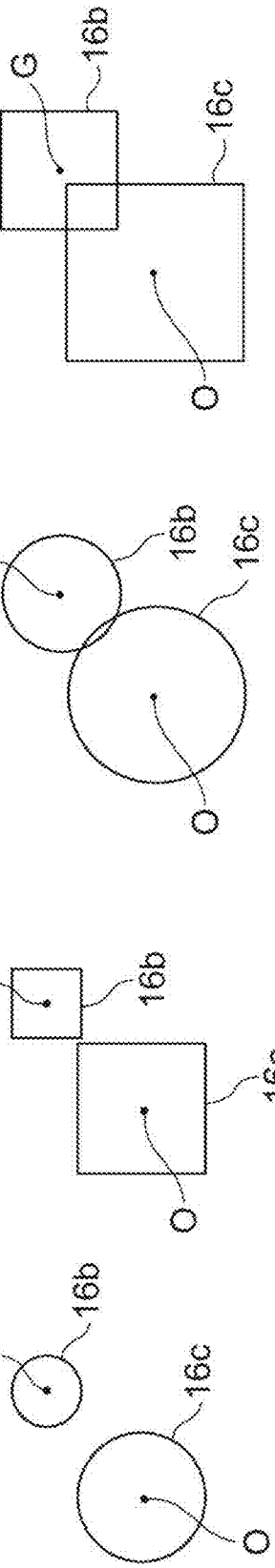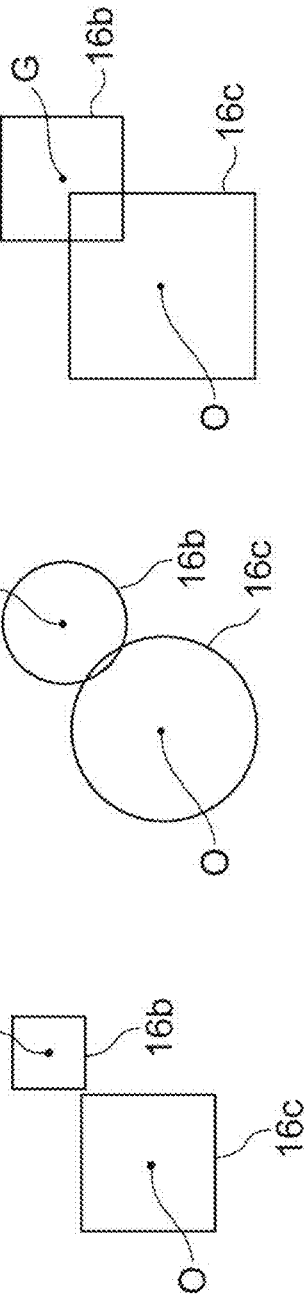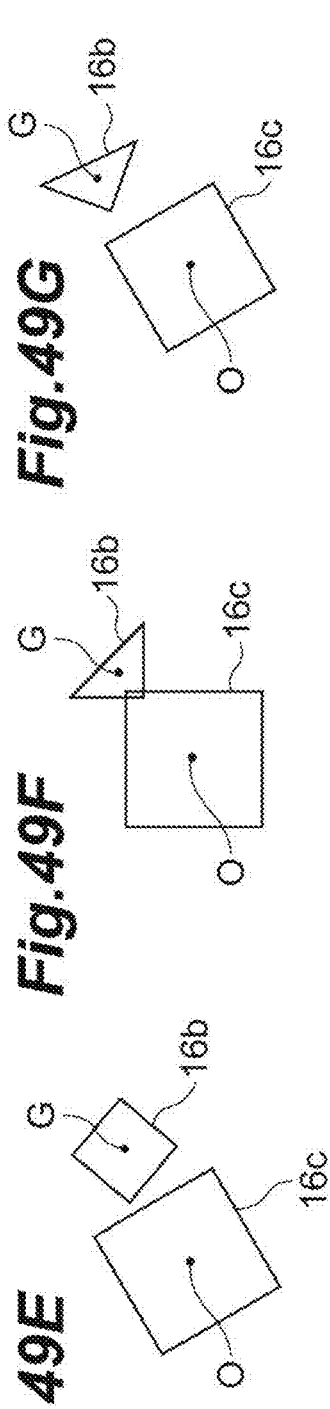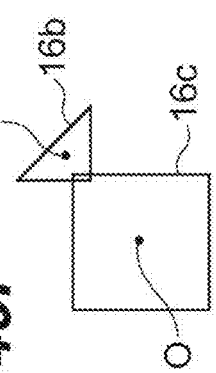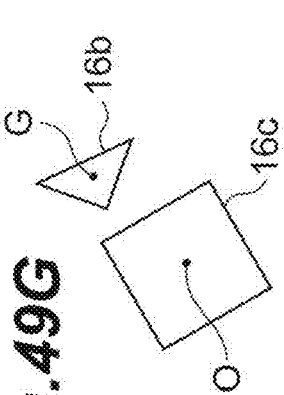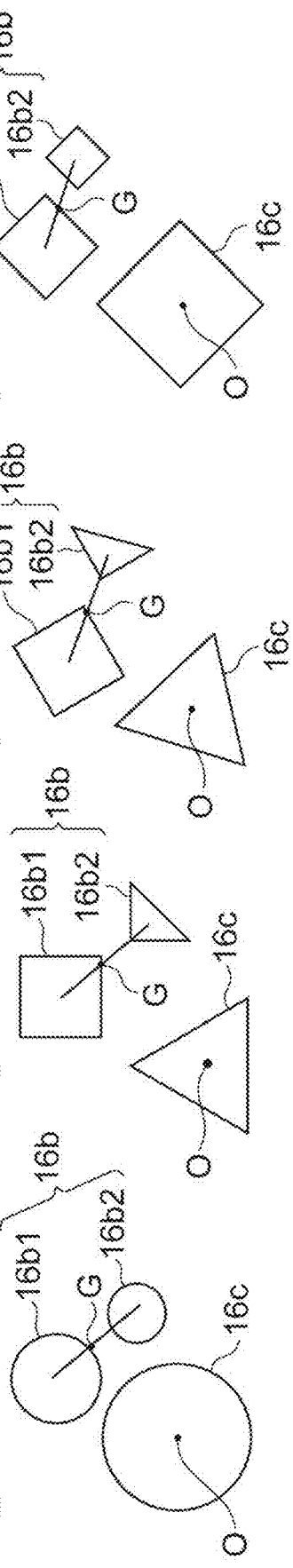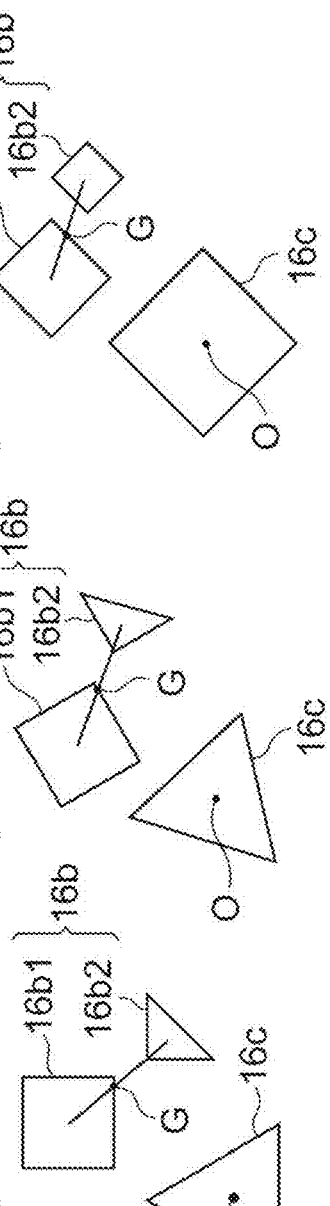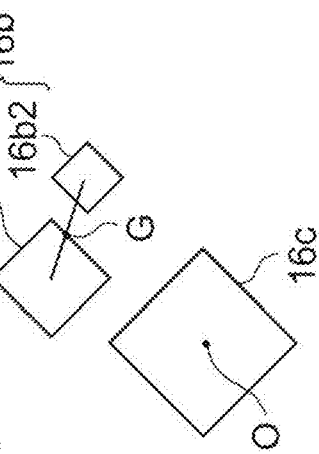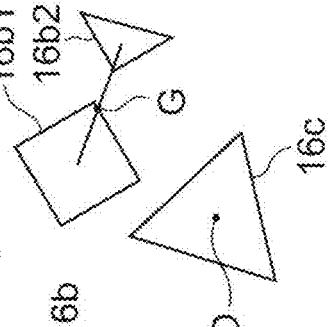

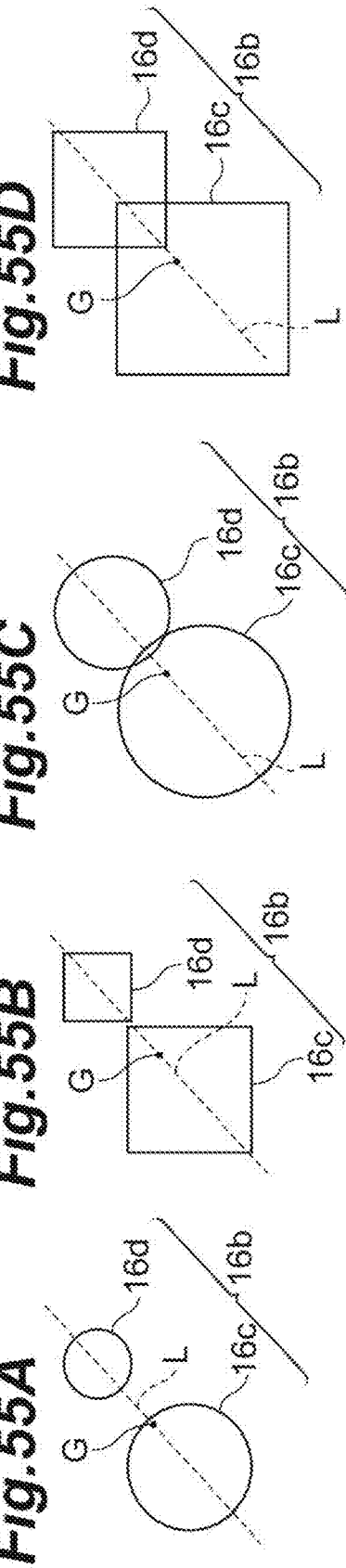
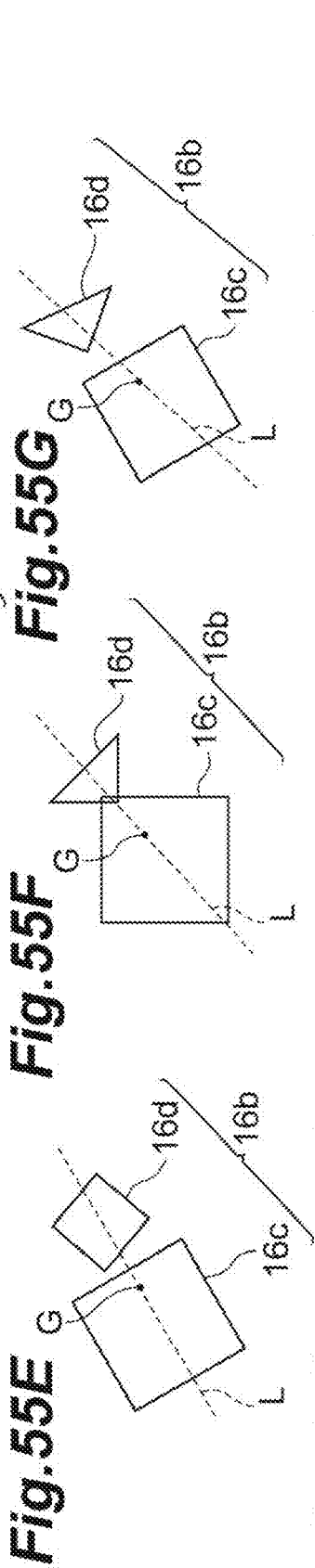
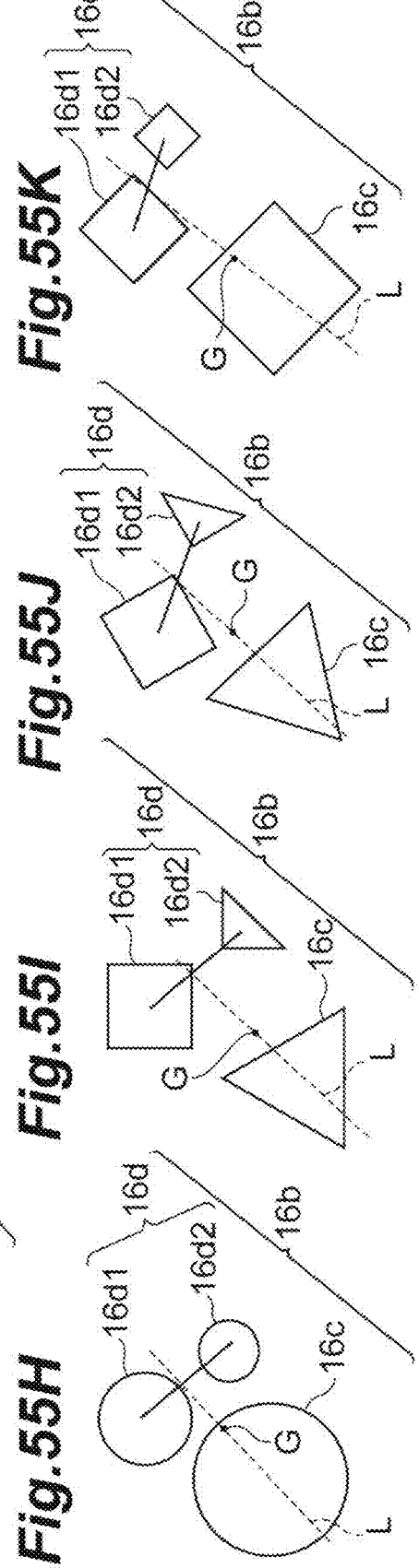

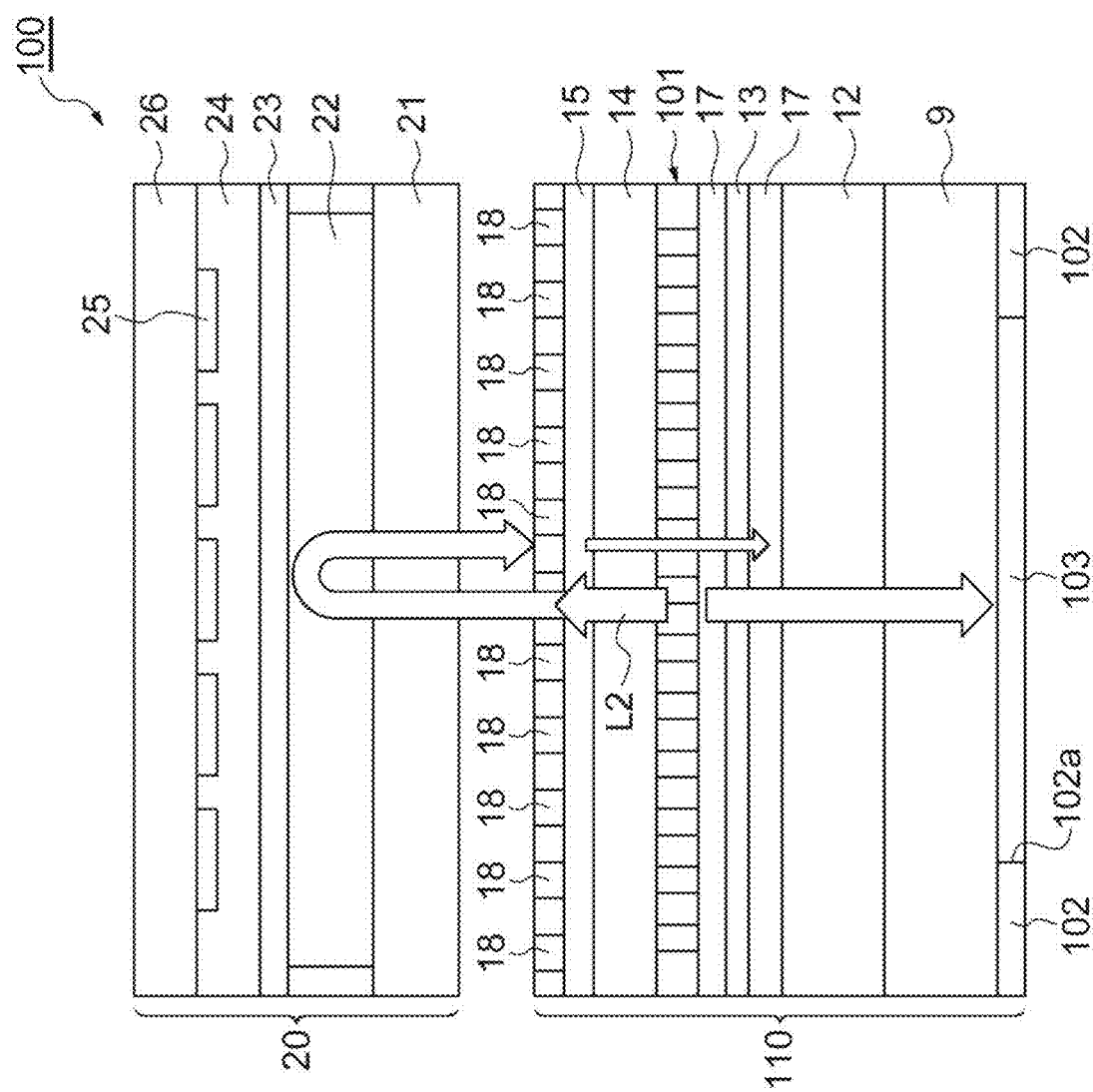

LIGHT-EMITTING DEVICE

TECHNICAL FIELD

The present invention relates to a light-emitting device.

BACKGROUND ART

Patent Document 1 describes a semiconductor laser device including a semiconductor laser chip and a spatial light modulator which is optically connected to the semiconductor laser chip. The semiconductor laser chip includes an active layer, a pair of cladding layers sandwiching the active layer, and a diffraction grating layer which is optically connected to the active layer. The spatial light modulator includes a common electrode, a plurality of pixel electrodes, and a liquid crystal layer arranged between the common electrode and the pixel electrodes. A laser beam output in a thickness direction of the diffraction grating layer is inputted to the spatial light modulator through a transparent electrode among the common electrode and the pixel electrodes. The spatial light modulator modulates at least one of a phase, an intensity, a polarization direction of the laser beam in each minute region with a driving voltage applied between the pixel electrode and the common electrode, reflects the laser beam that has been subjected to spatial light control to be outputted to the outside.

CITATION LIST

Patent Literature

Patent Document 1: PCT International Application Publication No. 2015/008627

Non Patent Literature

Non Patent Document 1: Y. Kurosaka et al., "Effects of non-lasing band in two-dimensional photonic-crystal lasers clarified using omnidirectional band structure," Opt. Express 20, 21773-21783 (2012).

SUMMARY OF INVENTION

Technical Problem

As a result of examining the conventional light-emitting devices such as the above-described semiconductor laser device, the inventors have found out the following problems. That is, in the conventional light-emitting devices having a configuration in which a semiconductor light-emitting device and a spatial light modulator are combined, light outputted from the semiconductor light-emitting device is inputted to the spatial light modulator, and light obtained by giving the light arbitrary phase distribution and intensity distribution by the spatial light modulator, is outputted to the outside. As a result, a desired optical image is obtained.

The spatial light modulator includes a reflection type and a transmission type. In the case of using a reflection type spatial light modulator, if the spatial light modulator and the semiconductor light-emitting device are arranged close to each other, position adjustment for optical coupling between the spatial light modulator and the semiconductor light-emitting device is facilitated, and the light-emitting device can be downsized. However, it is necessary for modulated light to pass through the semiconductor light-emitting device due to a device structure in order to output the modulated light outputted from such a reflection type spatial light modulator to the outside of the device. In this case, a light-shielding component (for example, an electrode) of the semiconductor light-emitting device causes attenuation, a diffraction effect, or the like so that the quality of the optical image is degraded. In addition, in a configuration in which the reflection type spatial light modulator and the semiconductor light-emitting device are arranged apart from each other in order to avoid such a problem, the position adjustment for optical coupling between the reflection type spatial light modulator and the semiconductor light-emitting device becomes complicated, and the device becomes large. Such a problem becomes more severe when the light-emitting device includes a large number of semiconductor light-emitting devices.

The present invention has been made to solve the above-described problems, and an object thereof is to provide a light-emitting device that has a structure to enable reduction in attenuation or a diffraction effect caused by a semiconductor light-emitting device with respect to modulated light outputted from a spatial light modulator even when the reflection type spatial light modulator and the semiconductor light-emitting device are arranged close to each other.

Solution to Problem

In order to solve the above-described problems, a light-emitting device according to the present embodiment includes a semiconductor light-emitting device and a spatial light modulator. The semiconductor light-emitting device has a light output surface and outputs light in a direction inclined with respect to a normal direction of the light output surface. The spatial light modulator is a reflection type spatial light modulator having a light input/output surface arranged such that at least a part thereof faces the light output surface of the semiconductor light-emitting device.

The reflection type spatial light modulator modulates at least one of a phase and an intensity of light from the semiconductor light-emitting device inputted through the light input/output surface, and the modulated light is outputted from the light input/output surface. Meanwhile, the semiconductor light-emitting device includes at least a semiconductor substrate, a semiconductor laminate portion including an active layer and a phase modulation layer, a first electrode, and a second electrode. The semiconductor substrate has a main surface and a back surface opposing the main surface. The semiconductor laminate portion including the active layer and the phase modulation layer has an upper surface and a lower surface arranged so as to sandwich the active layer and the phase modulation layer. In addition, the semiconductor laminate portion is arranged on the main surface of the semiconductor substrate such that the lower surface of the semiconductor laminate portion faces the main surface of the semiconductor substrate. The first electrode is provided on the upper surface of the semiconductor laminate portion. The second electrode is provided on the back surface of the semiconductor substrate.

In particular, the light output surface of the semiconductor light-emitting device is included in the upper surface of the semiconductor laminate portion or the back surface of the semiconductor substrate. The phase modulation layer includes a base layer having a predetermined refractive index and a plurality of modified refractive index regions each of which has a refractive index different from the refractive index of the base layer. In addition, in a state where a virtual square lattice is set on a design surface of the phase modulation layer perpendicular to a normal direction of the light output surface, each of the plurality of modified refractive index regions is arranged such that a gravity center is separated from a corresponding lattice point of the virtual square lattice by a predetermined distance and a vector from the corresponding lattice point toward the gravity center has a predetermined rotation angle around the corresponding lattice point. Alternatively, in a state where a virtual square lattice is set on a design surface of the phase modulation layer perpendicular to a normal direction of the light output surface, each of the plurality of modified refractive index regions is arranged such that a gravity center is arranged on a straight line passing through a lattice point of the virtual square lattice and inclined with respect to the square lattice and a vector from the corresponding lattice point toward the gravity center has a predetermined magnitude. In the light-emitting device having the above-described structure, the area of the light output surface of the semiconductor light-emitting device is smaller than the area of the light input/output surface of the spatial light modulator.

Advantageous Effects of Invention

According to the light-emitting device according to the present embodiment, it is possible to reduce the attenuation or diffraction effect caused by the semiconductor light-emitting device with respect to the modulated light outputted from the spatial light modulator even in the configuration in which the reflection type spatial light modulator and the semiconductor light-emitting device are arranged close to each other.

BRIEF DESCRIPTION OF DRAWINGS

FIG. 8 is a view for describing a relationship between an output beam pattern (optical image) of the semiconductor light-emitting device and a rotation angle distribution.

FIG. 29 is a schematic view illustrating a cross-sectional configuration of a light-emitting device according to a ninth modification.

FIGS. 44A to 44C are views illustrating an example of an arrangement of red, green, and blue conversion regions in each wavelength conversion medium.

FIGS. 49A to 49K are views illustrating examples of planar shapes of the modified refractive index regions and a relative relationship on the X-Y plane.

FIGS. 55A to 55K are views illustrating still other examples (on-axis shift scheme) of the planar shape of the modified refractive index region.

FIGS. 57A to 57E are views illustrating other examples of a planar shape of an electrode illustrated in FIG. 1 and the like.

FIGS. 58A to 58G are views illustrating still other examples of the planar shape of the electrode illustrated in FIG. 1 and the like.

FIG. 59 is a schematic view illustrating a cross-sectional configuration of a light-emitting device according to a comparative example.

DESCRIPTION OF EMBODIMENTS

Figure 1:
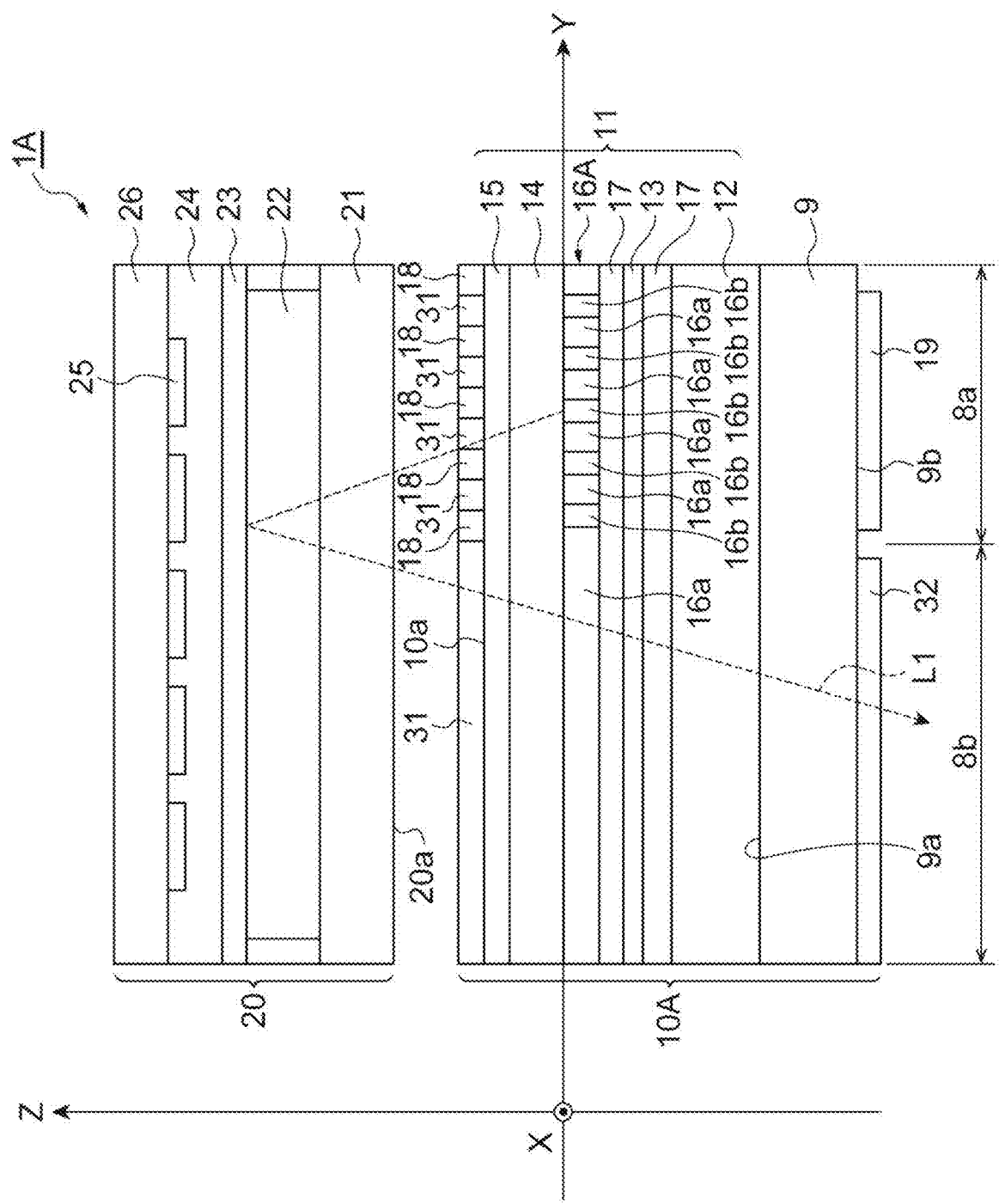
FIG. 1 is a schematic view illustrating a cross-sectional configuration of a light-emitting device according to a first embodiment.

Description of Embodiments of Invention of Present Application

First, contents of embodiments of the invention of the present application will be individually listed and described.

(1) A light-emitting device according to the present embodiment includes a semiconductor light-emitting device and a spatial light modulator. The semiconductor light-emitting device has a light output surface and outputs light in a direction inclined with respect to a normal direction of the light output surface. The spatial light modulator is a reflection type spatial light modulator having a light input/output surface arranged such that at least a part thereof faces the light output surface of the semiconductor light-emitting device. The reflection type spatial light modulator modulates at least one of a phase and an intensity of light from the semiconductor light-emitting device inputted through the light input/output surface, and the modulated light is outputted from the light input/output surface. Meanwhile, the semiconductor light-emitting device includes at least a semiconductor substrate, a semiconductor laminate portion including an active layer and a phase modulation layer, a first electrode, and a second electrode. The semiconductor substrate has a main surface and a back surface opposing the main surface. The semiconductor laminate portion including the active layer and the phase modulation layer has an upper surface and a lower surface arranged so as to sandwich the active layer and the phase modulation layer. In addition, the semiconductor laminate portion is arranged on the main surface of the semiconductor substrate such that the lower surface of the semiconductor laminate portion faces the main surface of the semiconductor substrate. The first electrode is provided on the upper surface of the semiconductor laminate portion. The second electrode is provided on the back surface of the semiconductor substrate.

In particular, the light output surface of the semiconductor light-emitting device is included in the upper surface of the semiconductor laminate portion or the back surface of the semiconductor substrate. The phase modulation layer includes a base layer having a predetermined refractive index and a plurality of modified refractive index regions each of which has a refractive index different from the refractive index of the base layer. In the light-emitting device having the above-described structure, the area of the light output surface of the semiconductor light-emitting device is smaller than the area of the light input/output surface of the spatial light modulator. Incidentally, as an arrangement method of the respective modified refractive index regions in the phase modulation layer, a rotation scheme or an on-axis shift scheme, as an example, can be applied. For example, as one aspect of the present embodiment, when the arrangement method using the rotation scheme is adopted, each of the plurality of modified refractive index regions is arranged such that a gravity center is separated from a corresponding lattice point of a virtual square lattice by a predetermined distance and a vector from the corresponding lattice point toward the gravity center has a predetermined rotation angle around the corresponding lattice point in a state where the virtual square lattice is set on a design surface of the phase modulation layer perpendicular to a normal direction of the light output surface. In addition, as one aspect of the present embodiment, when the arrangement method using the on-axis shift scheme is adopted, each of the plurality of modified refractive index regions is arranged such that a gravity center is linearly arranged corresponding to a predetermined phase angle on a straight line having a predetermined length with a corresponding lattice point of a virtual square lattice as a midpoint in a state where the virtual square lattice is set on a design surface of the phase modulation layer perpendicular to a normal direction.

Specifically, as a structure that realizes the above-described relationship between the area of the light output surface of the semiconductor light-emitting device and the area of the light input/output surface of the spatial light modulator, the light input/output surface includes a first region facing the semiconductor light-emitting device and a second region arranged at a position different from the first region in a first structure of the light-emitting device. In the light-emitting device having the first structure, relative positions of the spatial light modulator and the semiconductor light-emitting device are set such that light from the semiconductor light-emitting device is inputted into the spatial light modulator through the first region and modulated light is outputted from the second region to the outside of the semiconductor light-emitting device.

In addition, the semiconductor light-emitting device includes a first portion and a second portion in a second structure of the light-emitting device. The first portion extends from the upper surface of the semiconductor laminate portion to the back surface of the semiconductor substrate and has the light output surface. Further, the first electrode is provided on an upper surface of the first portion constituting a part of the upper surface of the semiconductor laminate portion, and the second electrode is provided on a back surface of the first portion constituting a part of the back surface of the semiconductor substrate. On the other hand, the second portion extends from the upper surface of the semiconductor laminate portion to the back surface of the semiconductor substrate, and is arranged at a position different from the first portion along the upper surface of the semiconductor laminate portion. Incidentally, ideally, it is preferable that the plurality of modified refractive index regions arranged in the phase modulation layer be not arranged in a part of the phase modulation layer included in the second portion and be arranged in a part of the phase modulation layer included in the first portion. In the light-emitting device having the second structure, the relative positions of the semiconductor light-emitting device and the spatial light modulator are set such that light modulated after being inputted from the light output surface of the first portion to the light input/output surface of the spatial light modulator passes through the second portion.

In the light-emitting devices having the first structure and the second structure described above, the gravity center of each of the plurality of modified refractive index regions included in the phase modulation layer has the rotation angle set around the corresponding lattice point of the vector from the corresponding lattice point of the virtual square lattice toward the gravity center. As such an arrangement pattern of the modified refractive index regions is compared with the case where the gravity center of each of the plurality of modified refractive index regions is positioned on the corresponding lattice point of the square lattice (so-called photonic crystal laser), a light intensity of 0th-order light that is output in a direction perpendicular to the light output surface decreases and a light intensity of high-order light (for example, 1st-order light and 1st-order light) output in a direction inclined with respect to the direction increases. Therefore, it is possible to suitably realize the semiconductor light-emitting device that outputs light in the direction inclined with respect to the direction perpendicular to the light output surface (normal direction).

Further, the light input/output surface of the spatial light modulator includes the first region facing the semiconductor light-emitting device and the second region arranged at the position different from the first region in the light-emitting device having the first structure. In addition, light from the semiconductor light-emitting device is inputted to the first region, and modulated light is outputted from the second region. With such a first structure, the modulated light can be outputted to the outside of the light-emitting device while avoiding the semiconductor light-emitting device, and thus, it is possible to reduce the attenuation and diffraction effect caused by the semiconductor light-emitting device with respect to the modulated light.

On the other hand, in the light-emitting device having the second structure, the semiconductor light-emitting device includes the first portion and the second portion. The first electrode and the second electrode are provided in the first portion. In addition, the light generated in the semiconductor light-emitting device is outputted from the light output surface of the first portion, and the modulated light is outputted from the spatial light modulator so as to pass through the second region. With such a second structure, the modulated light can be output outside the light-emitting device while avoiding the first electrode and the second electrode, and thus, it is possible to reduce the attenuation and diffraction effect caused by the semiconductor light-emitting device with respect to the modulated light.

As described above, it is possible to reduce the attenuation and diffraction effect caused by the semiconductor light-emitting device with respect to the modulated light even in the configuration in which the spatial light modulator and the semiconductor light-emitting device are arranged close to each other according to the light-emitting devices having the first structure and the second structure. Therefore, position adjustment for optical coupling between the spatial light modulator and the semiconductor light-emitting device is facilitated. In addition, the light-emitting device itself can be downsized. In addition, the light output surface of the semiconductor light-emitting device and the light input/output surface of the spatial light modulator face each other in parallel, and thus, the position adjustment for optical coupling is further facilitated. In addition, the semiconductor light-emitting device can be easily fixed to the spatial light modulator.

(2) As one aspect of the present embodiment, the light-emitting device having the second structure may further include an anti-reflection film provided on both of an upper surface of the second portion constituting a part of the upper surface of the semiconductor laminate portion and a back surface of the second portion constituting a part of the back surface of the semiconductor substrate. In this case, a loss is reduced when the modulated light passes through a front surface (a part of the upper surface of the semiconductor laminate portion) and the back surface (a part of the back surface of the semiconductor substrate) of the second portion, and the light output efficiency of the light-emitting device having the second structure can be enhanced.

(3) As one aspect of the present embodiment, in the light-emitting device having the second structure, it is preferable that a layer portion included in the second portion of the phase modulation layer be configured using only the base layer. That is, it is preferable that the plurality of modified refractive index regions included in the phase modulation layer be arranged in a part of the phase modulation layer included in the first portion. In this case, it is possible to further reduce the attenuation and diffraction effect caused by the semiconductor light-emitting device with respect to the modulated light.

(4) As one aspect of the present embodiment, the light-emitting devices having the first structure and the second structure may further include a light-transmissive support substrate provided between the semiconductor light-emitting device and the spatial light modulator and configured to fix the semiconductor light-emitting device to the spatial light modulator. In this case, the mechanical strength of the light-emitting device can be increased, and breakage of the device caused by a bending force can be reduced. Further, the distance between the light output surface of the semiconductor light-emitting device and the light input/output surface of the spatial light modulator can be easily adjusted by a thickness of the support substrate. In addition, as one aspect of the present embodiment, it is preferable that the support substrate includes a wiring configured to supply a current to an electrode closer to the spatial light modulator between the first electrode and the second electrode. In this case, the current can be suitably supplied to the electrode of the semiconductor light-emitting device covered with the spatial light modulator.

(5) As one aspect of the present embodiment, in the light-emitting devices having the first structure and the second structure, it is preferable that a planar shape (shape defined on a surface perpendicular to the normal direction of the light output surface) of an electrode closer to the spatial light modulator between the first electrode and the second electrode is any of a lattice shape, a stripe shape, a concentric shape, a radial shape, and a comb shape. When the electrode has any one of these planar shapes, a part of the electrode can be arranged even in the vicinity of a center of the light output surface. In this case, the current can be sufficiently supplied to the vicinity of a center of the active layer, and thus, the area of the light output surface can be further increased.

(6) As one aspect of the present embodiment, in the light-emitting devices having the first structure and the second structure, it is preferable that the light outputted from the semiconductor light-emitting device be at least one of 1st-order light and −1st-order light. As described above, such light is output in the direction inclined with respect to the direction (normal direction) perpendicular to the light output surface. Therefore, it is possible to suitably realize the light-emitting devices having the first structure and the second structure described above.

(7) Incidentally, the arrangement pattern of the plurality of modified refractive index regions in the phase modulation layer is determined as follows. That is, as a first precondition, a virtual square lattice constituted by M1 (an integer of one or more)×N1 (an integer of one or more) unit constituent regions R each having a square shape is set on an X-Y plane in an XYZ orthogonal coordinate system defined by a Z axis coinciding with the normal direction of the main surface of the semiconductor substrate and the X-Y plane including X and Y axes orthogonal to each other and coinciding with one surface of the phase modulation layer including the plurality of modified refractive index regions. At this time, the arrangement pattern of the plurality of modified refractive index regions is defined such that a gravity center G of the modified refractive index region positioned inside a unit constituent region R(x, y) is separated from a lattice point O(x, y), which is the center of the unit constituent region R(x, y), by a distance r and a vector is directed in a specific direction toward the gravity center G from the lattice point O(x, y) in the unit constituent region R(x, y) on the X-Y plane specified by a coordinate component x (an integer of from 0 to M1−1) in an X-axis direction and a coordinate component y (an integer of from 0 to N1−1) in a Y-axis direction.

Figure 60:
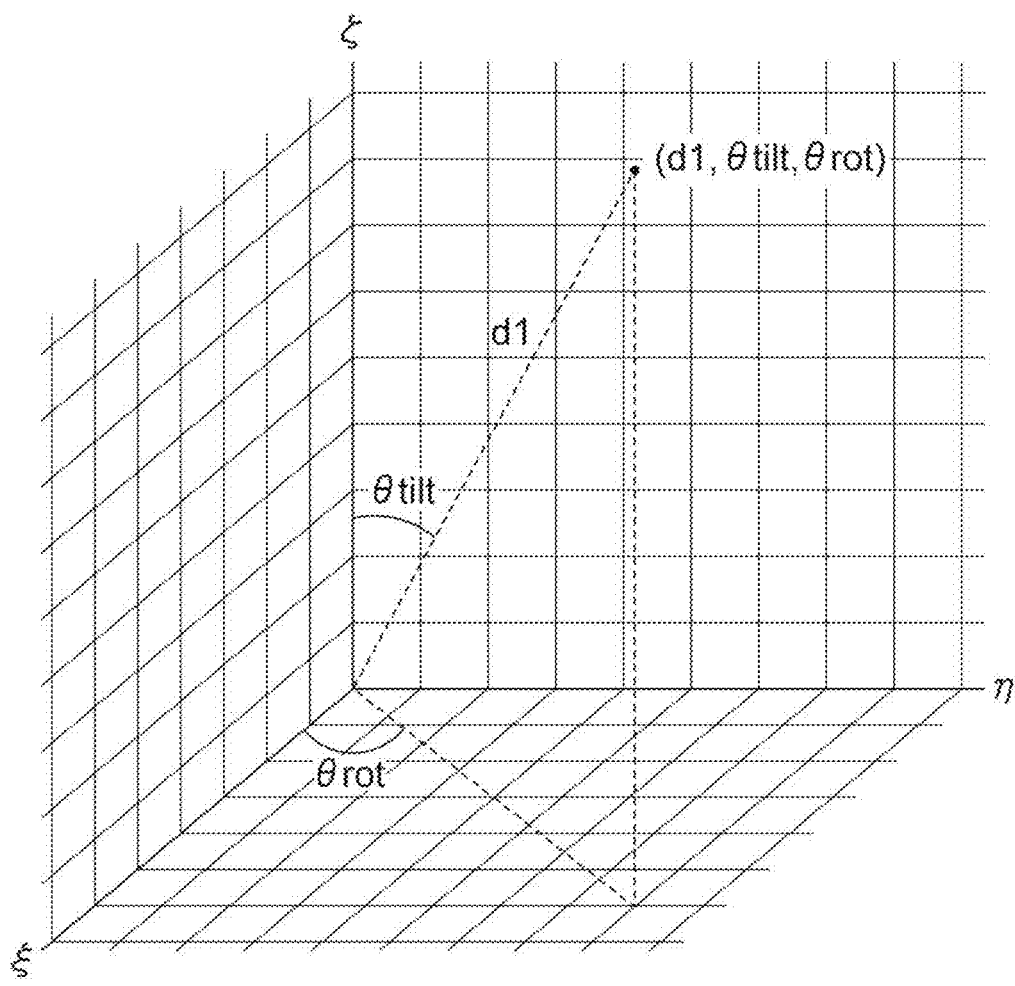
FIG. 60 is a graph for describing coordinate transformation from spherical coordinates (d1, $\theta_{tilt}$, $\theta_{rot}$) to coordinates ($\xi$, $\eta$, $\zeta$) in an XYZ orthogonal coordinate system.

Further, as a second precondition, coordinates (ξ, η, ζ) in the XYZ orthogonal coordinate system are assumed to satisfy a relationship expressed by the following Formulas (1) to (3) with respect to spherical coordinates (d1, $\theta_{tilt}$, $\theta_{rot}$) defined by a radius length d1, a tilt angle $\theta_{tilt}$ from the Z axis, and a rotation angle $\theta_{rot}$ from the X axis specified on the X-Y plane as illustrated in FIG. 60. Incidentally, FIG. 60 is a view for describing coordinate transformation from spherical coordinates (d1, $\theta_{tilt}$, $\theta_{rot}$) to coordinates (ξ, η, ζ) in the XYZ orthogonal coordinate system, and a designed optical image on a predetermined plane (target beam projection region) set in the XYZ orthogonal coordinate system, which is the real space, is expressed by the coordinates (ξ, η, ζ). When the output beam pattern corresponding to the optical image outputted from the semiconductor light-emitting device is a set of bright spots directed in directions defined by the angles $\theta_{tilt}$ and $\theta_{rot}$, the angles $\theta_{tilt}$ and $\theta_{rot}$ are converted to a coordinate value $k_x$, which is a normalized wave number defined by the following Formula (4), on a Kx axis corresponding to the X axis and a coordinate value $k_y$ which is a normalized wave number defined by the following Formula (5), on a Ky axis which corresponds to the Y axis and is orthogonal to the Kx axis. The normalized wave number means a wave number normalized assuming that a wave number corresponding to the lattice interval of the virtual square lattice is 1.0. At this time, in the wave number space defined by the Kx axis and the Ky axis, a specific wave number range including the output beam pattern corresponding to the optical image is constituted by M2 (an integer of one or more)×N2 (an integer of one or more) image regions FR each having a square shape. Incidentally, the integer M2 does not need to coincide with the integer M1. Likewise, the integer N2 does not need to coincide with the integer N1. In addition, Formula (4) and Formula (5) are disclosed in Non-Patent Document 1, for example.

$$\xi = d1\sin\theta_{tilt}\cos\theta_{rot} \quad (1)$$

$$\eta = d1\sin\theta_{tilt}\sin\theta_{rot} \quad (2)$$

$$\zeta = d1\cos\theta_{tilt} \quad (3)$$

$$k_x = \frac{a}{\lambda}\sin\theta_{tilt}\cos\theta_{rot} \quad (4)$$

$$k_y = \frac{a}{\lambda}\sin\theta_{tilt}\sin\theta_{rot} \quad (5)$$

a: lattice constant of virtual square lattice
λ: oscillation wavelength of semiconductor light-emitting device As a third precondition, in the wave number space, a complex amplitude F(x, y), which is obtained by two-dimensional inverse discrete Fourier transform of each image region $FR(k_x, k_y)$, specified by the coordinate component $k_x$ (an integer of from 0 to M2−1) in the Kx-axis direction and the coordinate component $k_y$ (an integer of from 0 to N2−1) in the Ky-axis direction to the unit c constituent region R(x, y) on the X-Y plane specified by the coordinate component x (an integer of from 0 to M1−1) in the X-axis direction and the coordinate component y (an integer of from 0 to N1−1) in the Y-axis direction, is given by the following Formula (6) with j as an imaginary unit. In addition, this complex amplitude F(x, y) is defined by the following Formula (7) when an amplitude term is A(x, y) and a phase term is P(x, y). Further, as a fourth precondition, the unit constituent region R(x, y) is defined by an s axis and a t axis which are parallel to the X axis and the Y axis, respectively, and orthogonal to each other in the lattice point O(x, y) that is the center of the unit constituent region R(x, y).

$$F(x,y) = \sum_{k_x=0}^{M2-1}\sum_{k_y=0}^{N2-1} FR(k_x, k_y)\exp\left[j2\pi\left(\frac{k_x x}{M2} + \frac{k_y y}{N2}\right)\right] \quad (6)$$

$$F(x,y) = A(x,y) \times \exp[jP(x,y)] \quad (7)$$

Under the above-described first to fourth preconditions, the arrangement pattern of the modified refractive index regions in the phase modulation layer is determined by the rotation scheme or the on-axis shift scheme. Specifically, in the determination of the arrangement pattern using the rotation scheme, a corresponding modified refractive index region is arranged in the unit constituent region R(x, y) such that an angle φ(x, y) formed by a line segment connecting the lattice point O(x, y) and the gravity center G of the corresponding modified refractive index region and the s axis satisfies a relationship of φ(x,y)=C×P(x,y)+B C: a proportional constant, for example, 180°/π
B: an arbitrary constant, for example, 0.

In the semiconductor light-emitting device having the above-described structure, the distance r between the center (lattice point) of each unit constituent region constituting the virtual square lattice and the gravity center G of the corresponding modified refractive index region is preferably a constant value over the entire phase modulation layer in the phase modulation layer (which does not exclude that the distance r is partially different). As a result, when phase distribution (distribution of the phase term P(x, y) in the complex amplitude F(x, y) allocated to the unit constituent region R(x, y)) in the entire phase modulation layer is evenly distributed from zero to 2π (rad), the gravity center of the modified refractive index region coincides with the lattice point of the unit constituent region R in the square lattice on average. Therefore, a two-dimensional distributed Bragg diffraction effect in the above phase modulation layer approximates to a two-dimensional distributed Bragg diffraction effect in the case of arranging the modified refractive index region on each lattice point of the square lattice, and thus, it is easy to form a standing wave and it is possible to expect reduction in threshold current for oscillation.

(8) On the other hand, in the determination of the arrangement pattern using the on-axis shift scheme, the gravity center G of the corresponding modified refractive index region is arranged on a straight line passing through the lattice point O(x, y) and inclined from the s-axis in the unit constituent region R(x, y) under the above-described first to fourth preconditions. At that time, the corresponding modified refractive index region is arranged in the unit constituent region R(x, y) such that a line segment length r(x, y) between the lattice point O(x, y) and the gravity center G of the corresponding modified refractive index region satisfies a relationship of r(x,y)=C×(P(x,y)−P₀)

C: a proportional constant
P₀: an arbitrary constant, for example, 0.

Incidentally, the same effects as those of the above-described rotation scheme is obtained even when the arrangement pattern of the modified refractive index regions in the phase modulation layer is determined using the on-axis shift scheme.

As described above, each aspect listed in [Description of Embodiment of Invention of Present Application] can be applied to each of all the remaining aspects or to all the combinations of these remaining aspects.

Details of Embodiments of Invention of Present Application

Hereinafter, a specific structure of a light-emitting device according to the present embodiments will be described in detail with reference to the attached drawings. Incidentally, the invention is not limited to these examples, but is illustrated by the claims, and equivalence of and any modification within the scope of the claims are intended to be included therein. In addition, the same elements in the description of the drawings will be denoted by the same reference signs, and redundant descriptions will be omitted.

First Embodiment

FIG. 1 is a schematic view illustrating a cross-sectional configuration of a light-emitting device 1A according to a first embodiment. The light-emitting device 1A includes a semiconductor light-emitting device 10A and a spatial light modulator 20. Incidentally, an XYZ orthogonal coordinate system having a thickness direction of the semiconductor light-emitting device 10A as a Z axis is defined in FIG. 1. The semiconductor light-emitting device 10A is a laser light source that forms a standing wave along an X-Y plane and outputs a phase-controlled plane wave in a Z-axis direction. The semiconductor light-emitting device 10A has a light output surface 10a along the X-Y plane, and outputs light L1 in a direction inclined with respect to the Z-axis direction perpendicular to the light output surface 10a.

The semiconductor light-emitting device 10A includes a semiconductor substrate 9 and a semiconductor laminate portion 11 provided on a main surface 9a of the semiconductor substrate 9. In the present embodiment, the light output surface 10a is included in a front surface of the semiconductor laminate portion 11 positioned on the opposite side to the semiconductor substrate 9. A total thickness of the semiconductor substrate 9 and the semiconductor laminate portion 11 is, for example, 0.1 mm to 0.5 mm, typically 0.2 mm. In addition, the semiconductor light-emitting device 10A includes a first portion 8a and a second portion 8b arranged in a direction along the main surface 9a with respect to the first portion 8a. As an example, the second portion 8b is arranged with respect to the first portion 8a in a Y-axis direction in the present embodiment.

The semiconductor laminate portion 11 includes a lower cladding layer 12 provided on the main surface 9a of the semiconductor substrate 9, an active layer 13 provided on the lower cladding layer 12, an upper cladding layer 14 provided on the active layer 13, and a contact layer 15 provided on the upper cladding layer 14. The semiconductor substrate 9 and the respective layers 12 to 15 are configured using a compound semiconductor, for example, a GaAs-based semiconductor, an InP-based semiconductor, or a nitride-based semiconductor. Both of an energy band gap of the lower cladding layer 12 and an energy band gap of the upper cladding layer 14 are larger than an energy band gap of the active layer 13.

The semiconductor laminate portion 11 further includes a phase modulation layer 16A provided between the active layer 13 and the upper cladding layer 14. Incidentally, a light guide layer 17 may be provided at least one of between the active layer 13 and the upper cladding layer 14 or between the active layer 13 and the lower cladding layer 12 if necessary. For example, in the configuration in which the light guide layer 17 is provided between the active layer 13 and the upper cladding layer 14, the phase modulation layer 16A is provided between the upper cladding layer 14 and the light guide layer 17.

Incidentally, the phase modulation layer 16A may be provided between the lower cladding layer 12 and the active layer 13, instead of between the upper cladding layer 14 and the light guide layer 17. In this manner, in the configuration in which the light guide layer 17 is provided between the active layer 13 and the lower cladding layer 12, the phase modulation layer 16A may be provided between the lower cladding layer 12 and the light guide layer 17.

A refractive index relationship between the semiconductor substrate 9 and each semiconductor layer provided on the semiconductor substrate 9 is given as follows. That is, each respective refractive index of the lower cladding layer 12 and the upper cladding layer 14 are lower than each refractive index of the semiconductor substrate 9, the active layer 13, and the contact layer 15. Further, the refractive index of the upper cladding layer 14 is equal to or lower than the refractive index of the lower cladding layer 12 in the present embodiment. A refractive index of the phase modulation layer 16A may be higher or lower than the refractive index of the lower cladding layer 12 (or the upper cladding layer 14).

The phase modulation layer 16A includes a base layer 16a made of a first refractive index medium and a plurality of modified refractive index regions 16b existing in the base layer 16a. Each of the modified refractive index regions 16b is made of a second refractive index medium having a refractive index different from a refractive index of the first refractive index medium. The plurality of modified refractive index regions 16b include a substantially periodic structure. When an effective refractive index of the phase modulation layer 16A is n, a wavelength $\lambda_0$ (=a×n, a is a lattice interval) selected by the phase modulation layer 16A is included within an emission wavelength range of the active layer 13. The phase modulation layer (diffraction grating layer) 16A can select the wavelength $\lambda_0$ out of the emission wavelength of the active layer 13 and output light of the selected wavelength to the outside. In the present embodiment, the plurality of modified refractive index regions 16b are formed only in the phase modulation layer 16A of the first portion 8a, and are not formed in the phase modulation layer 16A of the second portion 8b.

Figure 2:
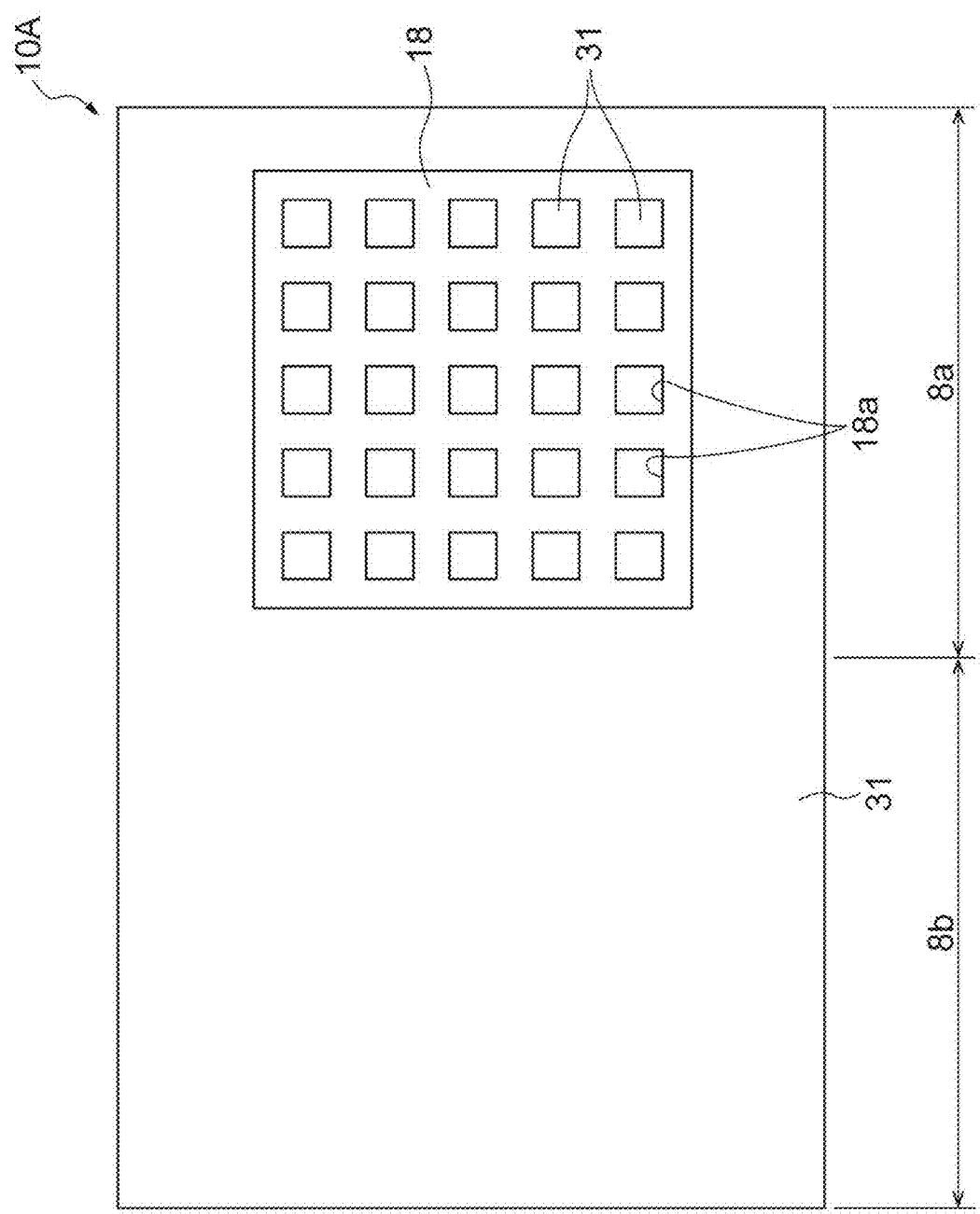
FIG. 2 is a top view of a semiconductor light-emitting device as viewed from a light output surface side.
Figure 3:
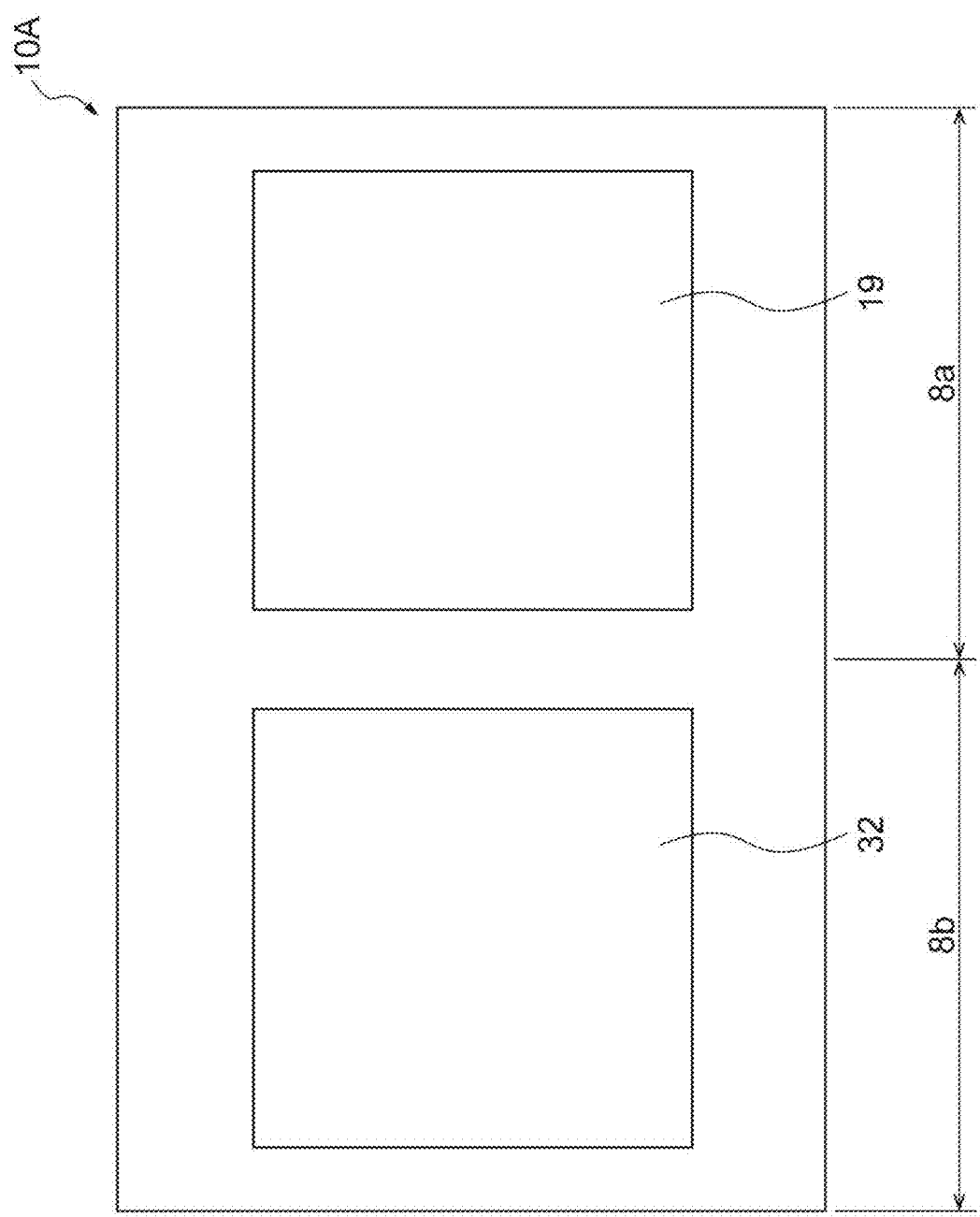
FIG. 3 is a bottom view of the semiconductor light-emitting device as viewed from a back surface side of a semiconductor substrate.

The semiconductor light-emitting device 10A further includes an electrode 18 (first electrode) provided on the front surface of the semiconductor laminate portion 11 (on the contact layer 15 in the present embodiment) and an electrode 19 (second electrode) provided on a back surface 9b of the semiconductor substrate 9. The electrode 18 makes ohmic contact with the contact layer 15, and the electrode 19 makes ohmic contact with the semiconductor substrate 9. FIG. 2 is a top view of the semiconductor light-emitting device 10A as viewed from the light output surface 10a side. FIG. 3 is a bottom view of the semiconductor light-emitting device 10A as viewed from the back surface 9b side. As illustrated in FIGS. 1 to 3, the electrodes 18 and 19 are provided only in the first portion 8a of the semiconductor light-emitting device 10A and are not provided in the second portion 8b.

Further, the electrode 18 has a lattice-like (for example, a square lattice-like) planar shape and has a plurality of openings 18a arrayed two-dimensionally in parallel to the X-Y plane as illustrated in FIG. 2.

Incidentally, FIG. 2 illustrates a total of 25 openings 18a arranged in five rows and five columns, but the number and array of the openings 18a are arbitrary. A planar shape of each of the openings 18a is a quadrangle, for example, a square or the like. A part of the electrode 18 is provided in the vicinity of the center of the first portion 8a as viewed from the Z-axis direction. In addition, the electrode 19 has, for example, a quadrangular planar shape, and covers a portion including the vicinity of the center of the first portion 8a as viewed from the Z-axis direction as illustrated in FIG. 3.

The light outputted from the semiconductor light-emitting device 10A passes through the opening 18a of the electrode 18. As the light passes through the opening 18a of the electrode 18, the light L1 can be suitably outputted from the front surface side of the semiconductor laminate portion 11 without being blocked by the electrode 18. Incidentally, the contact layer 15 may be etched so as to have the same planar shape as the electrode 18. That is, the planar shape of the contact layer 15 as viewed from a light output direction (Z-axis direction) may be the same lattice shape as the electrode 18. As the light passes through an opening of the contact layer 15, light absorption in the contact layer 15 is avoided, and the light output efficiency of the semiconductor light-emitting device 10A can be increased.

As illustrated in FIGS. 1 and 2, the front surface of the semiconductor laminate portion 11 exposed from the opening 18a of the electrode 18 is covered with an anti-reflection film 31. Further, the anti-reflection film 31 is provided from the outside of the electrode 18 over a front surface of the semiconductor laminate portion 11 of the second portion 8b. In other words, the anti-reflection film 31 is provided in the entire region except for the electrode 18 on the light output surface 10a. In addition, an anti-reflection film 32 is also provided on the back surface 9b of the semiconductor substrate 9 of the second portion 8b as illustrated in FIGS. 1 and 3. Incidentally, the front surface of the semiconductor laminate portion 11 exposed from the opening 18a of the electrode 18 is covered with the anti-reflection film 31 in this example, but the entire surface is not necessarily covered as long as an optical path of the light L1 is covered.

When a drive current is supplied between the electrode 18 and the electrode 19, recoupling between electrons and holes occurs in the active layer 13 (light emission). The electrons and holes contributing to the light emission and the generated light in the active layer 13 in this manner are efficiently confined between the lower cladding layer 12 and the upper cladding layer 14. The light outputted from the active layer 13 is inputted to the inside of the phase modulation layer 16A, and forms a predetermined mode corresponding to a lattice structure inside the phase modulation layer 16A. The light L1 outputted from the inside of the phase modulation layer 16A is outputted to the outside of the semiconductor light-emitting device 10A through the opening 18a of the electrode 18. At this time, 0th-order light is output in a direction perpendicular to the light output surface 10a (a normal direction of the light output surface 10a). On the other hand, the light L1 that is higher-order light (for example, 1st-order light or −1st-order light) is output in an arbitrary direction inclined with respect to the normal direction of the light output surface 10a.

In one example, the semiconductor substrate 9 is a GaAs substrate and the lower cladding layer 12 is an AlGaAs layer. The active layer 13 has a multiple quantum well structure (barrier layer: AlGaAs/well layer: InGaAs). In the phase modulation layer 16A, the base layer 16a is a layer made of GaAs, and each of the modified refractive index regions 16b is a hole. The upper cladding layer 14 is an AlGaAs layer. The contact layer 15 is a GaAs layer. In addition, in another example, the semiconductor substrate 9 is an InP substrate. The lower cladding layer 12 is an InP layer. The active layer 13 has a multiple quantum well structure (barrier layer: GaInAsP/well layer: GaInAsP). In the phase modulation layer 16A, the base layer 16a is a layer made of GaInAsP, and each of the modified refractive index regions 16b is a hole. The upper cladding layer 14 is an InP layer. The contact layer 15 is a GaInAsP layer. In addition, in still another example, the semiconductor substrate 9 is a GaN substrate. The lower cladding layer 12 is an AlGaN layer. The active layer 13 has a multiple quantum well structure (barrier layer: InGaN/well layer: InGaN). In the phase modulation layer 16A, the base layer 16a is a layer made of GaN, and each of the modified refractive index regions 16b is a hole. The upper cladding layer 14 is an AlGaN layer. The contact layer 15 is a GaN layer.

Incidentally, the same conductivity type as the semiconductor substrate 9 is imparted to the lower cladding layer 12. A conductivity type opposite to that of the semiconductor substrate 9 is imparted to the upper cladding layer 14 and the contact layer 15. In one example, the semiconductor substrate 9 and the lower cladding layer 12 are an n-type and the upper cladding layer 14 and the contact layer 15 are a p-type. When the phase modulation layer 16A is provided between the active layer 13 and the lower cladding layer 12, the phase modulation layer 16A has the same conductivity type as the semiconductor substrate 9. On the other hand, when the phase modulation layer 16A is provided between the active layer 13 and the upper cladding layer 14, the phase modulation layer 16A has a conductivity type opposite to that of the semiconductor substrate 9. Incidentally, an impurity concentration is, for example, $1\times10^{17}$ to $1\times10^{21}/cm^3$.

In addition, the modified refractive index region 16b is the hole in the above structure, but the modified refractive index region 16b may be a region formed by embedding a semiconductor having a refractive index different from the base layer 16a in the hole. In this case, for example, a hole of the base layer 16a may be formed by etching, and then, a semiconductor may be embedded in the hole using a metal organic chemical vapor deposition method, a sputtering method, or an epitaxial method. The modified refractive index region 16b may be formed by embedding the semiconductor in the hole of the base layer 16a, and then, the same semiconductor as the modified refractive index region 16b may be further deposited thereon. Incidentally, when each of the modified refractive index regions 16b is the hole, the hole may be filled with an inert gas such as argon, nitrogen, and hydrogen or air.

The anti-reflection films 31 and 32 are made of a dielectric single layer film such as silicon nitride (for example, SiN) and silicon oxide (for example, $SiO_2$), or a dielectric multilayer film. For example, it is possible to use a film, obtained by stacking two or more types of dielectric layers selected from a dielectric layer group consisting of titanium oxide ($TiO_2$), silicon dioxide ($SiO_2$), silicon monoxide (SiO), niobium oxide ($Nb_2O_5$), tantalum pentoxide ($Ta_2O_5$), magnesium fluoride ($MgF_2$), titanium oxide ($TiO_2$), aluminum oxide ($Al_2O_3$), cerium oxide ($CeO_2$), indium oxide ($In_2O_3$), zirconium oxide ($ZrO_2$), and the like, as the dielectric multilayer film. For example, a film having a thickness of $\lambda/4$ as an optical film thickness for light of a wavelength $\lambda$ is stacked.

Figure 4:
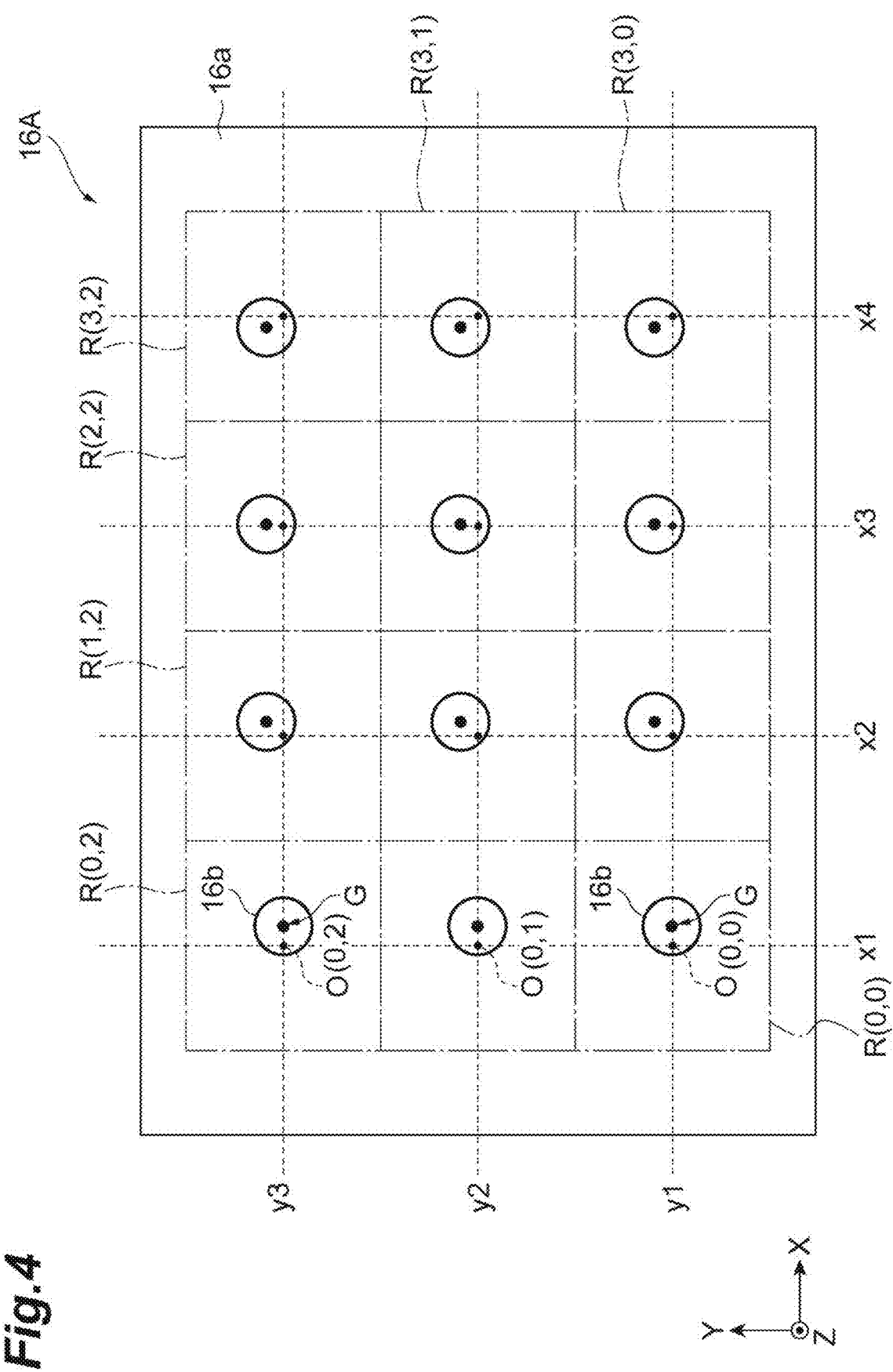
FIG. 4 is a view for describing an example of an arrangement pattern (rotation scheme) of modified refractive index regions in a phase modulation layer corresponding to a first portion.

FIG. 4 is a plan view illustrating a configuration of the first portion 8a of the phase modulation layer 16A and is a view for describing an example of an arrangement pattern (rotation scheme) of the modified refractive index regions. The phase modulation layer 16A corresponding to the first portion 8a includes the base layer 16a made of a first refractive index medium, and the modified refractive index region 16b made of a second refractive index medium having a refractive index different from that of the first refractive index medium. Here, a virtual square lattice is set on a design surface of the phase modulation layer 16A that coincides with the X-Y plane. One side of the square lattice is parallel to an X axis and the other side is parallel to a Y axis. At this time, unit constituent regions R each of which has a square shape with a lattice point O of the square lattice as the center thereof can be set two-dimensionally over a plurality of columns along the X axis and a plurality of rows along the Y axis. A plurality of modified refractive index regions 16b is provided one by one in each of the unit constituent regions R. A planar shape of the modified refractive index region 16b is, for example, a circular shape. In each of the unit constituent regions R, a gravity center G of the modified refractive index region 16b is arranged to be separated from a lattice point (center of the unit constituent regions R) O closest to the gravity center G.

Specifically, in FIG. 4, broken lines denoted by x1 to x4 indicate center positions in an X-axis direction in the unit constituent region R, and broken lines denoted by y1 to y3 indicate center positions in the Y-axis direction in the unit constituent region R. Therefore, intersection points of the broken lines x1 to x4 and the broken lines y1 to y3 indicate centers O(0,0) to O(3,2) of the unit constituent regions R(0,0) to R(3,2), that is, lattice points. A lattice constant of this virtual square lattice is a. Incidentally, the lattice constant a is adjusted according to the emission wavelength.

Figure 5:
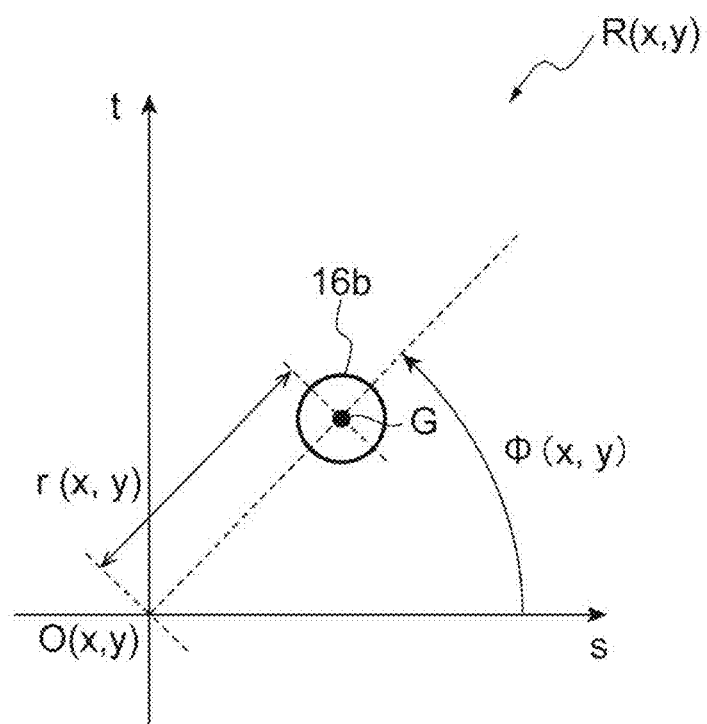
FIG. 5 is a graph for describing a positional relationship of a gravity center of the modified refractive index region and a lattice point in a virtual square lattice as an example of the arrangement pattern determined by the rotation scheme.

The arrangement pattern of the above-described modified refractive index regions 16b is determined by a method described in Patent Document 1 according to a target beam projection region and a target output beam pattern. That is, the arrangement pattern is determined in the design surface of the phase modulation layer 16A defined on the X-Y plane by determining a direction in which the gravity center G of each of the modified refractive index regions 16b is shifted from each lattice point (intersection point of each of the broken lines x1 to x4 and each of the broken lines y1 to y3) in the virtual square lattice in the base layer 16a according to a phase obtained by performing inverse Fourier transform of an original pattern corresponding to the target beam projection region and the target output beam pattern As described in Patent Document 1, a distance r shifted from each lattice point (see FIG. 5) is desirably in the range of 0<r≤0.3a when the lattice constant of the square lattice is a. Although the distance r shifted from each lattice point is usually the same over all phase modulation regions and all modified refractive index regions, the distance r in some phase modulation regions may have a value different from the distance r in the other phase modulation regions, and the distance r in some modified refractive index regions may have a value different from the distance r in the other modified refractive index regions. Incidentally, FIG. 5 is a graph for describing an example of the arrangement pattern (rotation scheme) determined by the rotation scheme. FIG. 5 illustrates a configuration of the unit constituent region R(x, y), and the distance r from the lattice point to the modified refractive index region 16b is denoted by r(x, y).

As illustrated in FIG. 5, the unit constituent region R(x, y) constituting the square lattice is defined by an s axis and a t axis orthogonal to each other at the lattice point O(x, y). Incidentally, the s axis is an axis parallel to the X axis and corresponds to the broken lines x1 to x4 illustrated in FIG. 4. The t-axis is an axis parallel to the Y axis and corresponds to the broken lines y1 to y3 illustrated in FIG. 4. In this manner, an angle formed between a direction from the lattice point O(x, y) to the gravity center G and the s axis is given as φ(x, y) in the s-t plane defining the unit constituent region R(x, y). When the rotation angle φ(x, y) is 0°, a direction of a vector from the lattice point O(x, y) to the gravity center G coincides with a positive direction of the s axis. In addition, a length of a vector (corresponding to the distance r) from the lattice point O(x, y) to the gravity center G is given as r(x, y).

As illustrated in FIG. 4, in the phase modulation layer 16A, the rotation angle φ(x, y) around the lattice point O(x, y) of the gravity center G of the modified refractive index region 16b is independently set for each of the unit constituent regions R according to the target output beam pattern (optical image). The rotation angle φ(x, y) has a specific value in the unit constituent region R(x, y), but is not necessarily expressed by a specific function. That is, the rotation angle φ(x, y) is determined based on a phase term of a complex amplitude obtained by converting the output beam pattern into a wave number space and performing two-dimensional inverse discrete Fourier transform of a constant wave number range of the wave number space. Incidentally, reproducibility of the target output beam pattern is improved by applying an iterative algorithm such as the Gerchberg-Saxton (GS) method which is generally used in hologram generation calculation at the time of obtaining complex amplitude distribution (complex amplitude of each of the unit constituent regions R) from the target output beam pattern.

Figure 6B:
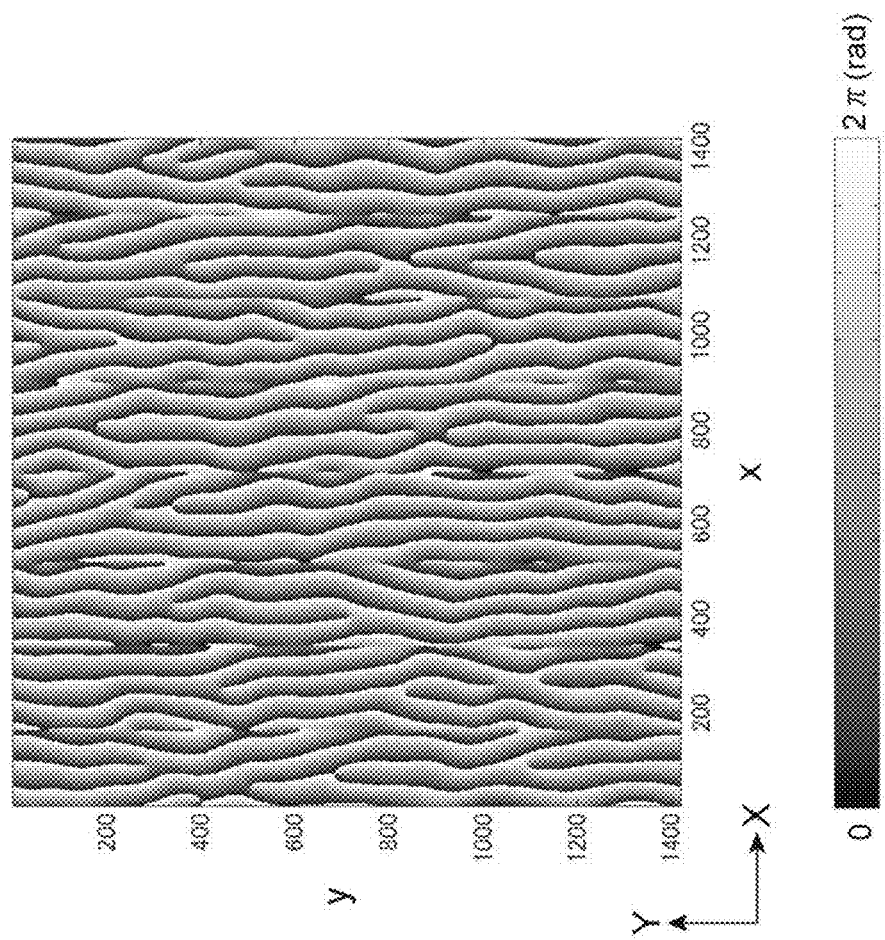
FIGS. 6A and 6B are views illustrating an example of an amplitude distribution of the phase modulation layer and an example of a phase distribution of the phase modulation layer.
Figure 6A:
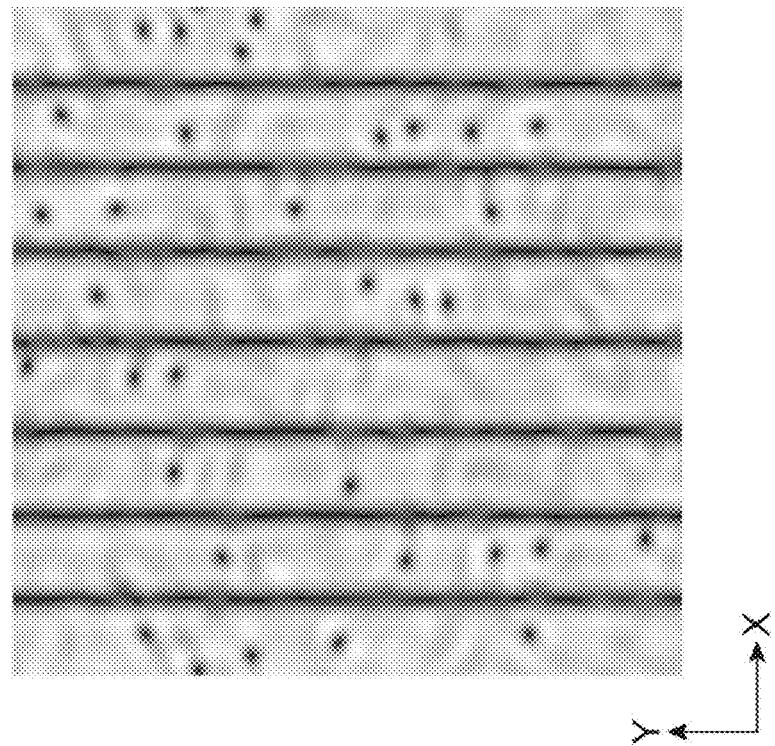
Figure 7:
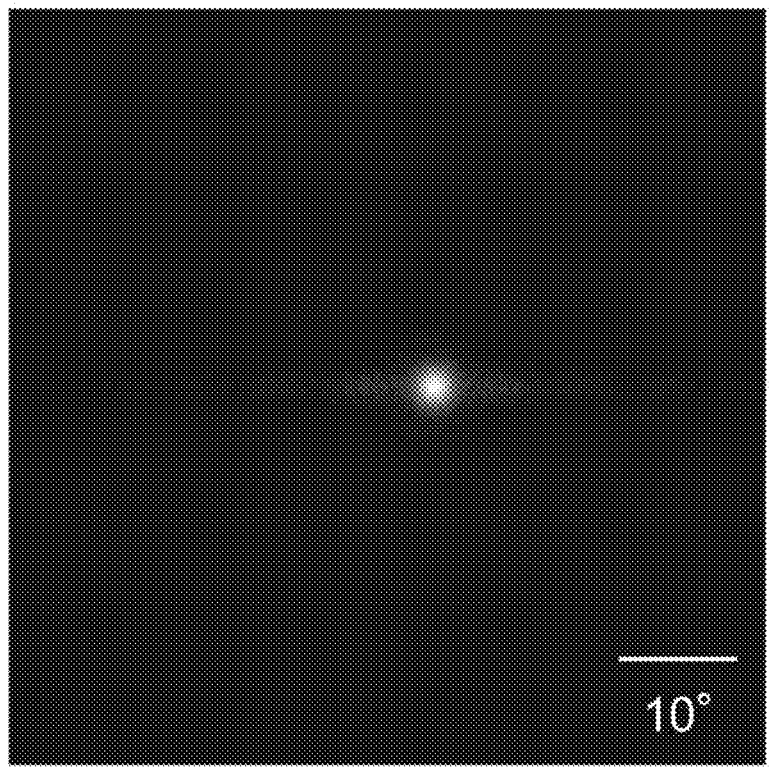
FIG. 7 is a view illustrating a far-field image realized by the phase modulation layer having the amplitude distribution of FIG. 6A and the phase distribution of FIG. 6B.

FIG. 6A is a view illustrating an example of the amplitude distribution of the phase modulation layer 16A. In FIG. 6A, the amplitude is indicated by brightness and darkness, and a larger value is illustrated to be brighter. In addition, FIG. 6B is a view illustrating an example of the phase distribution of the phase modulation layer 16A, that is, the distribution of the rotation angle φ(x, y). In FIG. 6B, the angle φ(x, y) is illustrated by brightness and darkness, and a larger value is illustrated to be brighter. FIG. 7 is a view illustrating a far-field image realized by the phase modulation layer 16A having the amplitude distribution of FIG. 6A and the phase distribution of FIG. 6B. In FIG. 7, an image center represents the direction perpendicular to the light output surface 10a (the normal direction of the light output surface 10a). As illustrated in FIG. 7, the far-field image corresponding to the light L1 including one spot is obtained by diffracting the complex amplitude illustrated in FIGS. 6A and 6B in this example. However, 1st-order light and −1st-order light including spots at a center Q and, for example, in the third quadrant facing the first quadrant in the case of the first quadrant simultaneously with this spot, are outputted from the semiconductor light-emitting device 10A as will be described later (FIG. 8).

Incidentally, the rotation angle distribution φ(x, y) is designed such that all phases of 0 to 2π (rad) are included to the same extent in the entire phase modulation layer 16A. In other words, a vector OG from the lattice point O of the square lattice toward the gravity center G of the modified refractive index region 16b is obtained for each of the modified refractive index regions 16b. When the vectors OG are added for all the phase modulation layer 16A, the value approaches zero. That is, the modified refractive index region 16b can be considered to be on the lattice point O of the square lattice on average, and the same two-dimensional distributed Bragg diffraction effect as the case where the modified refractive index region 16b is arranged on the lattice point O can be obtained as a whole. Thus, it is easy to form a standing wave on the X-Y plane, and it is possible to expect reduction in threshold current for oscillation.

FIG. 8 is a view for describing a relationship between the target output beam pattern (optical image) outputted from the light-emitting device 1A and distribution of the rotation angle φ(x, y) in the phase modulation layer 16A. Specifically, a Kx-Ky plane, obtained by converting a beam projection region (a designed optical image installation surface expressed by coordinates (x, y, z) in the XYZ orthogonal coordinate system) that is a projection range of the target output beam pattern onto the wave number space, is considered. A Kx axis and a Ky axis defining the Kx-Ky plane are orthogonal to each other, each of which is associated with an angle with respect to a normal direction when an output direction of the target output beam pattern is swung from the normal direction of the light output surface (Z-axis direction) to the light output surface by the above Formulas (1) to (5). It is assumed that a specific region including the target output beam pattern is constituted by M2 (an integer of one or more)×N2 (an integer of one or more) image regions FR each having a square shape on the Kx-Ky plane. In addition, it is assumed that the virtual square lattice set on the X-Y plane coinciding with the design surface of the phase modulation layer 16A is constituted by M1 (an integer of one or more)×N1 (an integer of one or more) unit constituent regions R. Incidentally, the integer M2 does not need to coincide with the integer M1. Likewise, the integer N2 does not need to coincide with the integer N1. At this time, a complex amplitude F(x, y) in the unit constituent region R(x, y), which is obtained by two-dimensional inverse discrete Fourier transform of each image region FR($k_x$, $k_y$) on the Kx-Ky plane, specified by the coordinate component $k_x$ (an integer of from 0 to M2−1) in the Kx-axis direction and the coordinate component $k_y$ (an integer of from 0 to N2−1) in the Ky-axis direction, to the unit constituent region R(x, y) specified by the coordinate component x (an integer of from 0 to M1−1) in the X-axis direction and the coordinate component y (an integer of from 0 to N1−1) in the Y-axis direction, is given by the following Formula (8) with j as an imaginary unit.

$$F(x, y) = \sum_{k_x=0}^{M2-1} \sum_{k_y=0}^{N2-1} FR(k_x, k_y) \exp\left[j2\pi\left(\frac{k_x x}{M2} + \frac{k_y y}{N2}\right)\right] \quad (8)$$

In addition, when an amplitude term is A(x, y) and a phase term is P(x, y) in the unit constituent region R(x, y), the complex amplitude F(x, y) is defined by the following Formula (9).

$$F(x,y)=A(x,y)\times\exp[jP(x,y)] \quad (9)$$

As illustrated in FIG. 8, the distribution of the amplitude term A(x, y) at the complex amplitude F(x, y) of the unit constituent region R(x, y) corresponds to intensity distribution on the X-Y plane in a range of coordinate components of x=0 to M1−1 and y=0 to N1−1. In addition, the distribution of the phase term P(x, y) at the complex amplitude F(x, y) in the unit constituent region R(x, y) corresponds to phase distribution on the X-Y plane in the range of x=0 to M1−1 and y=0 to N1−1. The rotation angle φ(x, y) in the unit constituent region R(x, y) is obtained from P(x, y) as will be described later, and the distribution of the rotation angle φ(x, y) of the unit constituent region R(x, y) corresponds to rotation angle distribution on the X-Y plane in the range of coordinate components of x=0 to M1−1 and y=0 to N1−1.

Incidentally, the center Q of the output beam pattern on the Kx-Ky plane is positioned on an axis perpendicular to a first surface 100a, and four quadrants with the center Q as the origin are illustrated in FIG. 8. Although a case where an optical image is obtained in the first quadrant and the third quadrant is illustrated in FIG. 8 as an example, it is also possible to obtain images in the second quadrant and the fourth quadrant, or in all the quadrants. In the present embodiment, a pattern point-symmetric with respect to the origin can be obtained as illustrated in FIG. 8. FIG. 8 illustrates a case where, for example, a character "A" in the third quadrant and a pattern obtained by rotating the character "A" by 180° in the first quadrant are obtained. Incidentally, rotationally-symmetric optical images (for example, a cross, a circle, a double circle, or the like) are observed as one optical image in an overlapping manner.

The output beam pattern (optical image) from the light-emitting device 1A becomes an optical image corresponding to the designed optical image (original image) expressed by at least one of a spot, a spot group consisting of three or more points, a straight line, a cross, a line drawing, a lattice pattern, a photograph, a stripe pattern, computer graphics (CG), and a character. Here, the rotation angle φ(x, y) of the modified refractive index region 16b in the unit constituent region R(x, y) is determined by the following procedure in order to obtain the target output beam pattern.

As described above, the gravity center G of the modified refractive index region 16b is arranged inside the unit constituent region R(x, y) in the state of being separated from the lattice point O(x, y) by the distance r (a value of r(x, y)). At this time, the modified refractive index region 16b is arranged inside the unit constituent region R(x, y) such that the rotation angle φ(x, y) satisfies the following relationship.

$$\varphi(x,y)=C\times P(x,y)+B$$

C: a proportional constant, for example, 180°/π
B: an arbitrary constant, for example, 0

Incidentally, the proportional constant C and the arbitrary constant B are the same for all the unit constituent regions R.

That is, when it is desired to obtain a desired optical image, the optical image is preferably subjected to inverse Fourier transform, and the rotation angle distribution φ(x, y) corresponding to the phase of the complex amplitude is applied to the plurality of modified refractive index regions 16b. Incidentally, a far-field image obtained after Fourier transform of a laser beam can take a spot shape such as a single or a plurality of circles, rectangles, and polygons, and a cross-sectional shape of the spot on the X-Y plane may have a Gaussian function shape, a top hat shape, or the like. In addition, the cross-sectional shape may have a shape in which both 1st-order light inclined from the perpendicular direction with respect to the light output surface 10a and −1st-order light output in a direction rotated by 180° on the X-Y plane do not overlap with each other.

As a method for obtaining the intensity distribution and the phase distribution from the complex amplitude distribution obtained by the Fourier transform, for example, the intensity distribution I(x, y) can be calculated by using the abs function of numerical analysis software "MATLAB" of MathWorks, Inc., and the phase distribution P(x, y) can be calculated by using the angle function of MATLAB.

Figure 9A:
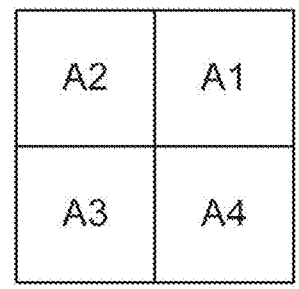
FIGS. 9A and 9B are views for describing points to be noted when obtaining a phase distribution based on a phase angle distribution obtained from a result of discrete Fourier transform of the optical image and determining the arrangement of the modified refractive index regions.
Figure 9B:
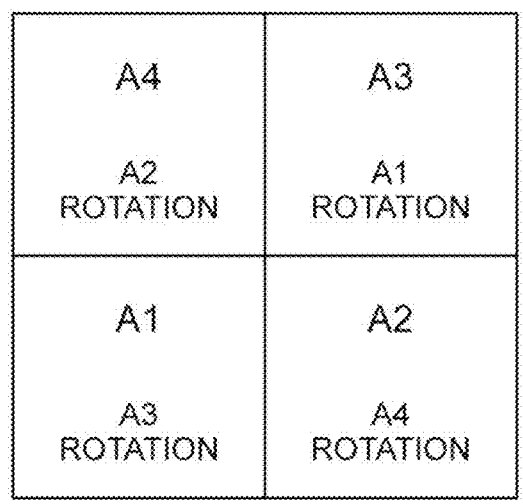

Here, a description will be given regarding points to be noted in the case of performing calculation using general discrete Fourier transform (or fast Fourier transform) when the arrangement of the respective modified refractive index regions 16b is determined by obtaining the rotation angle distribution φ(x, y) based on a result of the Fourier transform of the optical image. When the optical image before being subjected to the Fourier transform is divided into four quadrants A1, A2, A3, and A4 as illustrated in FIG. 9A, a beam pattern is obtained as illustrated in FIG. 9B. That is, a pattern in which a pattern obtained by rotating a pattern of the first quadrant of FIG. 9A by 180° and a pattern of the third quadrant of FIG. 9A overlap with each other appears in the first quadrant of the beam pattern of FIG. 9B. A pattern in which a pattern obtained by rotating a pattern of the second quadrant of FIG. 9A by 180° and a pattern of the fourth quadrant of FIG. 9A overlap with each other appears in the second quadrant of the beam pattern. A pattern in which a pattern obtained by rotating the pattern of the third quadrant of FIG. 9A by 180° and the pattern of the first quadrant of FIG. 9A overlap with each other appears in the third quadrant of the beam pattern. A pattern in which a pattern obtained by rotating the pattern of the fourth quadrant of FIG. 9A by 180° and the pattern of the second quadrant of FIG. 9A overlap with each other appears in the fourth quadrant of the beam pattern.

Therefore, when an optical image having a value only in the first quadrant is used as the optical image (original optical image) before being subjected to the inverse Fourier transform, the first quadrant of the original optical image appears in the third quadrant of the obtained beam pattern, and a pattern obtained by rotating the first quadrant of the original optical image by 180° appears in the first quadrant of the obtained beam pattern.

FIG. 1 will be referred to again. The spatial light modulator 20 spatially modulates the light L1 outputted from the semiconductor light-emitting device 10A, and then, outputs the modulated light to the outside of the light-emitting device 1A. As a result, a desired optical image is formed outside the light-emitting device 1A. The spatial light modulator 20 has a light input/output surface 20a facing the light output surface 10a. The spatial light modulator 20 modulates at least one of the phase and intensity of the light L1 inputted through the light input/output surface 20a for each of a plurality of pixels, and outputs the modulated light (reflected light) L1 from the light input/output surface 20a.

The spatial light modulator 20 has a specific configuration as follows. The spatial light modulator 20 is a reflection type spatial light modulator, and includes a common electrode 21, a liquid crystal layer 22, a reflection film 23, a protective film 24, a plurality of pixel electrodes 25, and a circuit board 26. The common electrode 21 is a transparent electrode that transmits the light L1, and is provided in common to the plurality of pixels. A front surface of the common electrode 21 opposite to the liquid crystal layer 22 constitutes the light input/output surface 20a. The liquid crystal layer 22 is arranged between the common electrode 21 and the reflection film 23. The liquid crystal layer 22 is made of, for example, nematic liquid crystal or ferroelectric liquid crystal. An alignment film (not illustrated) is provided on an upper surface and a lower surface of the liquid crystal layer 22. The reflection film 23 is a dielectric multilayer film or a metal film such as aluminum, and reflects light in a wavelength range including a wavelength of the light L1. A distance between the light output surface 10a of the semiconductor light-emitting device 10A and the reflection film 23 is, for example, 3.0 mm to 3.5 mm, typically 3.1 mm. The plurality of pixel electrodes 25 define the plurality of pixels. The plurality of pixel electrodes 25 are provided on the opposite side of the liquid crystal layer 22 with the reflection film 23 interposed therebetween, and an electric field is applied to the liquid crystal layer 22 arranged between the reflection film 23 and the common electrode 21 for each pixel. For example, several hundreds of pixel electrodes 25 are provided for one first portion 8a. An outer size of one pixel electrode 25 is, for example, 5 μm to 40 μm, and typically 20 μm.

The light L1 inputted through the light input/output surface 20a reaches the liquid crystal layer 22 after passing through the common electrode 21, and is reflected by the reflection film 23. Further, the reflected light L1 reaches the common electrode 21 again. At this time, a phase change corresponding to the intensity of the electric field applied by the pixel electrode 25 and the common electrode 21 is applied to the light L1 inside the liquid crystal layer 22. A voltage applied by each of the pixel electrodes 25 is calculated in advance based on a desired optical image.

Effects obtained by the light-emitting device 1A according to the present embodiment having the above-described structure will be described together with problems of the conventional light-emitting device. FIG. 59 is a schematic view illustrating a cross-sectional configuration of a light-emitting device 100 according to a comparative example. The light-emitting device 100 according to the comparative example includes a semiconductor light-emitting device 110 and the spatial light modulator 20. The semiconductor light-emitting device 110 is a so-called photonic crystal laser, and has the same configurations as the semiconductor light-emitting device 10A according to the present embodiment except for the following points. That is, the semiconductor light-emitting device 110 has a photonic crystal layer 101, instead of the phase modulation layer 16A of the semiconductor light-emitting device 10A. In the photonic crystal layer 101, a gravity center of each modified refractive index region coincides with a lattice point of a virtual square lattice. In addition, the semiconductor light-emitting device 110 includes an electrode 102, instead of the electrode 19 of the semiconductor light-emitting device 10A. The electrode 102 has an opening 102a, and an anti-reflection film 103 is provided in the opening 102a.

In the light-emitting device 100 according to the comparative example, light emission is obtained in the active layer 13 when a drive current is supplied between the electrode 18 and the electrode 102. Light L2 outputted from the active layer 13 is inputted into the photonic crystal layer 101, and is oscillated in a predetermined mode due to a two-dimensional distributed Bragg diffraction effect inside the photonic crystal layer 101. The light L2 outputted from the inside of the photonic crystal layer 101 is outputted to the outside of the semiconductor light-emitting device 110 through an opening of the electrode 18. The light L2 is output along a direction (a normal direction of a light output surface) perpendicular to the light output surface of the semiconductor light-emitting device 110. Further, the light L2 is modulated in the spatial light modulator 20 provided to face the semiconductor light-emitting device 110. The modulated light (reflected light) L2 outputted from the spatial light modulator 20 passes through the semiconductor light-emitting device 110, and then, is outputted to the outside of the light-emitting device 100.

However, a light-shielding component (for example, the electrode 18) of the semiconductor light-emitting device 110 causes attenuation or a diffraction effect when the modulated light L2 passes through the semiconductor light-emitting device 110 in such a light-emitting device 100. That is, the quality of the optical image is degraded. In addition, when the spatial light modulator 20 and the semiconductor light-emitting device 110 are arranged to be separated from each other in order to avoid such a problem, position adjustment for optical coupling between the spatial light modulator 20 and the semiconductor light-emitting device 110 becomes complicated, and the light-emitting device 100 becomes large. Such a problem becomes more severe when the light-emitting device 100 includes a large number of the semiconductor light-emitting devices 110.

For the above-described problem, in the light-emitting device 1A according to the present embodiment, each gravity center G of the plurality of modified refractive index regions 16b included in the phase modulation layer 16A is arranged such that a vector from a lattice point O of the virtual square lattice set on the X-Y plane (design plane), which corresponds to the gravity center G, to the gravity center G has a predetermined rotation angle around the corresponding lattice point O. In this case, as compared with the semiconductor light-emitting device 110 in which the gravity center G of the plurality of modified refractive index regions 16b is positioned on the lattice point O of the square lattice, the light intensity of 0th-order light output in the direction perpendicular to the light output surface 10a (the normal direction of the light output surface 10a) decreases, and the light intensity of high-order light (for example, 1st-order light and 1st-order light) output in the direction inclined with respect to the normal direction increases. Therefore, it is possible to suitably realize the semiconductor light-emitting device 10A that outputs the light L in the direction inclined with respect to the normal direction of the light output surface 10a.

Further, the semiconductor light-emitting device 10A includes the first portion 8a and the second portion 8b in the light-emitting device 1A. The electrode 18 and the electrode 19 are provided in the first portion 8a, and the light L1 is outputted from the light output surface 10a of the first portion 8a. On the other hand, the modulated light L1 outputted from the spatial light modulator 20 passes through the second portion 8b. Even if the light output surface 10a of the semiconductor light-emitting device 10A and the light input/output surface 20a of the spatial light modulator 20 face each other, the semiconductor light-emitting device 10A outputs the light L1 in the direction inclined with respect to the normal direction of the light output surface 10a, and thus, it is possible to adopt such a configuration. Further, the modulated light L1 is outputted to the outside of the light-emitting device 1A while avoiding the electrodes 18 and 19 with this configuration. That is, it is possible to effectively reduce the attenuation and diffraction effect caused by the semiconductor light-emitting device 10A with respect to the modulated light L1 according to the present embodiment.

As described above, it is possible to reduce the attenuation and diffraction effect caused by the semiconductor light-emitting device 10A with respect to the modulated light L1 even in the configuration in which the spatial light modulator 20 and the semiconductor light-emitting device 10A are arranged close to each other according to the light-emitting device 1A according to the present embodiment. Therefore, the position adjustment for optical coupling between the spatial light modulator 20 and the semiconductor light-emitting device 10A is facilitated, and the light-emitting device 1A can be downsized. In addition, since the light output surface 10a of the semiconductor light-emitting device 10A (first portion 8a) and the light input/output surface 20a of the spatial light modulator 20 face each other, the position adjustment for optical coupling is further facilitated, and the semiconductor light-emitting device 10A can be easily fixed to the spatial light modulator 20.

As in the present embodiment, the light-emitting device 1A may include the anti-reflection film 31 provided on the front surface of the semiconductor laminate portion 11 in the second portion 8b and the anti-reflection film 32 provided on the back surface 9b of the semiconductor substrate 9. As a result, a loss is reduced when the modulated light L1 passes through the front surface of the semiconductor laminate portion 11 and the back surface 9b of the semiconductor substrate 9 in the second portion 8b (the light output efficiency of the light-emitting device 1A is enhanced).

In addition, the modified refractive index region 16b may not be formed in the phase modulation layer 16A of the second portion 8b as in the present embodiment. As a result, the attenuation and diffraction effect caused by the semiconductor light-emitting device 10A with respect to the modulated light L1 can be further reduced.

The planar shape of the electrode 18 may be the lattice shape as in the present embodiment. In this case, a part of the electrode 18 can also be arranged in the vicinity of the center of the light output surface 10a of the first portion 8a. As a result, the current is sufficiently supplied even to the vicinity of the center of the active layer 13 of the first portion 8a, and the area of the light output surface 10a of the first portion 8a can be further increased.

The light L1 outputted from the semiconductor light-emitting device 10A may be at least one of the 1st-order light and −1st-order light as in the present embodiment. Such light components are outputted in the direction inclined with respect to a normal direction of the light output surface 10a. Therefore, it is possible to suitably realize the light-emitting device 1A that exhibits the above-described effects.

First Modification

Figure 10:
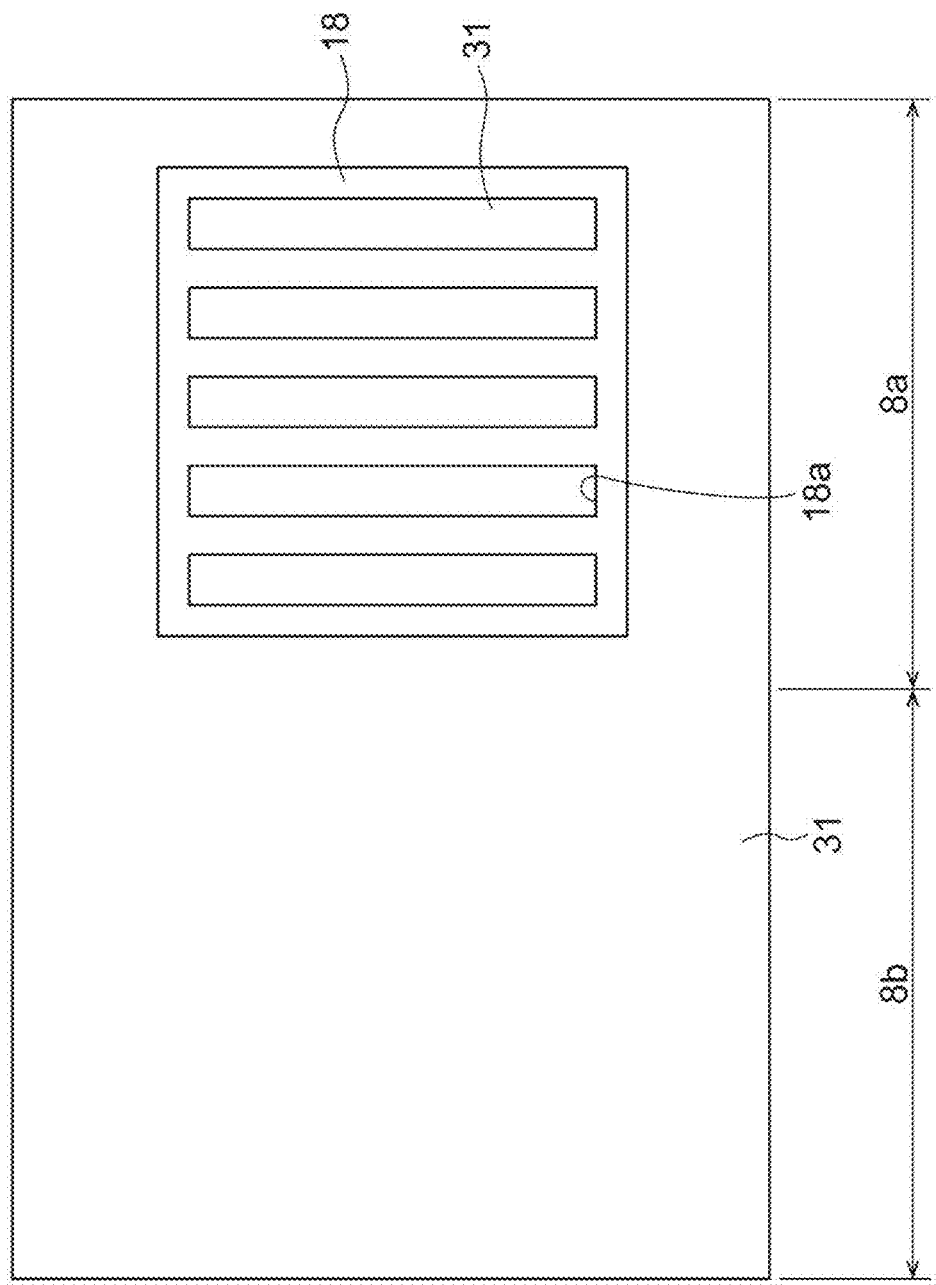
FIG. 10 is a top view of a semiconductor light-emitting device according to a first modification.

FIG. 10 is a top view of a semiconductor light-emitting device according to a first modification of the first embodiment. The semiconductor light-emitting device according to the first modification has the same structure as that of the first embodiment except for the following point. That is, a planar shape of the electrode 18 is not a lattice shape but a stripe shape in the semiconductor light-emitting device according to the present modification as illustrated in FIG. 10. Specifically, a plurality of linear electrode portions extending in the X-axis direction (or Y-axis direction) are arranged in the Y-axis direction (or X-axis direction), and these electrode portions are connected to each other through another pair of electrode portions extending in the Y-axis direction (or X-axis direction) at both ends. An anti-reflection film 31 is formed between the plurality of linear electrode portions. Even when the semiconductor light-emitting device has the electrode 18 having such a shape, the same effects as those of the first embodiment described above can be suitably achieved. Incidentally, the shape of the electrode 18 is not limited to the first embodiment and the present modification described above, and it is possible to apply various shapes that can pass light L1.

Second Modification

Figure 11:
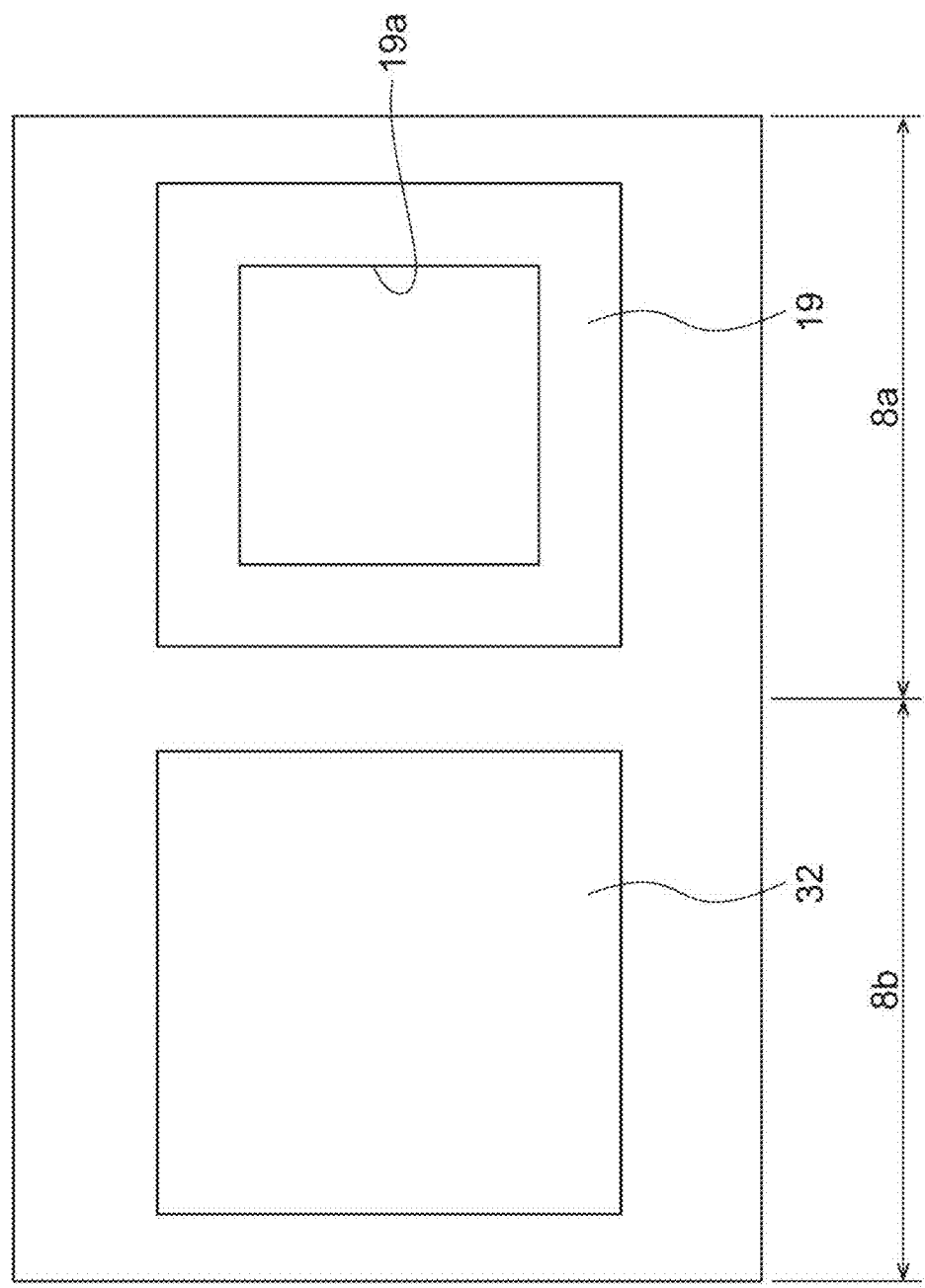
FIG. 11 is a bottom view of a semiconductor light-emitting device according to a second modification.

FIG. 11 is a bottom view of a semiconductor light-emitting device according to a second modification of the first embodiment. The semiconductor light-emitting device according to the second modification also has the same structure as that of the first embodiment described above except for the following point. In the semiconductor light-emitting device according to the present modification, a planar shape of the electrode 19 is a quadrangular frame shape, and an opening 19a including a central portion of the first portion 8a is provided in the electrode 19 as illustrated in FIG. 11. For example, the electrode 19 may have such a shape including the opening. Even with such a configuration, a current can be suitably supplied to the active layer 13. A light emission state inside the element can be monitored through the opening 19a. In addition, it is also possible to prevent the semiconductor substrate 9 from absorbing 0th-order light in the vertical direction to the center Q of the output beam pattern illustrated in FIG. 8. It is a matter of course that the opening 19a may be omitted.

Third Modification

Figure 12:
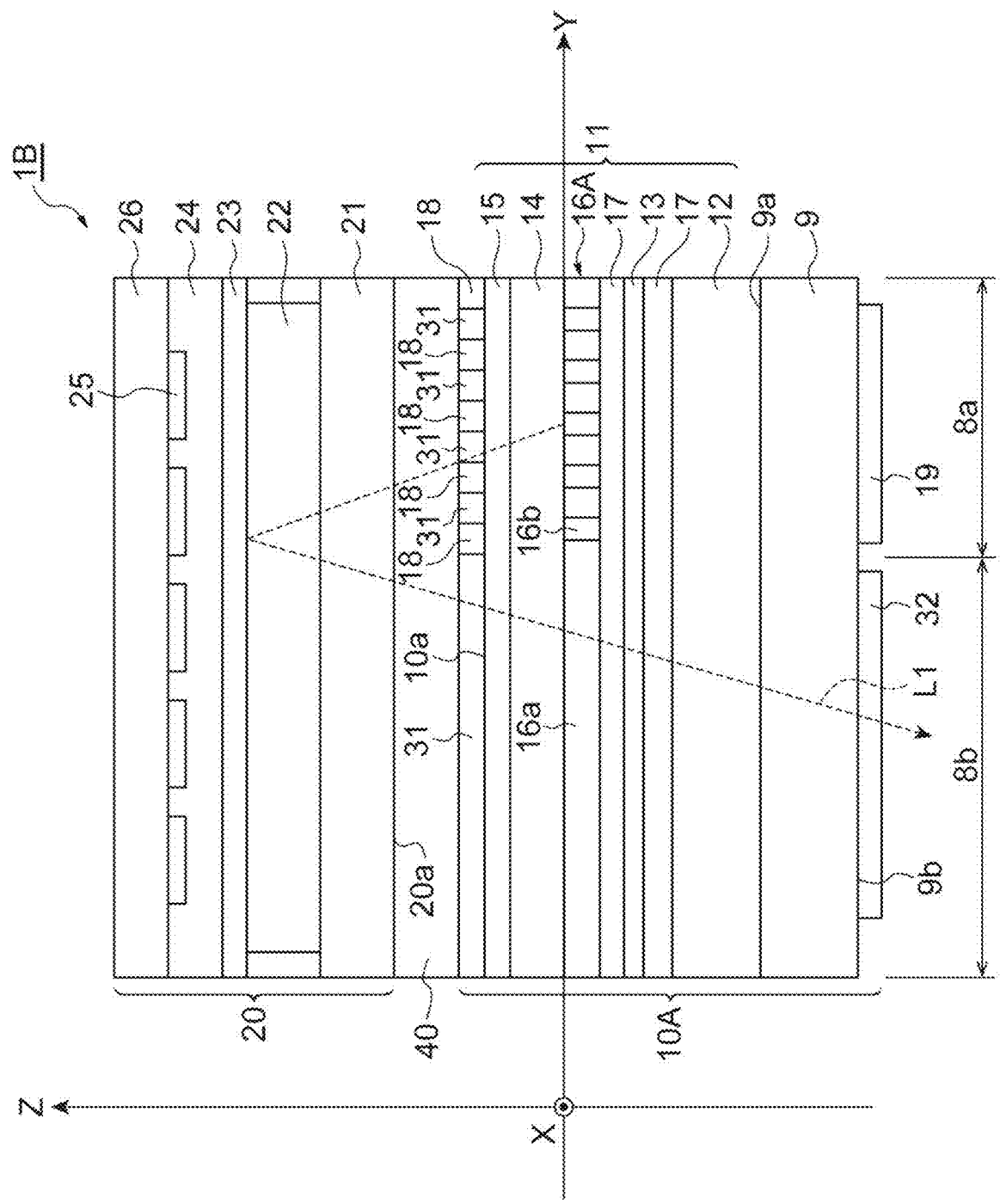
FIG. 12 is a schematic view illustrating a cross-sectional configuration of a light-emitting device according to a third modification.

FIG. 12 is a schematic view illustrating a cross-sectional configuration of a light-emitting device 1B according to a third modification of the first embodiment. The light-emitting device 1B according to the present modification further includes a support substrate 40 in addition to the configuration of the light-emitting device 1A of the first embodiment described above. The other structures are the same as those in the first embodiment. The support substrate 40 is a plate-shaped member and is made of a light-transmitting material (for example, quartz, sapphire, diamond, or a composite material including at least two of them) that transmits light L1. The semiconductor light-emitting device 10A is fixed to the spatial light modulator 20 through the support substrate 40. Specifically, one plate surface of the support substrate 40 is bonded to the light output surface 10a of the semiconductor light-emitting device 10A through the anti-reflection film 31. In addition, the other plate surface of the support substrate 40 is bonded to the light input/output surface 20a of the spatial light modulator 20. The one plate surface and the other plate surface of the support substrate 40 are parallel to each other.

As in the light-emitting device 1B according to the present modification, the semiconductor light-emitting device 10A and the spatial light modulator 20 may be bonded to each other through the support substrate 40. As a result, the mechanical strength of the light-emitting device 1B can be increased, and the probability of breakage of the light-emitting device 1B caused by a bending force can be reduced. Further, a distance between the light output surface 10a of the semiconductor light-emitting device 10A and the light input/output surface 20a of the spatial light modulator 20 can be easily adjusted by a thickness of the support substrate 40.

Fourth Modification

Figure 13:
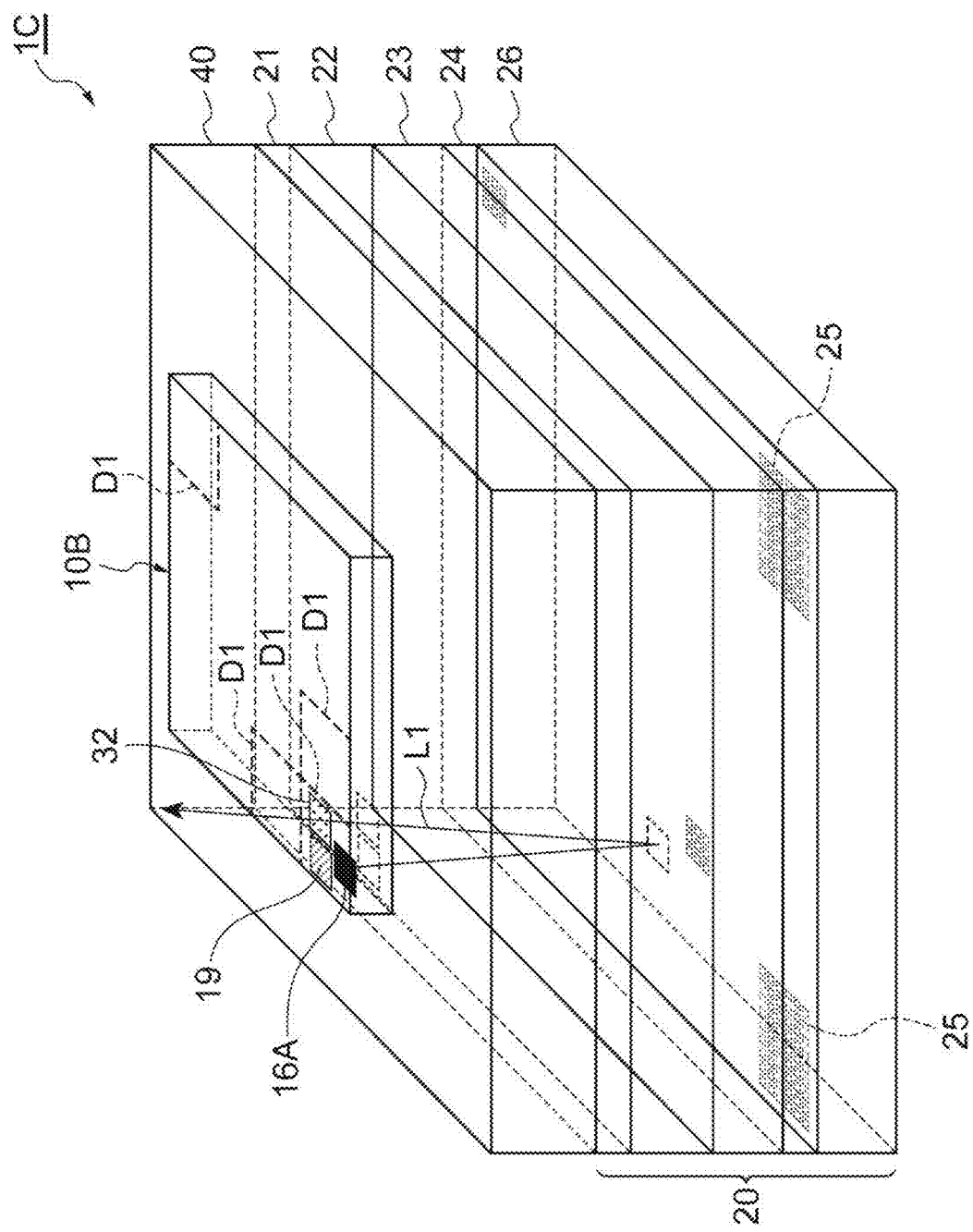
FIG. 13 is a perspective view illustrating an appearance of a light-emitting device according to a fourth modification.
Figure 14:
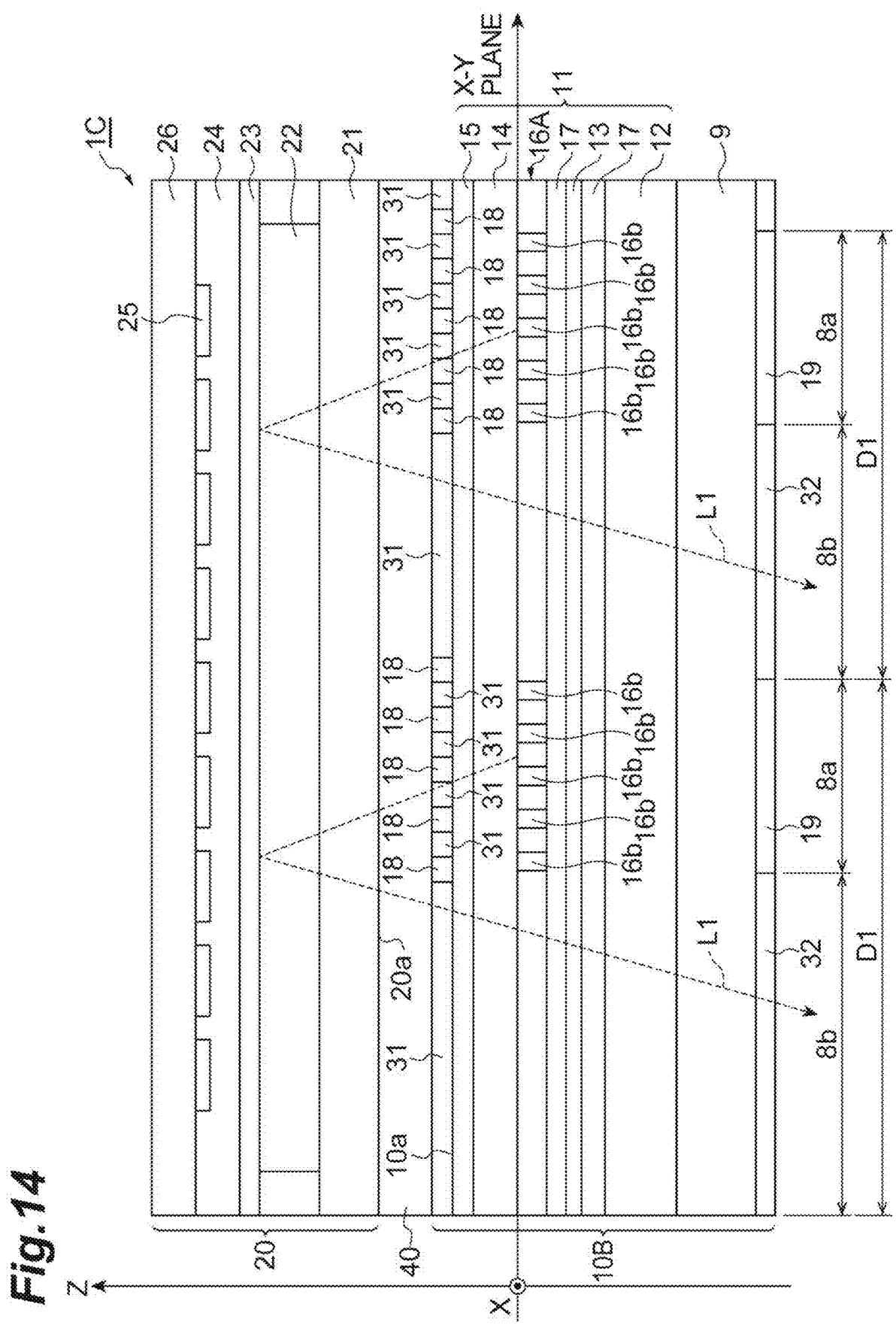
FIG. 14 is a schematic view partially illustrating a cross-sectional configuration of the light-emitting device illustrated in FIG. 13.
Figure 15:
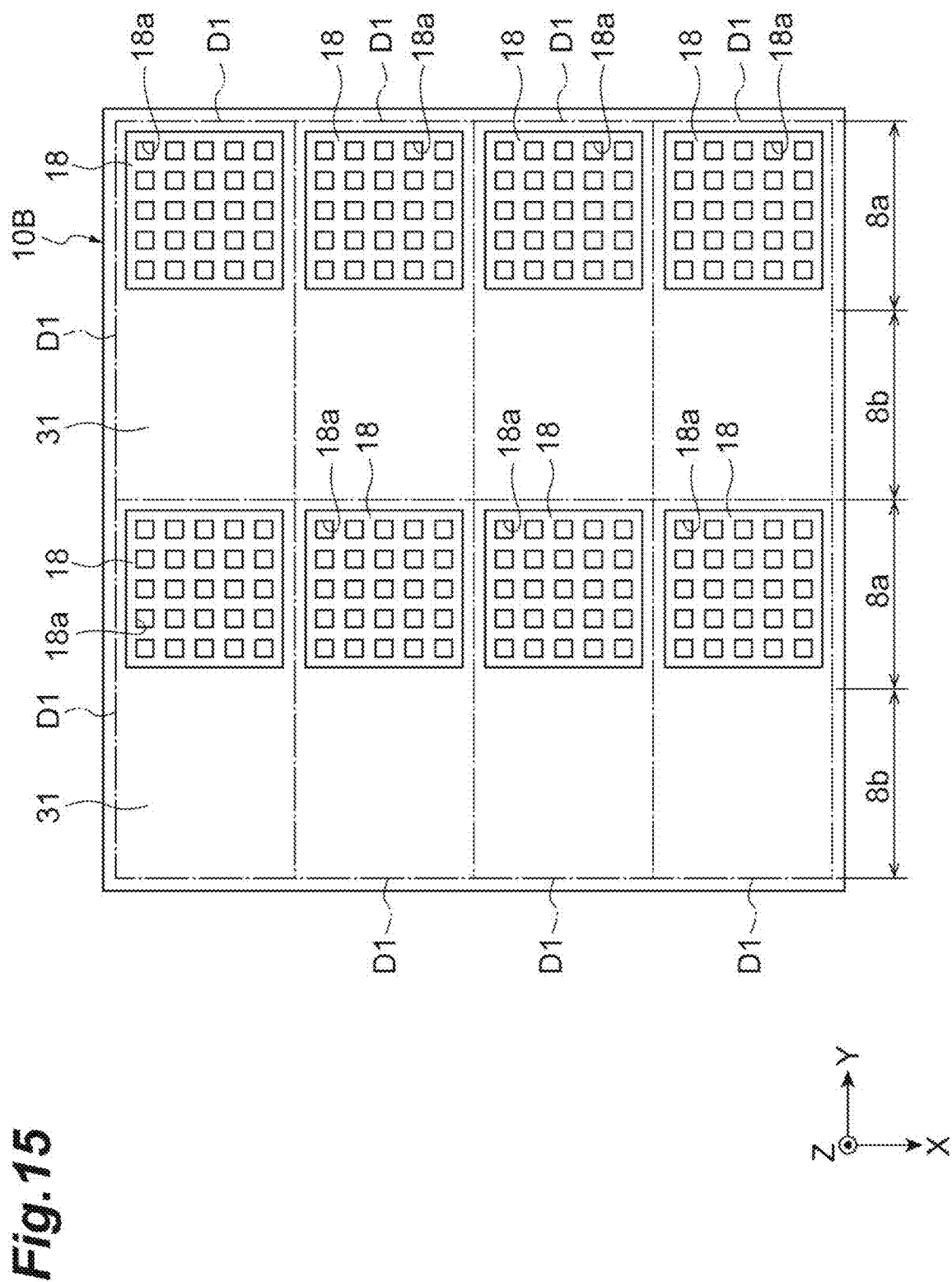
FIG. 15 is an enlarged view illustrating an example of a structure of an upper surface (on a side of a light output surface 10a) of the semiconductor light-emitting device.
Figure 16:
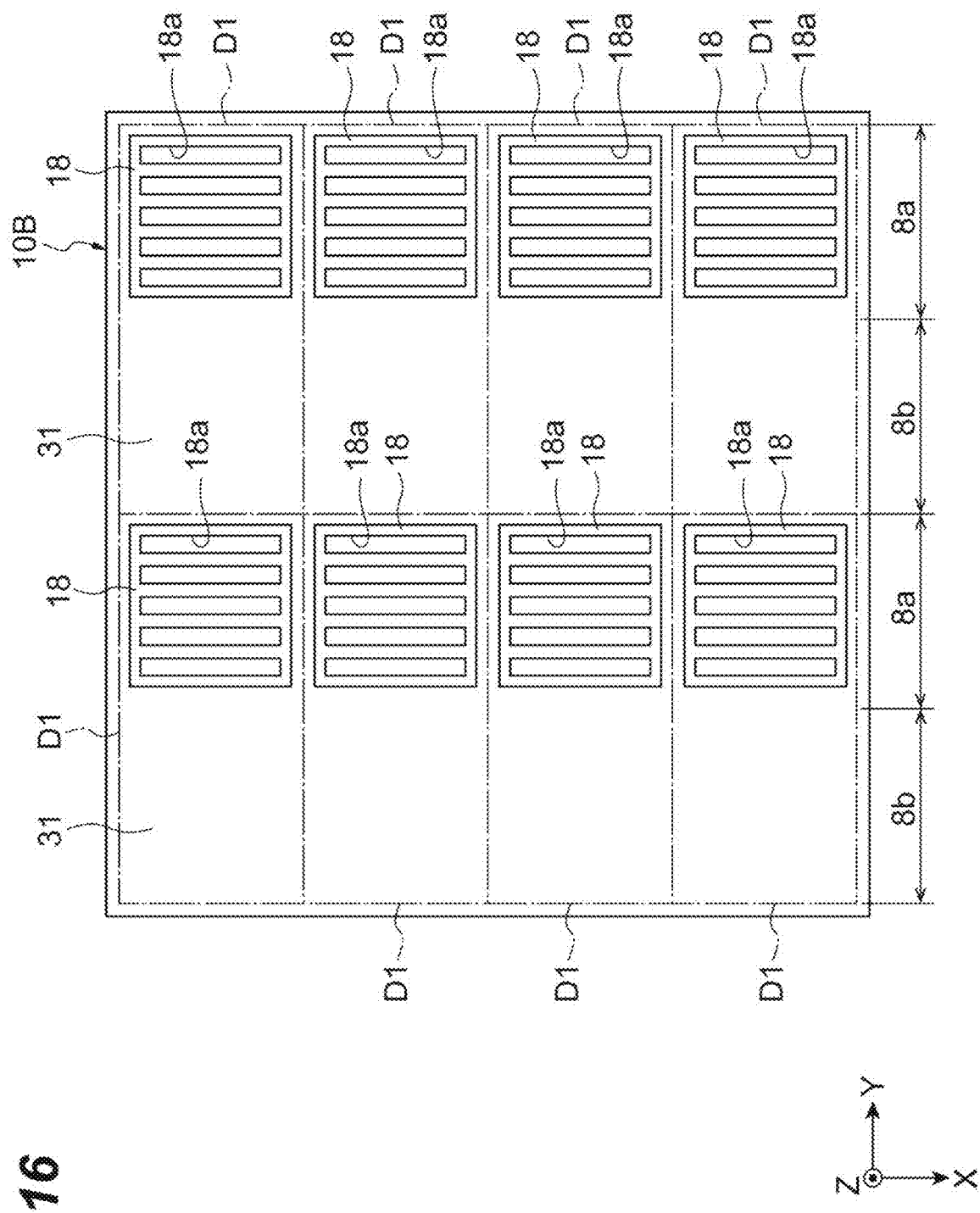
FIG. 16 is an enlarged view illustrating an example of the structure of the upper surface (on the light output surface 10a side) of the semiconductor light-emitting device.

FIG. 13 is a perspective view illustrating an appearance of a light-emitting device 1C according to a fourth modification of the first embodiment. FIG. 14 is a schematic view partially illustrating a cross-sectional configuration of the light-emitting device 1C illustrated in FIG. 13. As illustrated in FIGS. 13 and 14, the light-emitting device 1C according to the present modification includes a semiconductor light-emitting device 10B, instead of the semiconductor light-emitting device 10A according to the first embodiment described above. The semiconductor light-emitting device 10B is a semiconductor light-emitting device array in which a plurality of unit regions D1 having the same configuration as the semiconductor light-emitting device 10A according to the first embodiment are arrayed two-dimensionally along the X-axis direction and the Y-axis direction. FIG. 13 illustrates four unit regions D1 as representatives. A length of one side of the unit region D1 is, for example, 0.01 mm to 25 mm, and typically 1 mm. FIG. 15 is an enlarged top view of the semiconductor light-emitting device 10B. As illustrated in FIG. 15, the light output surface 10a of the semiconductor light-emitting device 10B is divided into the plurality of unit regions D1, and the electrode 18 and the anti-reflection film 31 are provided in each of the unit regions D1. The electrode 18 has a lattice-like planar shape, which is similar to the first embodiment. Alternatively, the electrode 18 may have a striped planar shape, which is similar to the first modification as illustrated in FIG. 16. In addition, the first portion 8a and the second portion 8b are arranged in the Y-axis direction in each of the unit regions D1 in the present modification. In addition, the first portions 8a of the adjacent unit regions D1 are arranged in the X-axis direction, and the second portions 8b of the adjacent unit regions D1 are arranged in the X-axis direction.

Figure 17:
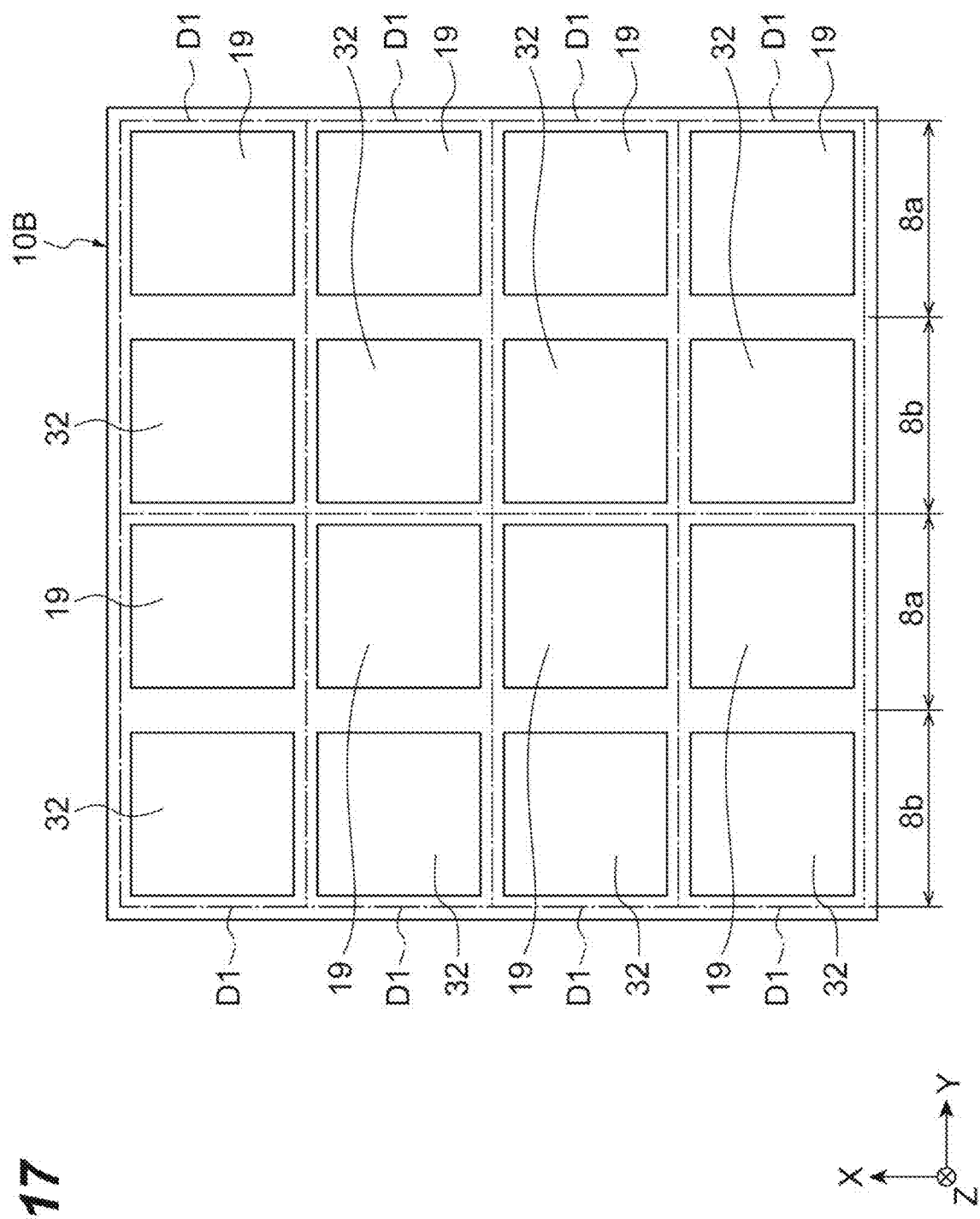
FIG. 17 is an enlarged view illustrating an example of a structure of a bottom surface (on a side of a back surface 9b) of the semiconductor light-emitting device.

FIG. 17 is an enlarged bottom view of the semiconductor light-emitting device 10B. As illustrated in FIG. 17, the back surface 9b of the semiconductor substrate 9 is also divided into a plurality of unit regions D1. The electrode 19 and the anti-reflection film 32 are provided in each of the unit regions D1. The electrode 19 has a quadrangular planar shape, which is similar to the first embodiment. Alternatively, the electrode 19 may have a frame-like planar shape having an opening, which is similar to the second modification (see FIG. 11).

In the present modification, light L1 outputted from the first portion 8a of each of the unit regions D1 is inputted to a region of the spatial light modulator 20 corresponding to each of the unit regions D1. Further, a phase of the light L1 is modulated in the region, and the modulated light L1 passes through the second portion 8b of the unit region D1, and then, is outputted to the outside of the light-emitting device 1C. Even with the configuration of the present modification, the same effects as those of the first embodiment can be obtained. As a plurality of beams of the light L are generated using the semiconductor light-emitting device array as in the present modification, it is possible to obtain an optical image having the larger area than that in the first embodiment. In addition, the light-emitting device can be easily manufactured as compared with a seventh modification to be described later, and a light-emitting region (the first portion 8a) can be arranged with high accuracy.

Incidentally, the support substrate 40 may be provided between the semiconductor light-emitting device 10B and the spatial light modulator 20 even in the present modification. As a result, the mechanical strength of the light-emitting device 1C is increased (the probability of breakage of the light-emitting device 1C caused by a bending force is reduced). Further, a distance between the light output surface 10a of the semiconductor light-emitting device 10B and the light input/output surface 20a of the spatial light modulator 20 can be easily adjusted by a thickness of the support substrate 40.

Fifth Modification

Figure 18:
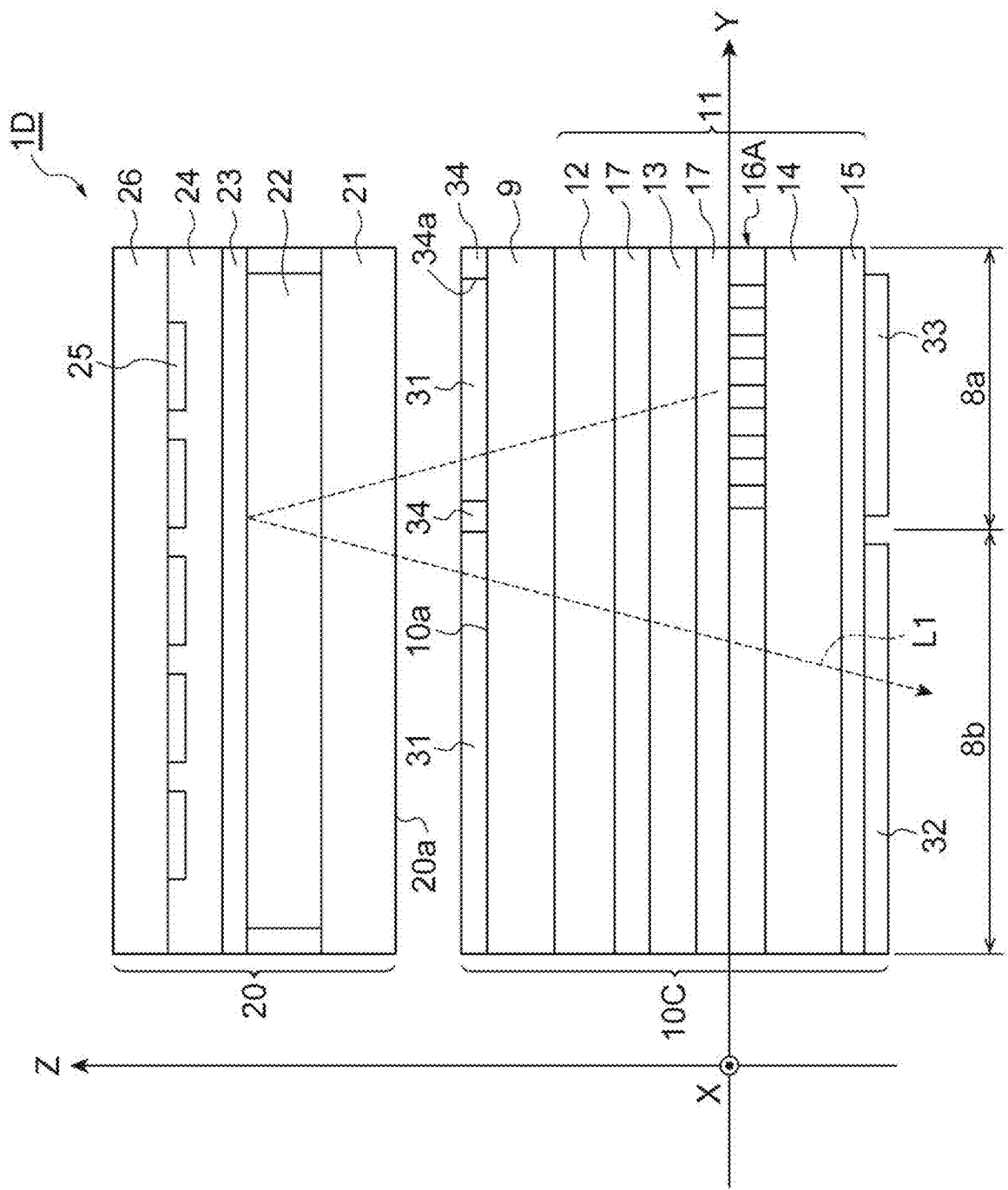
FIG. 18 is a schematic view illustrating a cross-sectional configuration of a light-emitting device according to a fifth modification.

FIG. 18 is a schematic view illustrating a cross-sectional configuration of a light-emitting device 1D according to a fifth modification of the first embodiment. The light-emitting device 1D according to the present modification includes a semiconductor light-emitting device 10C, instead of the semiconductor light-emitting device 10A according to the first embodiment described above. The semiconductor light-emitting device 10C outputs light L1 from the back surface 9b of the semiconductor substrate 9, which is different from the semiconductor light-emitting device 10A according to the first embodiment. That is, the light output surface 10a of the semiconductor light-emitting device 10C is included in the back surface 9b of the semiconductor substrate 9 in the present modification. Therefore, the light input/output surface 20a of the spatial light modulator 20 faces the back surface 9b of the semiconductor substrate 9. The semiconductor laminate portion 11 is provided on the opposite side of the spatial light modulator 20 with respect to the semiconductor substrate 9.

Figure 19:
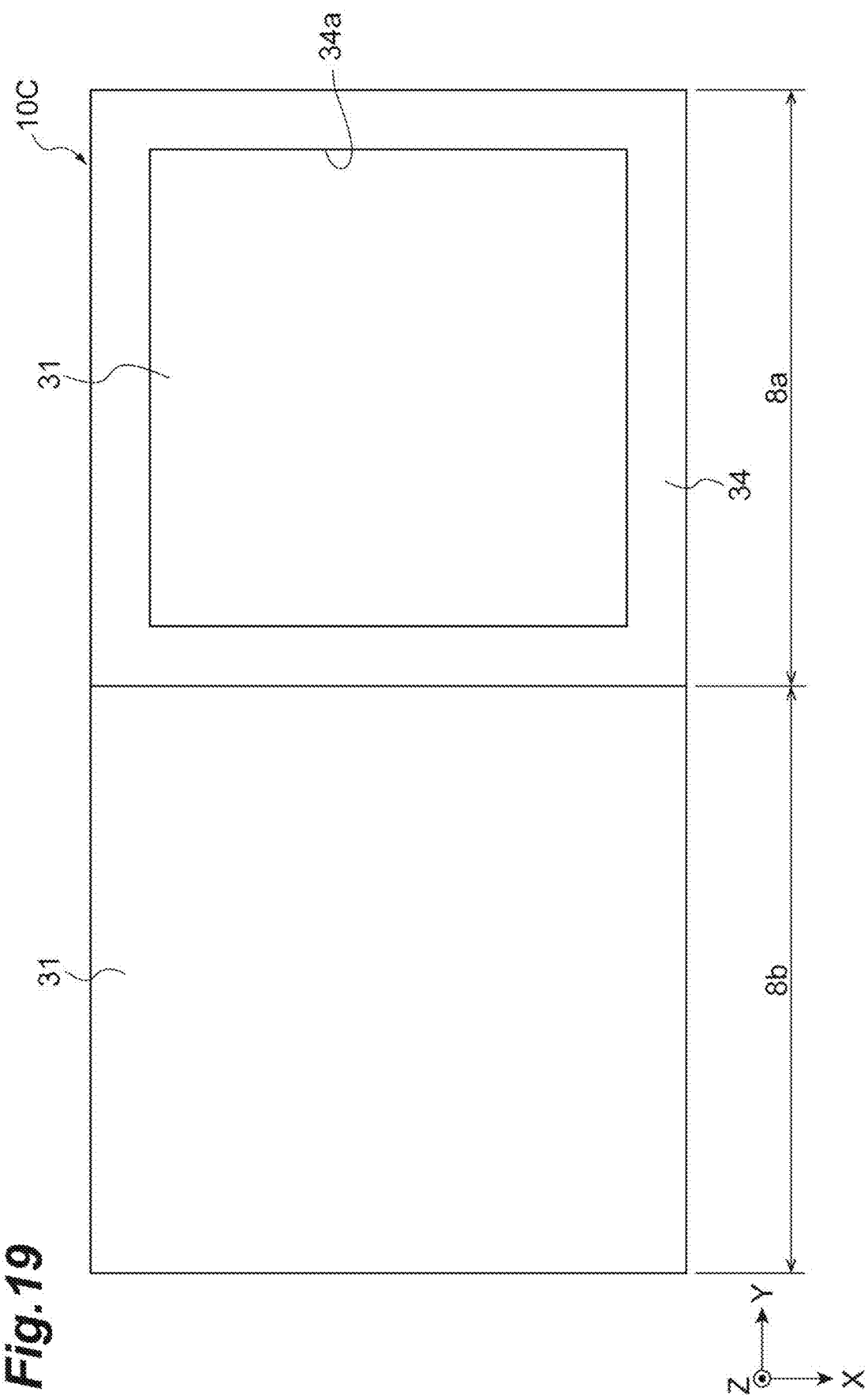
FIG. 19 is a top view of the semiconductor light-emitting device as viewed from a light output surface side.
Figure 20:
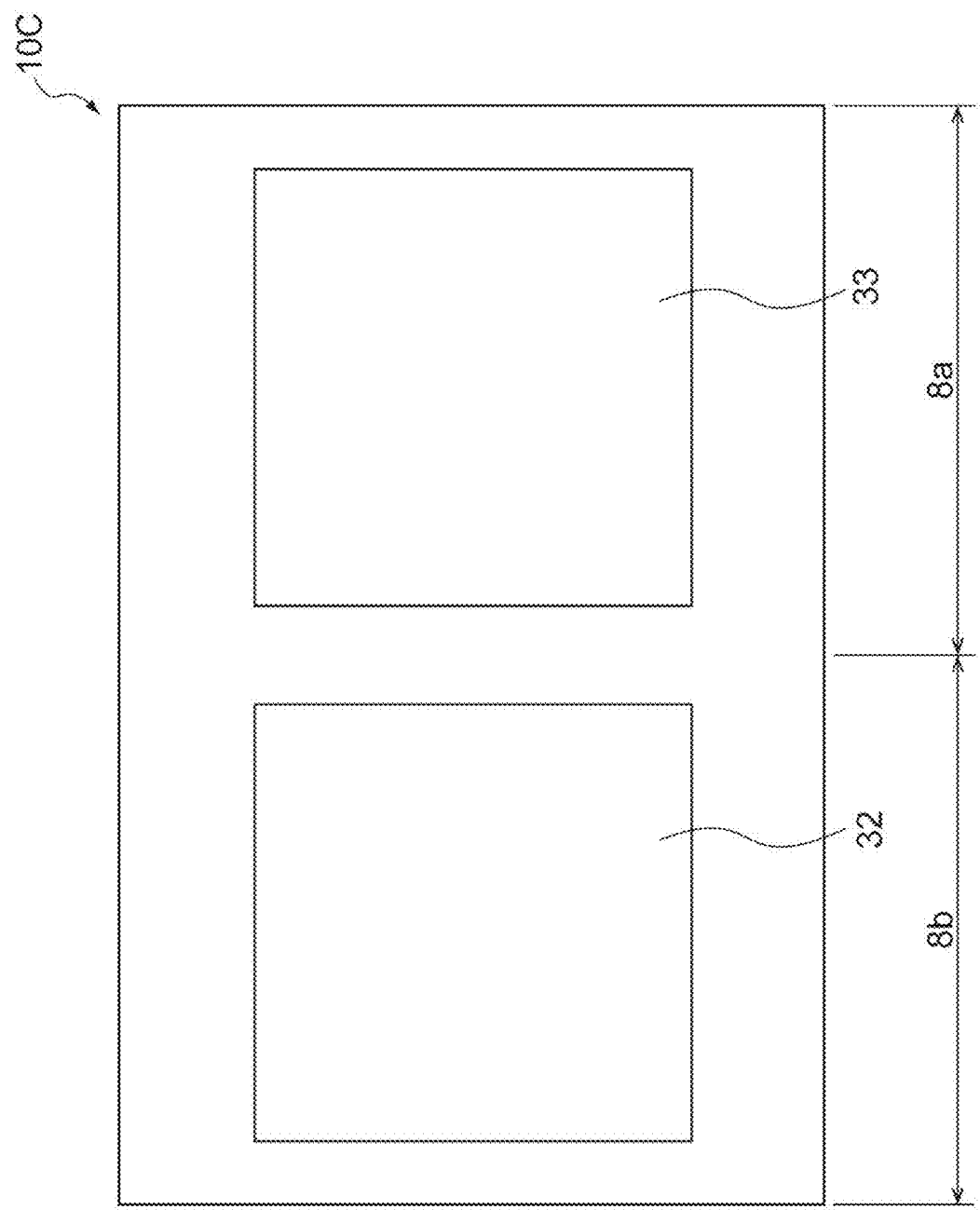
FIG. 20 is a bottom view of the semiconductor light-emitting device as viewed from a front surface side of a semiconductor laminate portion.

Even in the present modification, the semiconductor light-emitting device 10C includes the first portion 8a and the second portion 8b arranged in a direction along the main surface 9a with respect to the first portion 8a. An electrode 33 (first electrode) is provided on the contact layer 15 of the first portion 8a, and an electrode 34 (second electrode) is provided on the back surface 9b of the semiconductor substrate 9 of the first portion 8a. The electrode 33 is in ohmic contact with the contact layer 15, and the electrode 34 is in ohmic contact with the semiconductor substrate 9. FIG. 19 is a top view of the semiconductor light-emitting device 10C as viewed from the light output surface 10a side (that is, the back surface 9b side). FIG. 20 is a bottom view of the semiconductor light-emitting device 10C as viewed from a front surface side of the semiconductor laminate portion 11. As illustrated in FIGS. 18 to 20, the electrodes 33 and 34 are provided only in the first portion 8a of the semiconductor light-emitting device 10C and are not provided in the second portion 8b. Further, the electrode 34 has a square frame-like planar shape, and has an opening 34a including a central portion of the first portion 8a as illustrated in FIG. 19. The back surface 9b positioned inside the opening 34a is covered with the anti-reflection film 31. The entire back surface 9b of the second portion 8b is covered with the anti-reflection film 31. In other words, the anti-reflection film 31 is provided in the entire region excluding the electrode 34 on the back surface 9b (light output surface 10a). The light L1 outputted from the semiconductor light-emitting device 10C passes through the opening 34a of the electrode 34. Since the light L1 passes through the opening 34a of the electrode 34, the light L1 can be suitably outputted from the back surface 9b side without being blocked by the electrode 34. Incidentally, the planar shape of the electrode 34 may be a lattice shape like the electrode 18 illustrated in FIG. 2 or a stripe shape like the electrode 18 illustrated in FIG. 10.

In addition, the electrode 33 has a square planar shape, for example, and covers a portion including the vicinity of the central portion of the first portion 8a on the front surface of the semiconductor laminate portion 11 as illustrated in FIG. 20. The anti-reflection film 32 is provided on the front surface of the semiconductor laminate portion 11 in the second portion 8b.

Incidentally, the plurality of modified refractive index regions 16b are formed only in the phase modulation layer 16A of the first portion 8a, and are not formed in the phase modulation layer 16A of the second portion 8b even in the present modification.

When a drive current is supplied between the electrode 33 and the electrode 34, recoupling between electrons and holes occurs in the active layer 13 (light emission). The electrons and holes contributing to the light emission and the generated light in the active layer 13 are efficiently confined between the lower cladding layer 12 and the upper cladding layer 14. The light outputted from the active layer 13 is inputted to the inside of the phase modulation layer 16A, and forms a predetermined mode corresponding to a lattice structure inside the phase modulation layer 16A. The light L1 outputted from the inside of the phase modulation layer 16A is outputted to the outside of the semiconductor light-emitting device 10C through the opening 34a of the electrode 34. At this time, the 0th-order light is output in a direction perpendicular to the light output surface 10a. On the other hand, the light L1 that is higher-order light (for example, 1st-order light or −1st-order light) is output in an arbitrary direction inclined with respect to the normal direction of the light output surface 10a.

The semiconductor light-emitting device may be a back surface output type as in the present modification. Even with such a configuration, the same effects as those of the first embodiment described above can be suitably obtained. However, a loss of the light L1 sometimes increases due to light absorption in the semiconductor substrate 9 depending on a combination of a wavelength of the light L1 and a constituent material of the semiconductor substrate 9. In such a case, a front surface output type semiconductor light-emitting device may be used as in the first embodiment.

Sixth Modification

Figure 21:
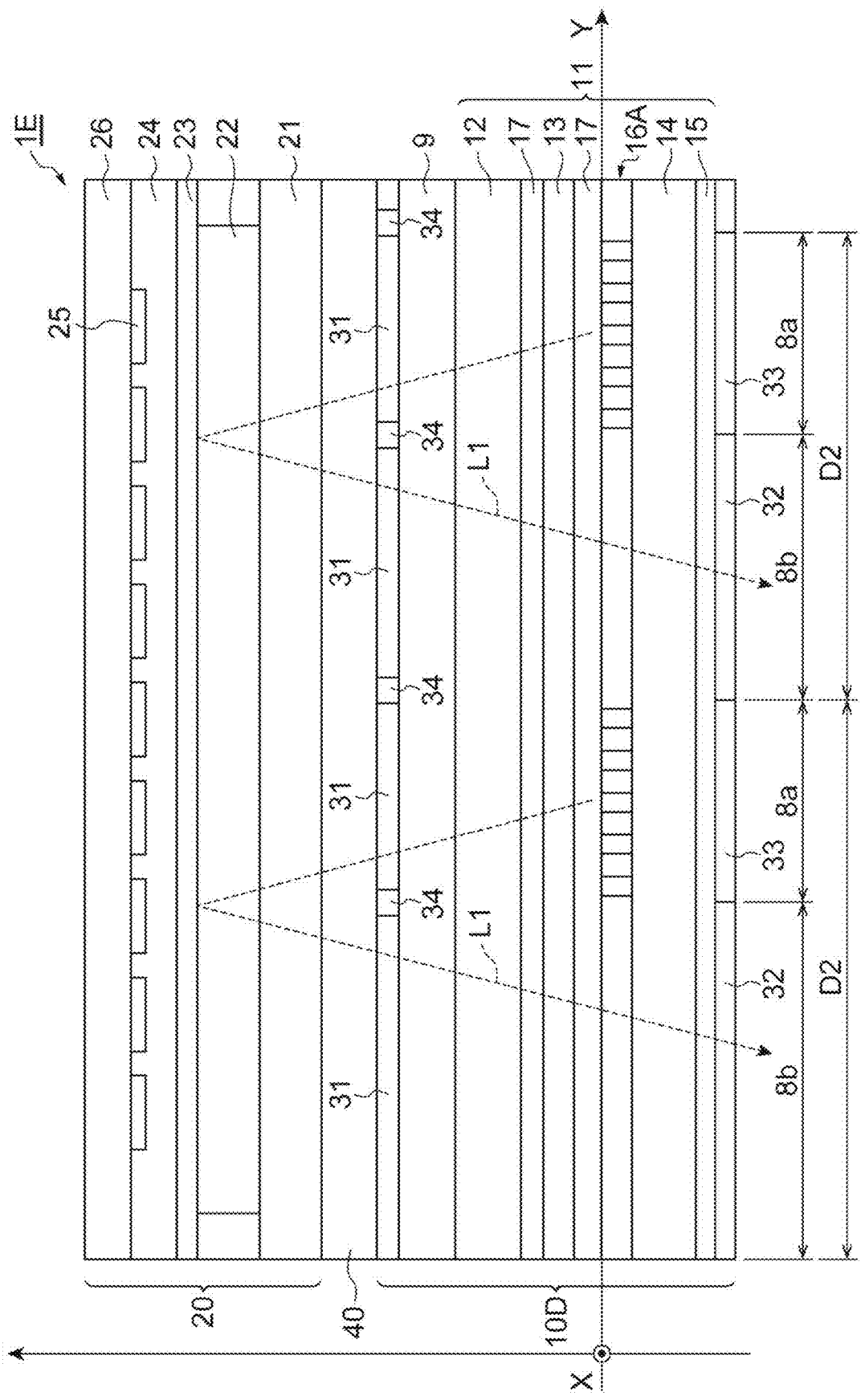
FIG. 21 is a schematic view partially illustrating a cross-sectional configuration of a light-emitting device according to a sixth modification.

FIG. 21 is a schematic view partially illustrating a cross-sectional configuration of a light-emitting device 1E according to a sixth modification of the first embodiment. As illustrated in FIG. 21, the light-emitting device 1E according to the present modification includes a semiconductor light-emitting device 10D, instead of the semiconductor light-emitting device 10A according to the first embodiment described above. The semiconductor light-emitting device 10D is a semiconductor light-emitting device array in which a plurality of unit regions D2 having the same configuration as the semiconductor light-emitting device 10C according to the fourth modification are arrayed two-dimensionally along the X-axis direction and the Y-axis direction. A length of one side of the unit region D2 is, for example, 0.01 mm to 25 mm, and typically 1 mm.

Figure 22:
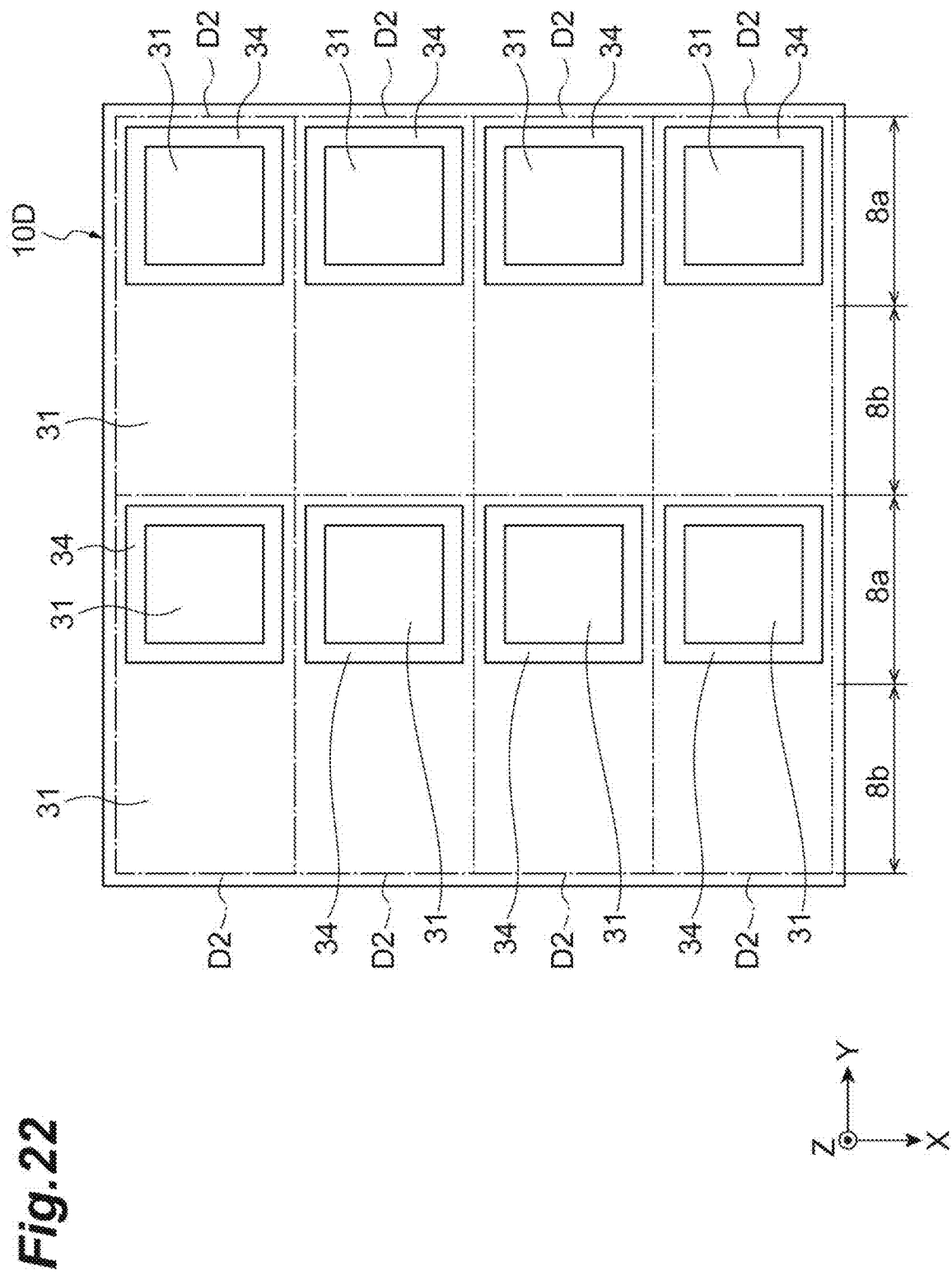
FIG. 22 is an enlarged view of an example of a structure of an upper surface (on the light output surface 10a side) of the semiconductor light-emitting device.

FIG. 22 is an enlarged top view of the semiconductor light-emitting device 10D. As illustrated in FIG. 22, the light output surface 10a of the semiconductor light-emitting device 10D is divided into the plurality of unit regions D2, and the electrode 34 and the anti-reflection film 31 are provided in each of the unit regions D2. The electrode 34 has a planar shape like a frame shape with the opening 34a, which is similar to the fourth modification. In addition, the first portion 8a and the second portion 8b are arranged in the Y-axis direction in each of the unit regions D2 in the present modification. In addition, the first portions 8a of the adjacent unit regions D2 are arranged in the X-axis direction, and the second portions 8b of the adjacent unit regions D2 are arranged in the X-axis direction.

Figure 23:
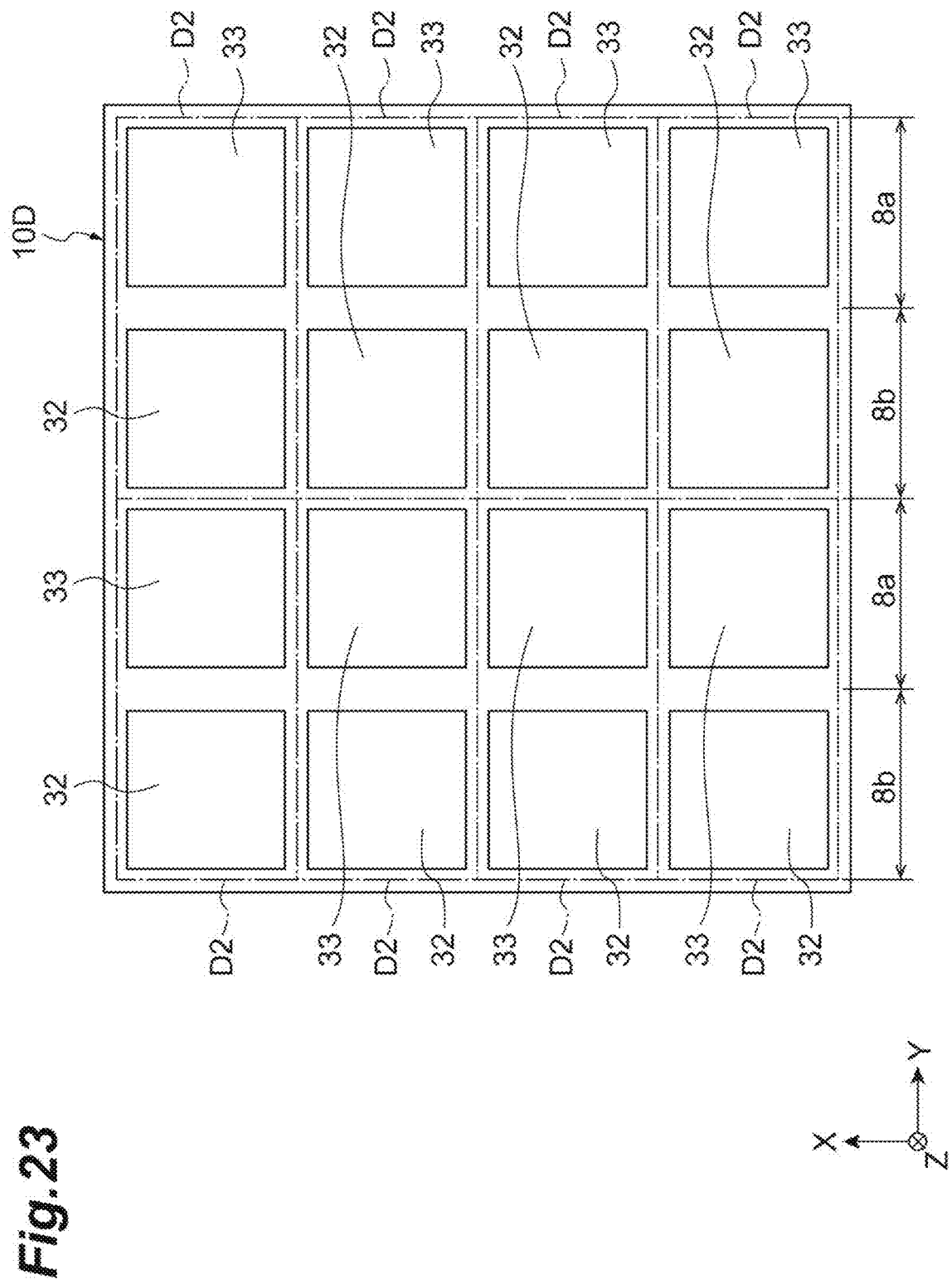
FIG. 23 is an enlarged view illustrating an example of a structure of a bottom surface (on the back surface 9b side) of the semiconductor light-emitting device.

FIG. 23 is an enlarged bottom view of the semiconductor light-emitting device 10D. As illustrated in FIG. 23, the back surface 9b of the semiconductor substrate 9 is also divided into a plurality of unit regions D2. The electrode 33 and the anti-reflection film 32 are provided in each of the unit regions D2. The electrode 33 has a quadrangular planar shape, which is similar to the fifth modification. Alternatively, the electrode 33 may have a frame-like planar shape having an opening, which is similar to the second modification (see FIG. 11).

In the present modification, light L1 outputted from the first portion 8a of each of the unit regions D2 is inputted to a region of the spatial light modulator 20 corresponding to each of the unit regions D2. Further, a phase of the light L1 is modulated in the region, and the modulated light L1 passes through the second portion 8b of the unit region D2, and then, is outputted to the outside of the light-emitting device 1E. Even with the configuration of the present modification, the same effects as those of the first embodiment can be obtained. In addition, as a plurality of beams of the light L1 are generated using the semiconductor light-emitting device array as in the present modification, an optical image having the larger area than that in the first embodiment is obtained.

Incidentally, the support substrate 40 may be provided between the semiconductor light-emitting device 10D and the spatial light modulator 20 even in the present modification. As a result, the mechanical strength of the light-emitting device 1E can be increased (the probability of breakage of the light-emitting device 1E caused by a bending force can be reduced). Further, a distance between the light output surface 10a of the semiconductor light-emitting device 10D and the light input/output surface 20a of the spatial light modulator 20 can be easily adjusted by a thickness of the support substrate 40.

Second Embodiment

Figure 24:
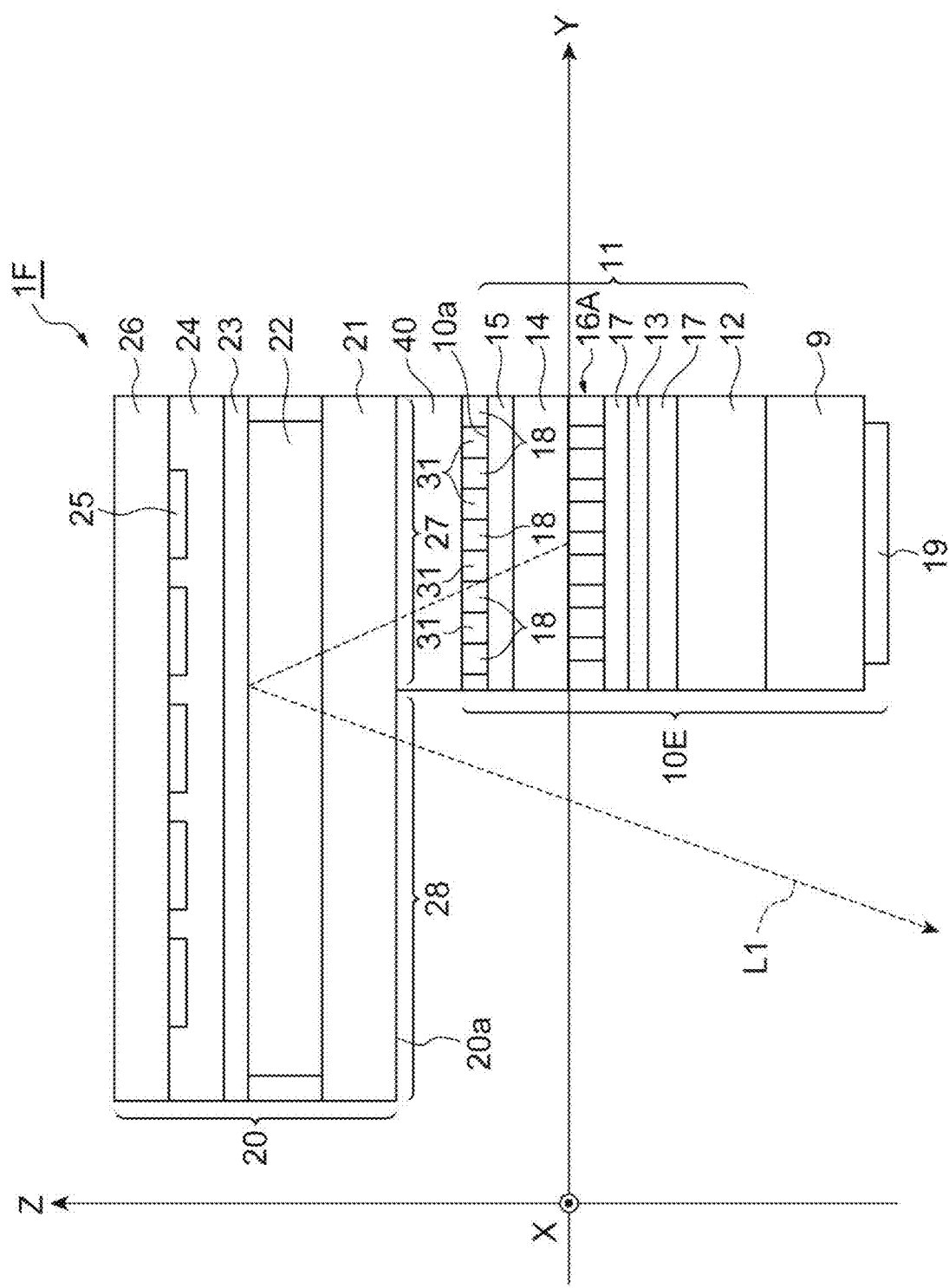
FIG. 24 is a schematic view illustrating a cross-sectional configuration of a light-emitting device according to a second embodiment.

FIG. 24 is a schematic view illustrating a cross-sectional configuration of a light-emitting device 1F according to a second embodiment. The light-emitting device 1F according to the present embodiment includes a semiconductor light-emitting device 10E, instead of the semiconductor light-emitting device 10A according to the first embodiment. The semiconductor light-emitting device 10E does not have the second portion 8b and has only a portion corresponding to the first portion 8a, which is different from the first embodiment. In other words, the semiconductor light-emitting device 10E has the same structure as the first portion 8a of the semiconductor light-emitting device 10A according to the first embodiment, but does not have a portion (portion corresponding to the second portion 8b of the semiconductor light-emitting device 10A according to the first embodiment) that transmits modulated light L1 outputted from the spatial light modulator 20.

The light input/output surface 20a of the spatial light modulator 20 includes a first region 27 and a second region 28. The first region 27 and the second region 28 are arranged, for example, along the Y-axis direction. The semiconductor light-emitting device 10E is arranged on the first region 27 through the support substrate 40, and the first region 27 faces the light output surface 10a. The second region 28 is a space where nothing is provided. A length of one side of each of the first region 27 and the second region 28 is, for example, 100 µm to 1000 µm, and is 400 µm in one example. The lengths of one side of the first region 27 and the second region 28 may be equal or different.

The light L1 outputted from the semiconductor light-emitting device 10E is inputted to the spatial light modulator 20 through the first region 27. Further, a phase of the light L1 is modulated by the spatial light modulator 20, and the modulated light L1 is outputted from the second region 28 to the outside of the light-emitting device 1F.

Even with the configuration of the present embodiment, the same effects as those of the first embodiment can be obtained. That is, the modulated light L1 can be outputted to the outside of the light-emitting device 1F while avoiding the semiconductor light-emitting device 10E, and thus, it is possible to effectively reduce attenuation and a diffraction effect caused by the semiconductor light-emitting device 10E (particularly the electrodes 18 and 19) with respect to the modulated light L1. In this manner, it is possible to reduce attenuation and diffraction effect caused by the semiconductor light-emitting device 10E with respect to the modulated light L1 even when the spatial light modulator 20 and the semiconductor light-emitting device 10E are arranged close to each other according to the light-emitting device 1F. Therefore, the position adjustment for optical coupling between the spatial light modulator 20 and the semiconductor light-emitting device 10E is facilitated, and the light-emitting device 1F can be downsized. In addition, the light output surface 10a of the semiconductor light-emitting device 10E and the light input/output surface 20a of the spatial light modulator 20 face each other, and thus, position adjustment for optical coupling is further facilitated (the semiconductor light-emitting device 10E can be easily fixed to the spatial light modulator 20).

Seventh Modification

Figure 25:
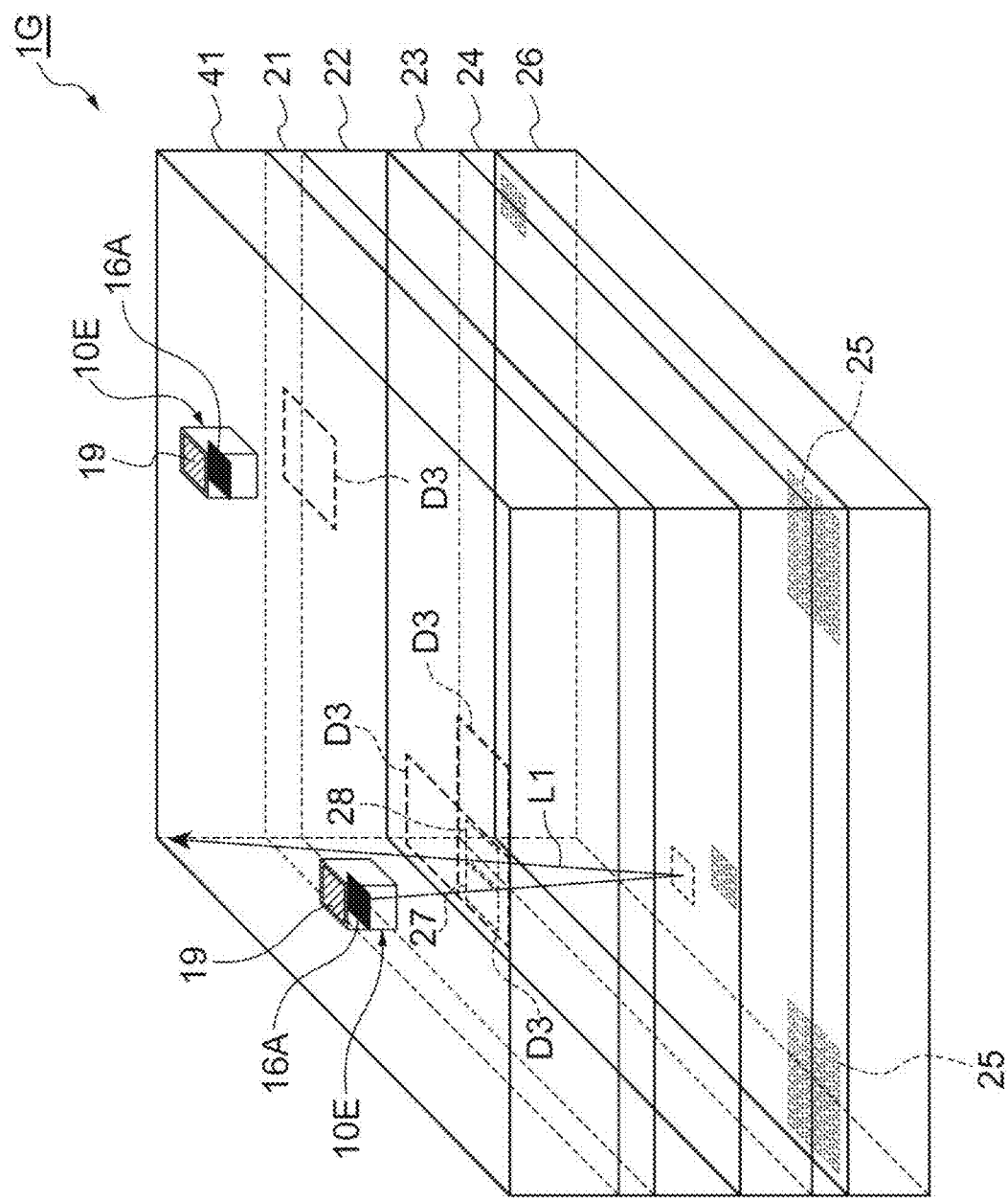
FIG. 25 is a perspective view illustrating an appearance of a light-emitting device according to a seventh modification.
Figure 26:
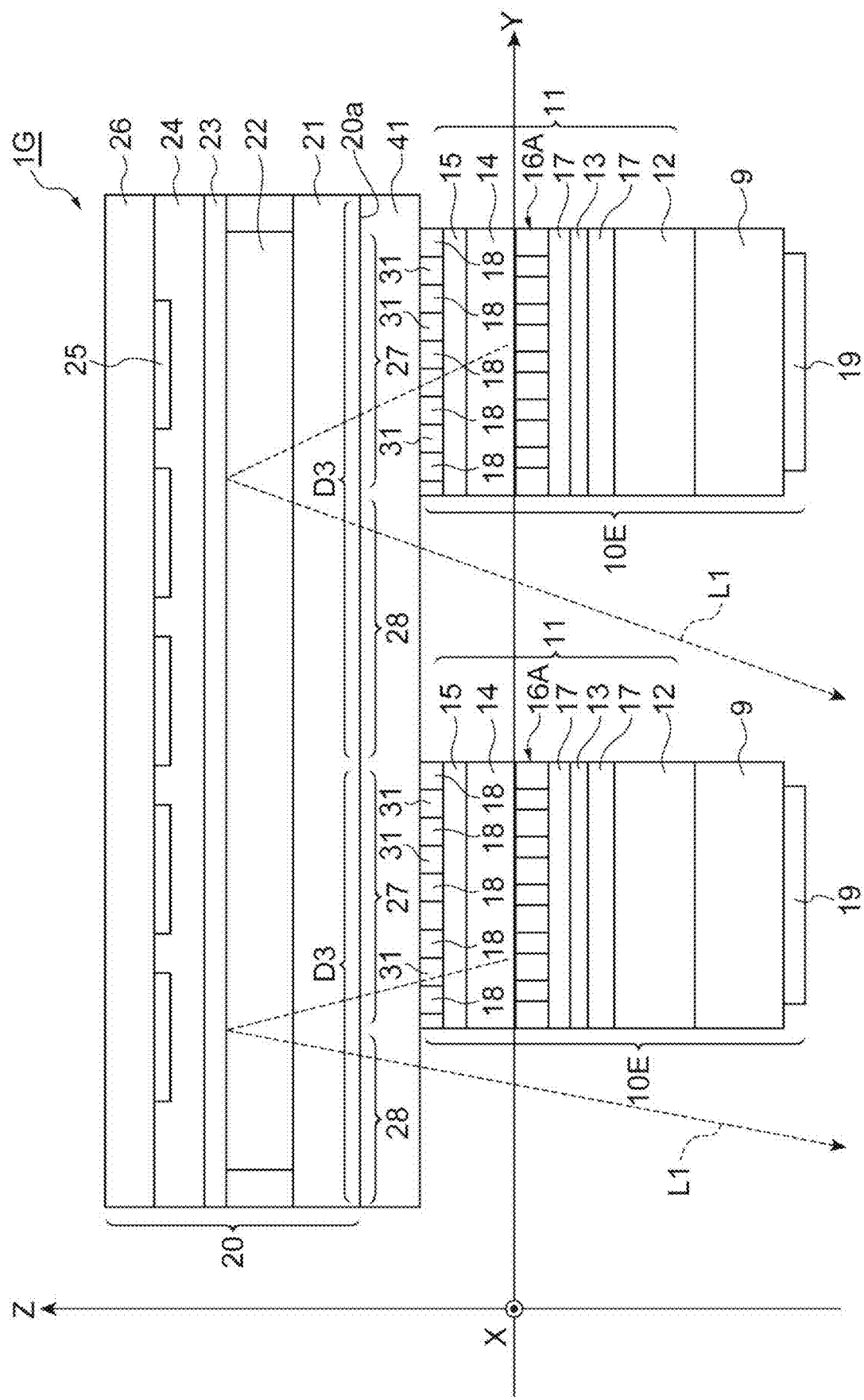
FIG. 26 is a schematic view partially illustrating a cross-sectional configuration of the light-emitting device illustrated in FIG. 25.

FIG. 25 is a perspective view illustrating an appearance of a light-emitting device 1G according to a seventh modification of the second embodiment. FIG. 26 is a schematic view partially illustrating a cross-sectional configuration of the light-emitting device 1G illustrated in FIG. 25. As illustrated in FIGS. 25 and 26, the light-emitting device 1G according to the present modification includes a plurality of the semiconductor light-emitting devices 10E, instead of the semiconductor light-emitting device 10A according to the first embodiment described above. In addition, the light input/output surface 20a of the spatial light modulator 20 includes a plurality of unit regions D3. The plurality of unit regions D3 are arrayed two-dimensionally along the X-axis direction and the Y-axis direction. Each of the unit regions D3 includes the first region 27 and the second region 28. In the present modification, the first region 27 and the second region 28 are arranged in the Y-axis direction in each of the unit regions D3. Each of the plurality of semiconductor light-emitting devices 10E is arranged on the first region 27 of each of the plurality of unit regions D3. A length of one side of the unit region D3 is, for example, 0.01 mm to 25 mm, and typically 1 mm.

The light-emitting device 1G according to the present modification further includes one support substrate 41. The support substrate 41 is a plate-shaped member and is made of the same material as the support substrate 40 of the third modification. The support substrate 41 covers the plurality of unit regions D3 of the spatial light modulator 20 collectively. The plurality of semiconductor light-emitting devices 10E are fixed to the spatial light modulator 20 through the common support substrate 41. Specifically, one plate surface of the support substrate 41 is bonded to the light output surfaces 10a of the plurality of semiconductor light-emitting devices 10E through the electrode 18 and the anti-reflection film 31. On the other hand, the other plate surface of the support substrate 41 is bonded to the light input/output surface 20a of the spatial light modulator 20. The plurality of semiconductor light-emitting devices 10E are fixed to each other through the common support substrate 41. The one plate surface and the other plate surface of the support substrate 41 are parallel to each other.

Figure 27A:
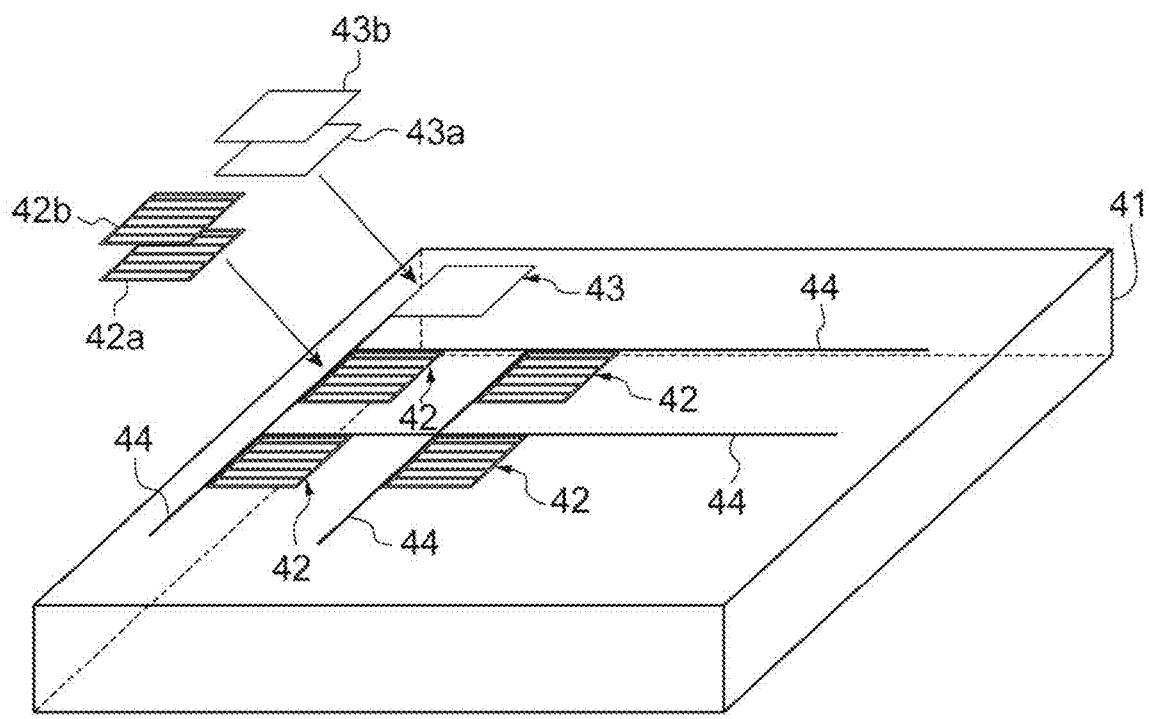
FIG. 27A is a perspective view illustrating a configuration of a support substrate of a seventh modification.
Figure 27B:
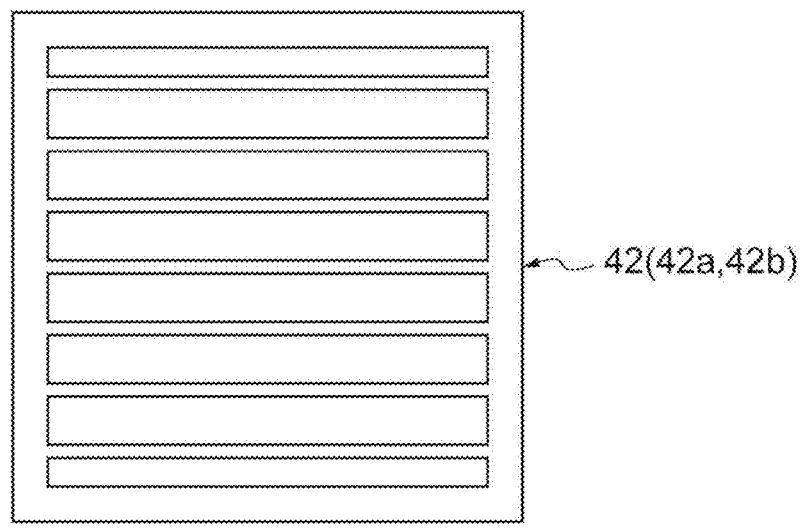
FIG. 27B is a view illustrating planar shapes of a metal film and a conductive adhesive.

FIG. 27A is a perspective view illustrating a configuration of the support substrate 41 according to the present modification. As illustrated in FIG. 27A, a plurality of element electrodes 42 and a pad electrode 43 are provided on the one plate surface of the support substrate 41. Each of the plurality of element electrodes 42 is provided on the first region 27 so as to correspond to each of the plurality of semiconductor light-emitting devices 10E. The electrode 18 of each of the semiconductor light-emitting devices 10E is bonded to the corresponding element electrode 42. Each of the element electrodes 42 includes a metal film 42a provided on the one plate surface of the support substrate 41 and a conductive adhesive (for example, solder) 42b provided on the metal film 42a. As illustrated in FIG. 27B, planar shapes of the metal film 42a and the conductive adhesive 42b are substantially the same as a planar shape (for example, a lattice shape, a stripe shape, a frame shape, or the like) of the electrode 18 in order to pass the light L1. The metal films 42a of the plurality of element electrodes 42 are electrically connected to each other by a wiring 44 provided on the one plate surface of the support substrate 41. The pad electrode 43 is provided near an end of the support substrate 41 and is connected to one end of the wiring 44. A current is supplied to each of the element electrodes 42 through the pad electrode 43. Incidentally, electrodes for wiring on the support substrate 41 illustrated in FIGS. 27A and 27B are not limited to the semiconductor light-emitting device 10E but can be applied to a semiconductor light-emitting device 10F. In this case, a planar shape of the element electrode 42 is not a stripe shape but a frame shape. In addition, the current can be suitably supplied by forming the similar wiring electrode on the support substrate 40 even in the semiconductor light-emitting devices 10B and 10D. Materials of the metal film 42a and the conductive adhesive 42b are selected in accordance with the material of the support substrate 41. As an example, when the support substrate 41 is a quartz substrate, Ti/Au (Ti thickness of 10 nm/Au thickness of 200 nm) can be used for the metal film 42a, and AuSn solder (thickness of 3 µm) can be used for the conductive adhesive 42b. In addition, a diamond plate may be combined on the surface side for heat dissipation as the support substrate 41, and a diamond film may be formed on the surface by CVD. In the present modification, the light L1 outputted from each of the semiconductor light-emitting devices 10E is inputted to the spatial light modulator 20 from the first region 27 of the corresponding unit region D3 after passing through the support substrate 41. Further, a phase of the light L1 is modulated by the spatial light modulator 20, and the modulated light L passes through the support substrate 41 from the second region 28, and then, is outputted to the outside of the light-emitting device 1G. Even with the configuration of the present modification, the same effects as those of the second embodiment can be obtained. In addition, as the plurality of semiconductor light-emitting devices 10E are arranged two-dimensionally as in the present modification, an optical image having the larger area than that in the second embodiment can be obtained. In addition, the present modification can be also applied to light L1 having a wavelength to be absorbed by the semiconductor substrate 9 as compared with the above-described fourth modification.

In the present modification, the support substrate 41 is provided between the plurality of semiconductor light-emitting devices 10E and the spatial light modulator 20. As a result, a distance between the light output surface 10a of the semiconductor light-emitting device 10E and the light input/output surface 20a of the spatial light modulator 20 can be easily adjusted by a thickness of the support substrate 41. Further, since the support substrate 41 has the wiring 44 configured to supply the current to the electrode 18, the current can be suitably supplied to the electrodes 18 of the plurality of semiconductor light-emitting devices 10E covered with the spatial light modulator 20.

Eighth Modification

Figure 28:
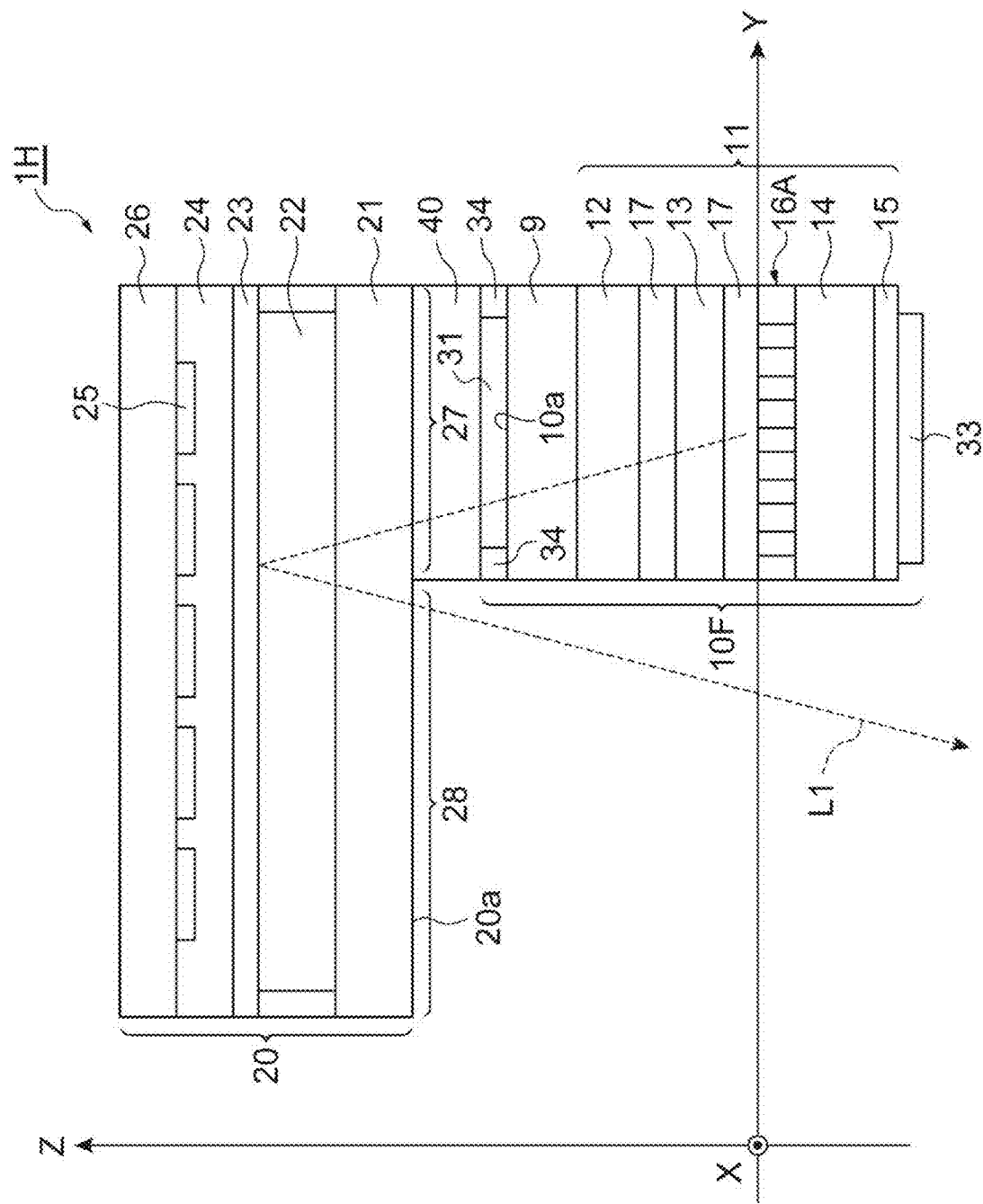
FIG. 28 is a schematic view illustrating a cross-sectional configuration of a light-emitting device according to an eighth modification.

FIG. 28 is a schematic view illustrating a cross-sectional configuration of a light-emitting device 1H according to an eighth modification of the second embodiment. The light-emitting device 1H according to the present modification includes the semiconductor light-emitting device 10F, instead of the semiconductor light-emitting device 10E according to the second embodiment described above. The semiconductor light-emitting device 10F outputs light L1 from the back surface 9b of the semiconductor substrate 9, which is different from the semiconductor light-emitting device 10E according to the second embodiment. That is, the light output surface 10a of the semiconductor light-emitting device 10F is included in the back surface 9b of the semiconductor substrate 9 in the present modification. Therefore, the light input/output surface 20a of the spatial light modulator 20 faces the back surface 9b of the semiconductor substrate 9. The semiconductor laminate portion 11 is provided on the opposite side of the spatial light modulator 20 with respect to the semiconductor substrate 9. The electrode 33 (first electrode) is provided on the contact layer 15, and the electrode 34 (second electrode) is provided on the back surface 9b of the semiconductor substrate 9. Incidentally, detailed configuration and operation of the semiconductor light-emitting device 10F, such as shapes of the electrodes 33 and 34, are the same as those of the semiconductor light-emitting device 10C according to the fifth modification described above.

Even in the present modification, the light input/output surface 20a of the spatial light modulator 20 includes the first region 27 and the second region 28. The first region 27 and the second region 28 are arranged, for example, along the Y-axis direction. The semiconductor light-emitting device 10F is arranged on the first region 27 through the support substrate 40, and the first region 27 faces the light output surface 10a. The second region 28 is a space where nothing is provided. The light L1 outputted from the semiconductor light-emitting device 10F passes through the support substrate 40, and then, is inputted to the spatial light modulator 20 through the first region 27. Further, a phase of the light L1 is modulated by the spatial light modulator 20, and then, the modulated light L1 is outputted from the second region 28 to the outside of the light-emitting device 1H through the support substrate 40.

The semiconductor light-emitting device may be a back surface output type as in the present modification. Even with such a configuration, the same effects as those of the second embodiment described above can be suitably obtained. However, a loss of the light L1 sometimes increases due to light absorption in the semiconductor substrate 9 depending on a combination of a wavelength of the light L1 and a constituent material of the semiconductor substrate 9. In such a case, a front surface output type semiconductor light-emitting device may be applied as in the second embodiment.

Ninth Modification

FIG. 29 is a schematic view illustrating a cross-sectional configuration of a light-emitting device 1J according to a ninth modification of the second embodiment. In the light-emitting device 1H according to the present modification, the light input/output surface 20a of the spatial light modulator 20 includes a plurality of the second regions 28 corresponding to the single first region 27. The plurality of second regions 28 are provided at arbitrary positions adjacent to the periphery of the first region 27. In one example, a pair of the second regions 28 are provided on both sides of the first region 27 as illustrated in FIG. 29. Alternatively, the plurality of second regions 28 may be provided to be adjacent to a plurality of sides of the first region 27, and another one or other plurality of second regions 28 may be provided to be adjacent to the first region 27 in a diagonal direction. The semiconductor light-emitting device 10E is arranged on the first region 27 through the support substrate 40, and the first region 27 faces the light output surface 10a. Incidentally, the plurality of second regions 28 are spaces on which nothing is provided.

The light input/output surface 20a of the spatial light modulator 20 may include the plurality of second regions 28 provided in the periphery of the first region 27 as in the present modification. As a result, the light L1 is outputted from the semiconductor light-emitting device 10E in a plurality of directions, and various optical images can be formed. At this time, for example, for an output beam to the first quadrant, a beam is also outputted to the third quadrant opposite to the first quadrant, but it is possible to effectively use the beams outputted to the above-described opposite quadrants by arranging the second region 28 to face the first region 27 (it is possible to suppress a loss of the output beam) as illustrated in FIGS. 8, 9A-9B, 10-26, 27A-27B, and 28-29. Incidentally, the plurality of semiconductor light-emitting devices 10E may be provided even in the present modification as in the seventh modification. In addition, the back surface output type semiconductor light-emitting device 10F may be provided, instead of the front surface output type semiconductor light-emitting device 10E, as in the eighth modification.

Tenth Modification

Figure 30A:
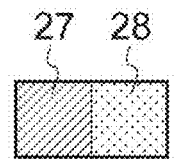
FIGS. 30A to 30D are views illustrating an arrangement example of a first region and a second region on a light input/output surface (Part 1 thereof).
Figure 30B:
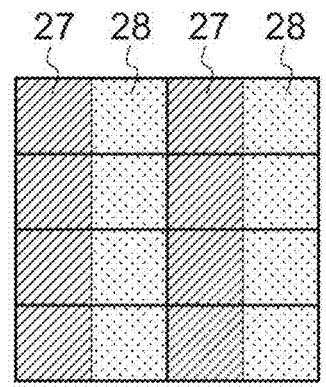
Figure 30C:
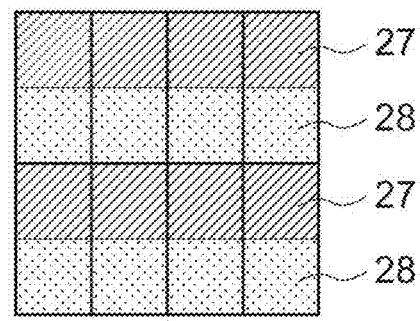
Figure 30D:
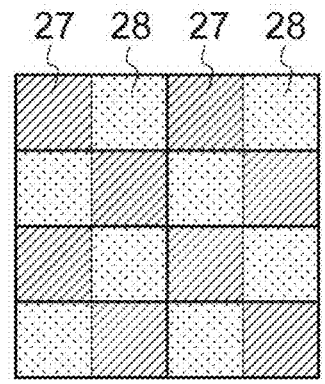

An arrangement example of the first region 27 and the second region 28 when the plurality of semiconductor light-emitting devices 10E (or 10F) are provided on the light input/output surface 20a will be described in detail. FIG. 30A to FIG. 33C are views illustrating the arrangement example of the first region 27 and the second region 28 on the light input/output surface 20a. FIG. 30A is the view illustrating a basic arrangement when the first region 27 and the second region 28 have a one-to-one correspondence (see the second embodiment). In this case, an aperture ratio of the light input/output surface 20a is 50%. Any one of 1st-order light and −1st-order light is outputted from the second region 28. FIG. 30B and FIG. 30C illustrate an example in which a row of the first regions 27 and a row of the second regions 28 arranged in a certain direction are alternately arranged in a direction orthogonal to the direction. In addition, FIG. 30D illustrates an example in which the first region 27 and the second region 28 are arranged in a diagonal direction like a checkered pattern.

Figure 31A:
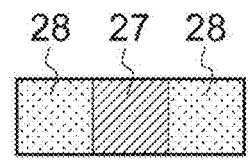
FIGS. 31A to 31D are views illustrating the arrangement example of the first region and the second region on the light input/output surface (Part 2 thereof).
Figure 31B:
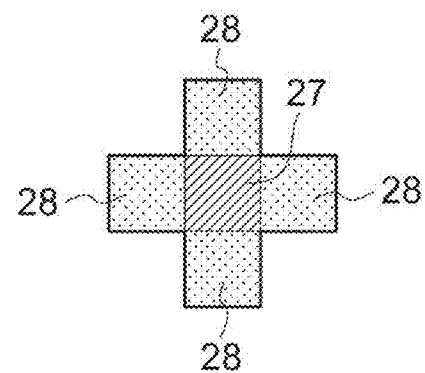
Figure 31C:
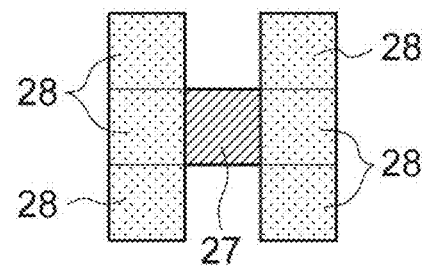
Figure 31D:
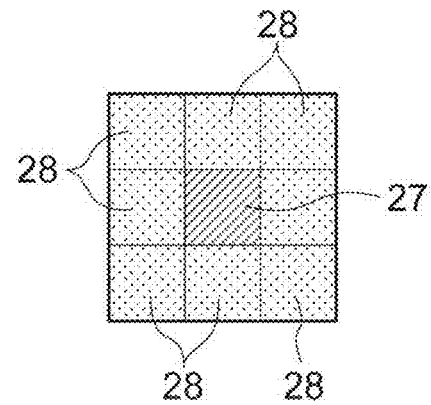

In addition, FIGS. 31A to 31D are the views illustrating basic arrangements in the case where the plurality of second regions 28 correspond to the single first region 27. In FIG. 31A, two second regions 28 are arranged so as to sandwich the single first region 27 (see FIG. 29). In this case, an aperture ratio of the light input/output surface 20a is 66%. In FIG. 31B, four second regions 28 are arranged to be adjacent to four sides of the single first region 27, respectively. In this case, an aperture ratio of the light input/output surface 20a is 75%. In FIG. 31C, four second regions 28 are arranged in a diagonal direction of the first region 27 in addition to the arrangement of FIG. 31A. In this case, six second regions 28 correspond to the single first region 27, and thus, an aperture ratio of the light input/output surface 20a is 86%. In FIG. 31D, four second regions 28 are arranged in a diagonal direction of the first region 27 in addition to the arrangement of FIG. 31B. In this case, eight second regions 28 correspond to the single first region 27, and thus, an aperture ratio of the light input/output surface 20a is 89%.

Incidentally, 1st-order light is outputted from some of the second regions 28 and −1st-order light is outputted from the remaining second regions 28 in the above arrangements. Specifically, in the arrangement of FIG. 31A, the −1st-order light is outputted from the second region 28 on the left side of the first region 27, and the 1st-order light is outputted from the second region 28 on the right side of the first region 27. In the arrangement of FIG. 31B, for example, the −1st-order light is outputted from the second regions 28 on the left side and the lower side of the first region 27, and the 1st-order light is outputted from the second regions 28 on the right side and the upper side of the first region 27. In the arrangement of FIG. 31C, for example, the −1st-order light is outputted from the three second regions 28 on the left side, the upper left side, and the lower left side of the first region 27, and the 1st-order light is outputted from the three second regions 28 on the right side, the upper right side, and the lower right side of the first region 27. In the arrangement of FIG. 31D, for example, the −1st-order light is outputted from the four second regions 28 on the left side, the upper left side, the lower left side, and the lower side of the first region 27, and the 1st-order light is outputted from the four second regions 28 on the right side, the upper right side, the lower right side, and the upper side of the first region 27. In this manner, the second region 28 that outputs the −1st-order light and the second region 28 that outputs the 1st-order light are preferably arranged so as to be symmetric with respect to the first region 27.

Figure 32A:
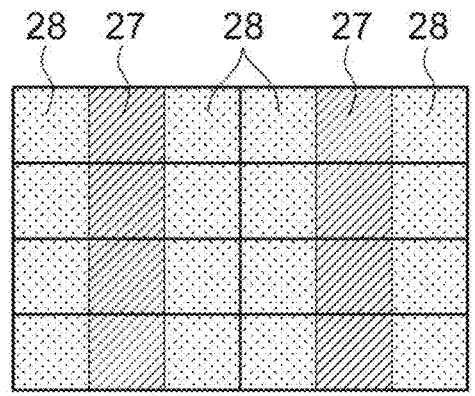
FIGS. 32A to 32C are views illustrating the arrangement example of the first region and the second region on the light input/output surface (Part 3 thereof).
Figure 32B:
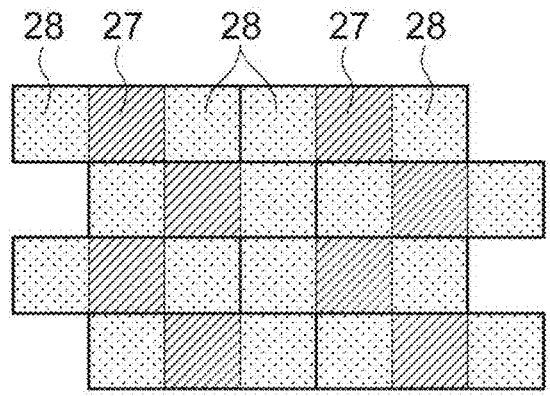
Figure 32C:
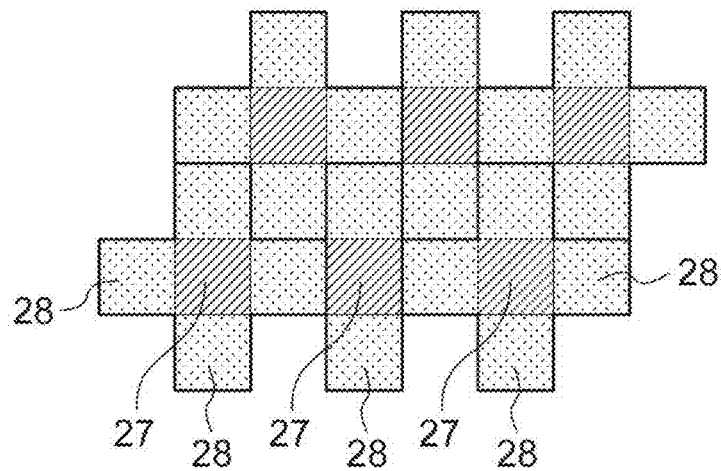
Figure 33A:
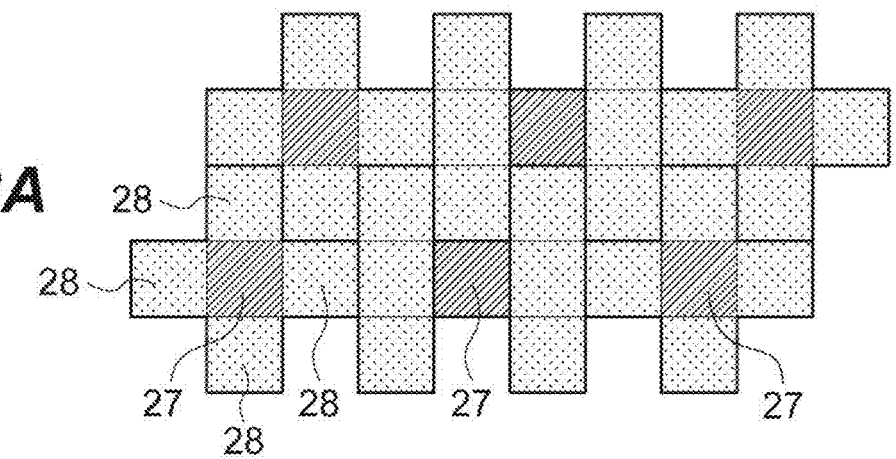
FIGS. 33A to 33C are views illustrating the arrangement example of the first region and the second region on the light input/output surface (Part 4 thereof).
Figure 33B:
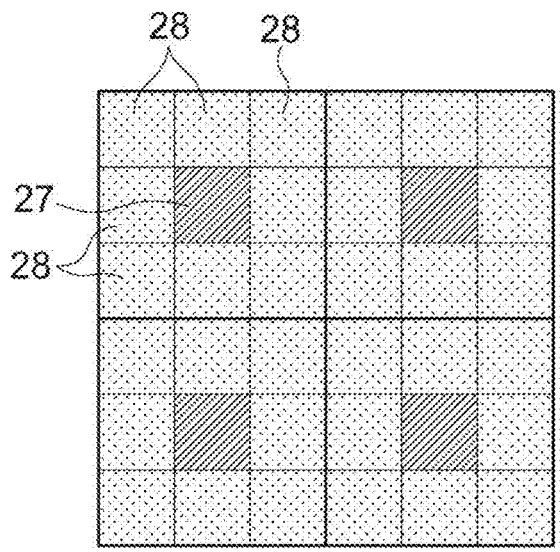
Figure 33C:
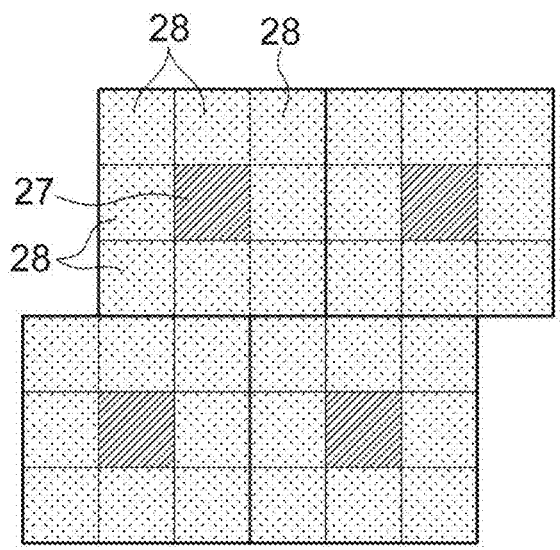

FIGS. 32A and 32B are views illustrating a state in which a plurality of the basic arrangements of FIG. 31A are aligned in the same direction. In FIG. 32A, positions of the first regions 27 are aligned between adjacent basic arrangements. In FIG. 32B, positions of the first regions 27 are alternately shifted between adjacent basic arrangements. FIG. 32C is a view illustrating a state in which a plurality of the basic arrangements of FIG. 31B are arranged without a gap. FIG. 33A is a view illustrating a state where the basic arrangements of FIGS. 31B and 31C are alternately arranged without a gap. FIGS. 33B and 33C are views illustrating a state in which a plurality of the basic arrangements of FIG. 31D are arranged without a gap. In FIG. 33B, positions of the first regions 27 are aligned between adjacent basic arrangements. In FIG. 33C, positions of the first regions 27 are alternately shifted between adjacent basic arrangements. The light input/output surface 20a of the spatial light modulator 20 may include, for example, the above-described arrangement illustrated in FIGS. 30B to 30D, FIGS. 32A to 32C, or FIGS. 33A to 33C.

Figure 34B:
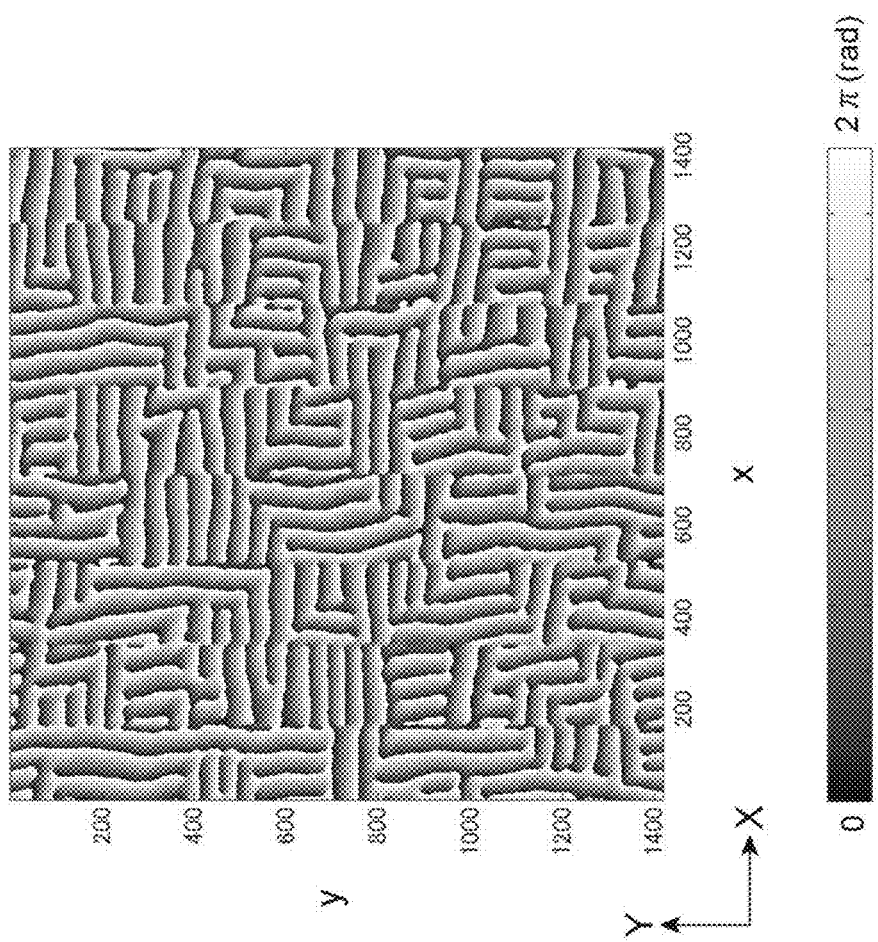
FIGS. 34A and 34B are views illustrating an example of an amplitude distribution of a phase modulation layer and an example of a phase distribution of the phase modulation layer.
Figure 34A:
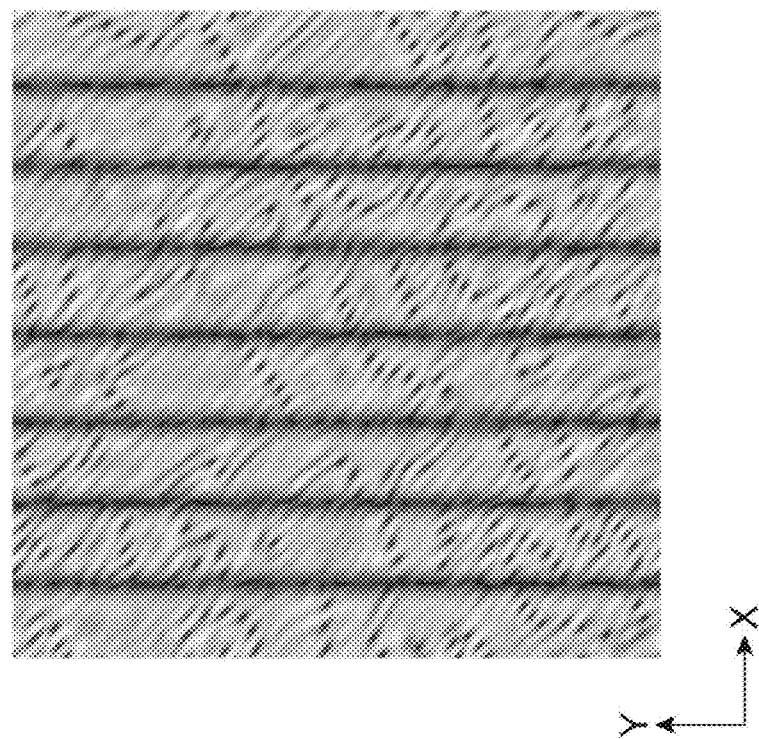
Figure 35:
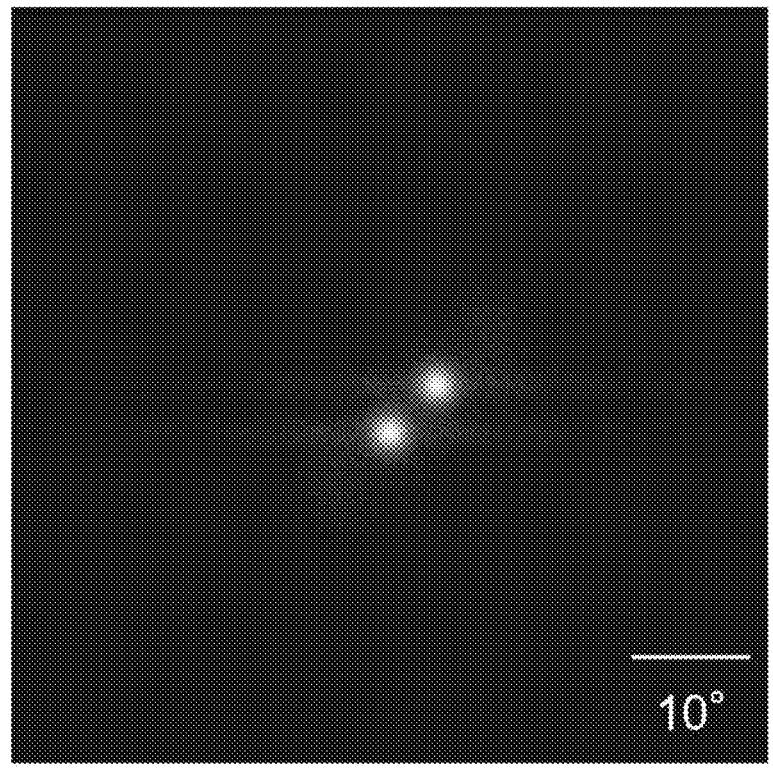
FIG. 35 illustrates a far-field image realized by the phase modulation layer having the amplitude distribution of FIG. 34A and the phase distribution of FIG. 34B.
Figure 36B:
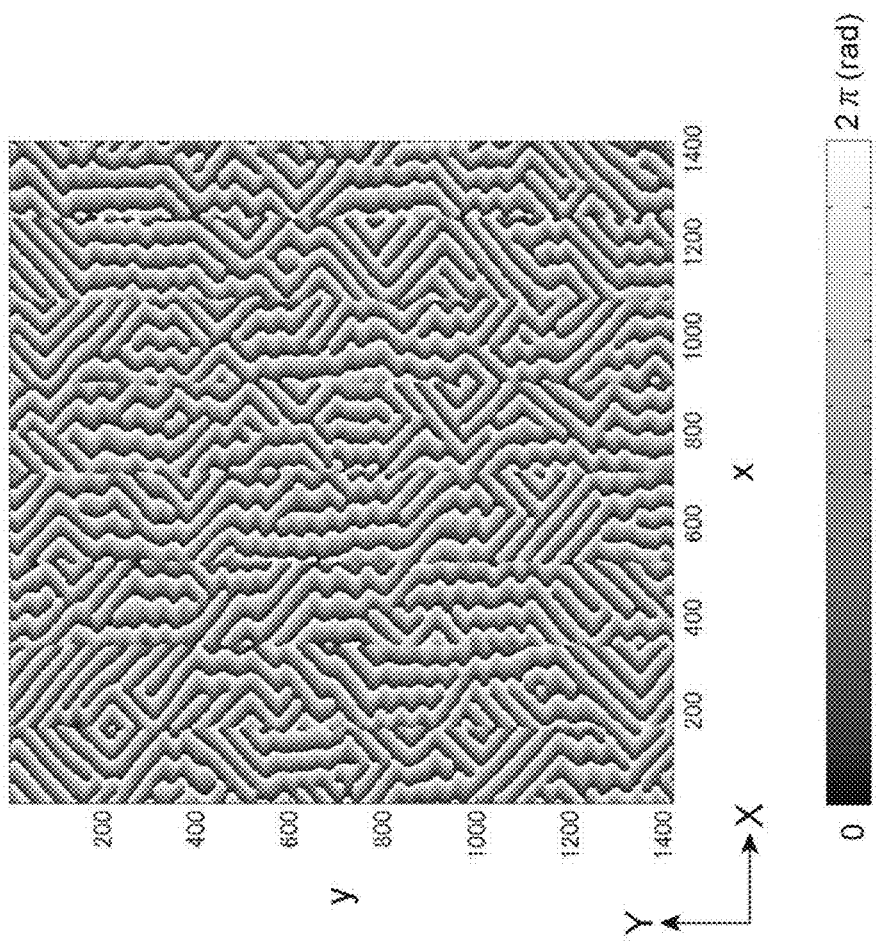
FIGS. 36A and 36B are views illustrating an example of an amplitude distribution of a phase modulation layer and an example of a phase distribution of the phase modulation layer.
Figure 36A:
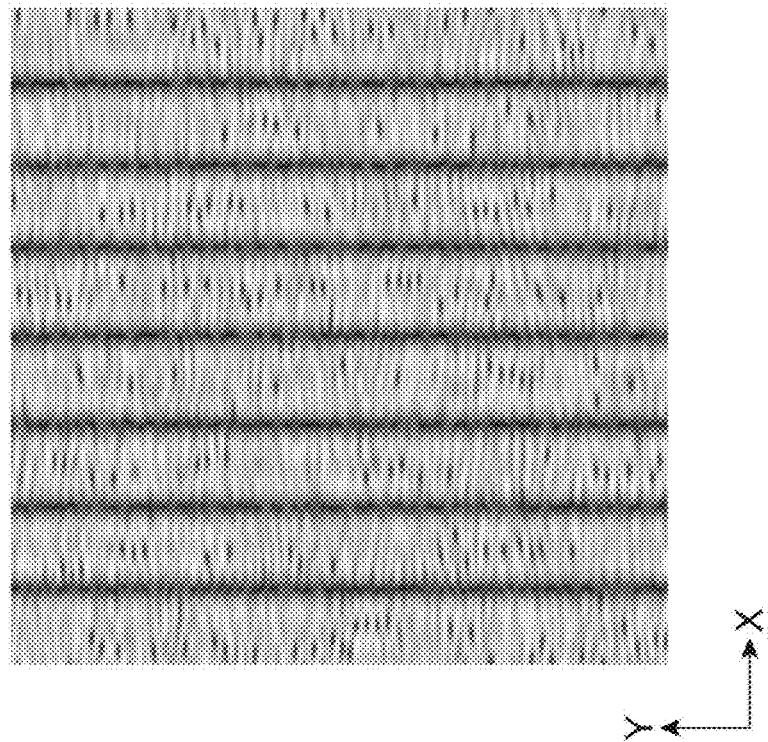
Figure 37:
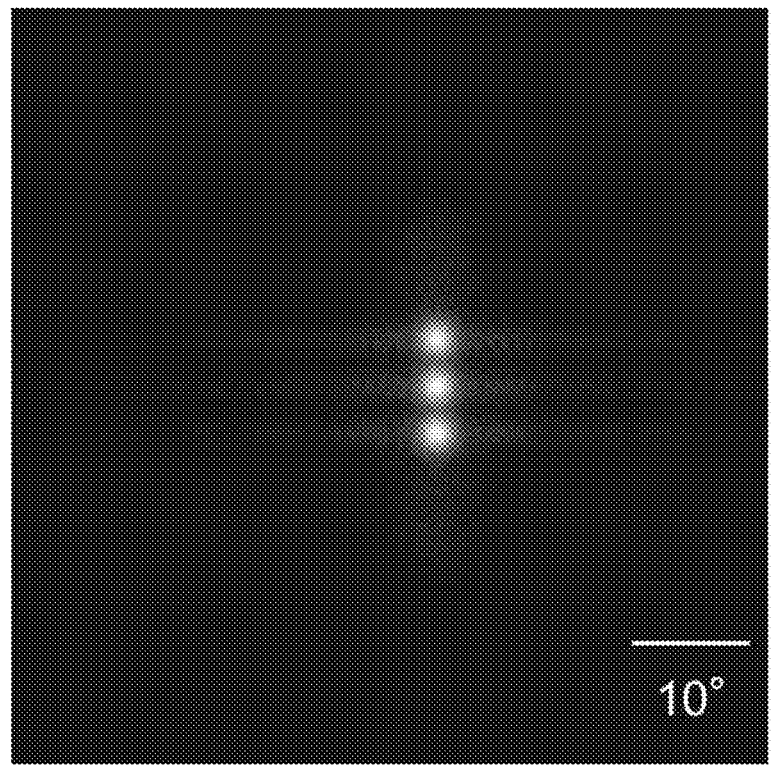
FIG. 37 illustrates a far-field image realized by the phase modulation layer having the amplitude distribution of FIG. 36A and the phase distribution of FIG. 36B.
Figure 38B:
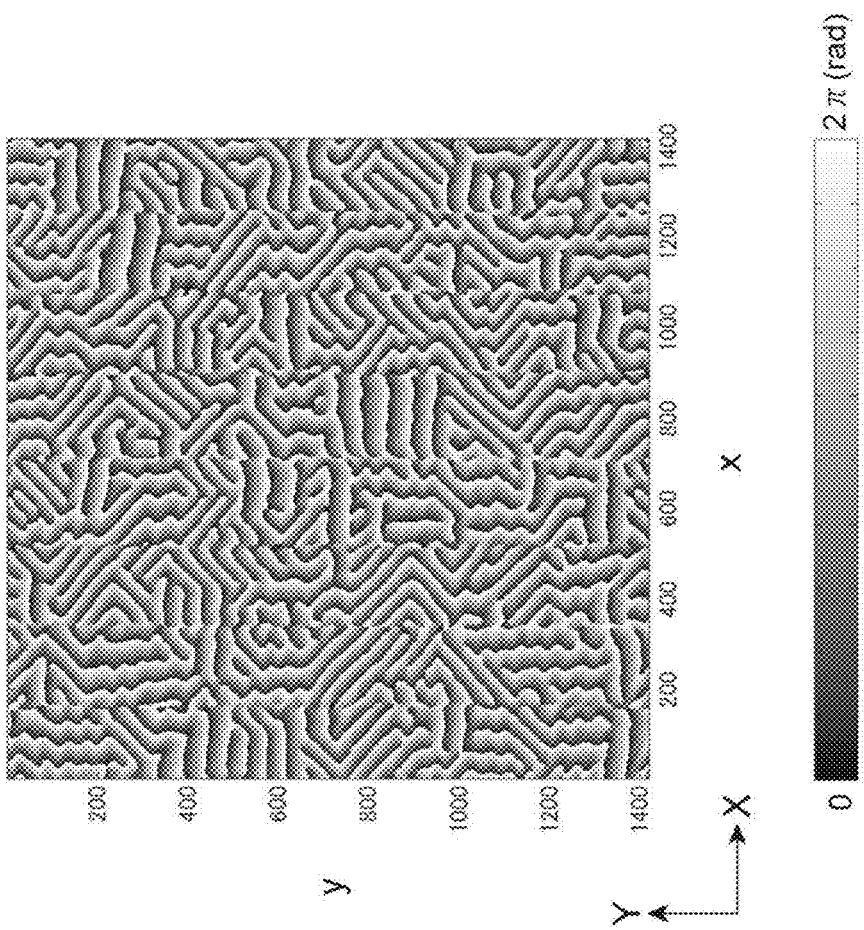
FIGS. 38A and 38B are views illustrating an example of an amplitude distribution of a phase modulation layer and an example of a phase distribution of the phase modulation layer.
Figure 38A:
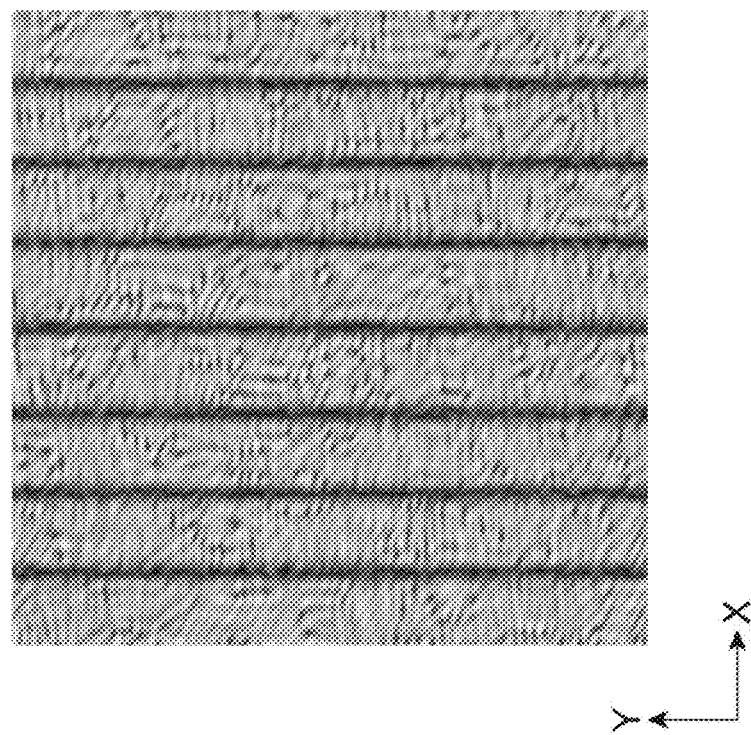
Figure 39:
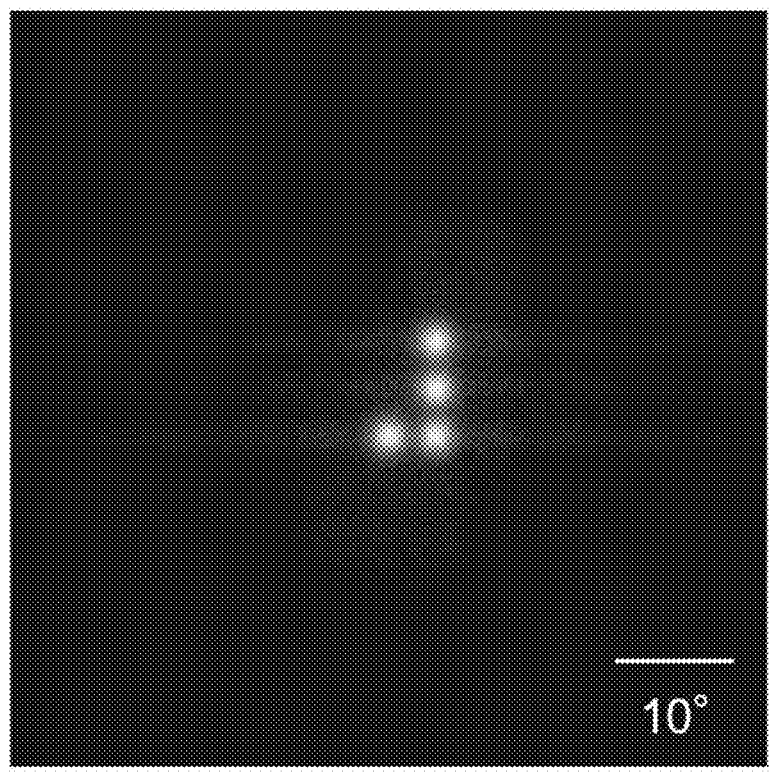
FIG. 39 illustrates a far-field image realized by the phase modulation layer having the amplitude distribution of FIG. 38A and the phase distribution of FIG. 38B.

Here, the amplitude distribution and phase distribution of the phase modulation layer 16A when the plurality of second regions 28 correspond to the single first region 27 will be described. FIGS. 34A, 36A, and 38A are views illustrating examples of the amplitude distribution of the phase modulation layer 16A, that is, the distribution of the line segment length r(x, y). In these drawings, the line segment length r(x, y) is illustrated by brightness and darkness, and a larger value is illustrated to be brighter. In addition, FIGS. 34B, 36B, and 38B are views illustrating examples of the phase distribution of the phase modulation layer 16A, that is, the distribution of the rotation angle φ(x, y). In these drawings, the angle φ(x, y) is illustrated by brightness and darkness, and a larger value is illustrated to be brighter. FIG. 35 illustrates a far-field image realized by the phase modulation layer 16A having the amplitude distribution of FIG. 34A and the phase distribution of FIG. 34B. In this example, light L1 including two spots is outputted from the semiconductor light-emitting device 10E (or 10F) as illustrated in FIG. 35. FIG. 37 illustrates a far-field image realized by the phase modulation layer 16A having the amplitude distribution of FIG. 36A and the phase distribution of FIG. 36B. In this example, light L1 including three spots is outputted from the semiconductor light-emitting device 10E (or 10F) as illustrated in FIG. 37. FIG. 39 illustrates a far-field image realized by the phase modulation layer 16A having the amplitude distribution of FIG. 38A and the phase distribution of FIG. 38B. In this example, light L1 including four spots is outputted from the semiconductor light-emitting device 10E (or 10F) as illustrated in FIG. 39.

Incidentally, the arrangement of the first region 27 and the second region 28 in the case where the plurality of semiconductor light-emitting devices 10E (or 10F) are provided on the light input/output surface 20a has been described in the present modification. However, this arrangement can be also applied to the arrangement of the first portion 8a and the second portion 8b in the case where the semiconductor light-emitting device 10B is the semiconductor light-emitting device array including the plurality of unit regions D1 as in the fourth modification (see FIGS. 13 to 17). In that case, the first region 27 may be replaced with the first portion 8a, and the second region 28 may be replaced with the second portion 8b in the above-described arrangement.

Eleventh Modification

In the above-described fourth modification (see FIGS. 13 to 17), the semiconductor light-emitting device array having the plurality of unit regions D1 each of which outputs the light L is applied as the semiconductor light-emitting device 10B. In the sixth modification (see FIGS. 21 to 23), the semiconductor light-emitting device array having the plurality of unit regions D2 each of which outputs the light L1 is used as the semiconductor light-emitting device 10D. Further, in the seventh modification (see FIGS. 25, 26, 27A, and 27B), the plurality of semiconductor light-emitting devices 10E are arranged on the plurality of unit regions D3 of the light input/output surface 20a. When there are a plurality of light-emitting regions that output the light L1 as in these modifications, a wavelength of the light L1 outputted from a light-emitting device can be arbitrarily changed by arranging a wavelength conversion medium such as a phosphor on an optical path of each light-emitting region. In particular, a multi-color light-emitting device can be achieved by arranging three types of wavelength conversion media that convert the wavelength of the light L1 into a red wavelength range, a green wavelength range, and a blue wavelength range. When a wavelength of the light L1 is included in any of the red wavelength range, the green wavelength range, and the blue wavelength range, the wavelength conversion medium can be omitted for such a wavelength range. In addition, the wavelength conversion medium may perform down-conversion for conversion to a wavelength longer than the wavelength of the light L1, and may perform up-conversion for conversion to a wavelength shorter than the wavelength of the light L1.

Figure 40:
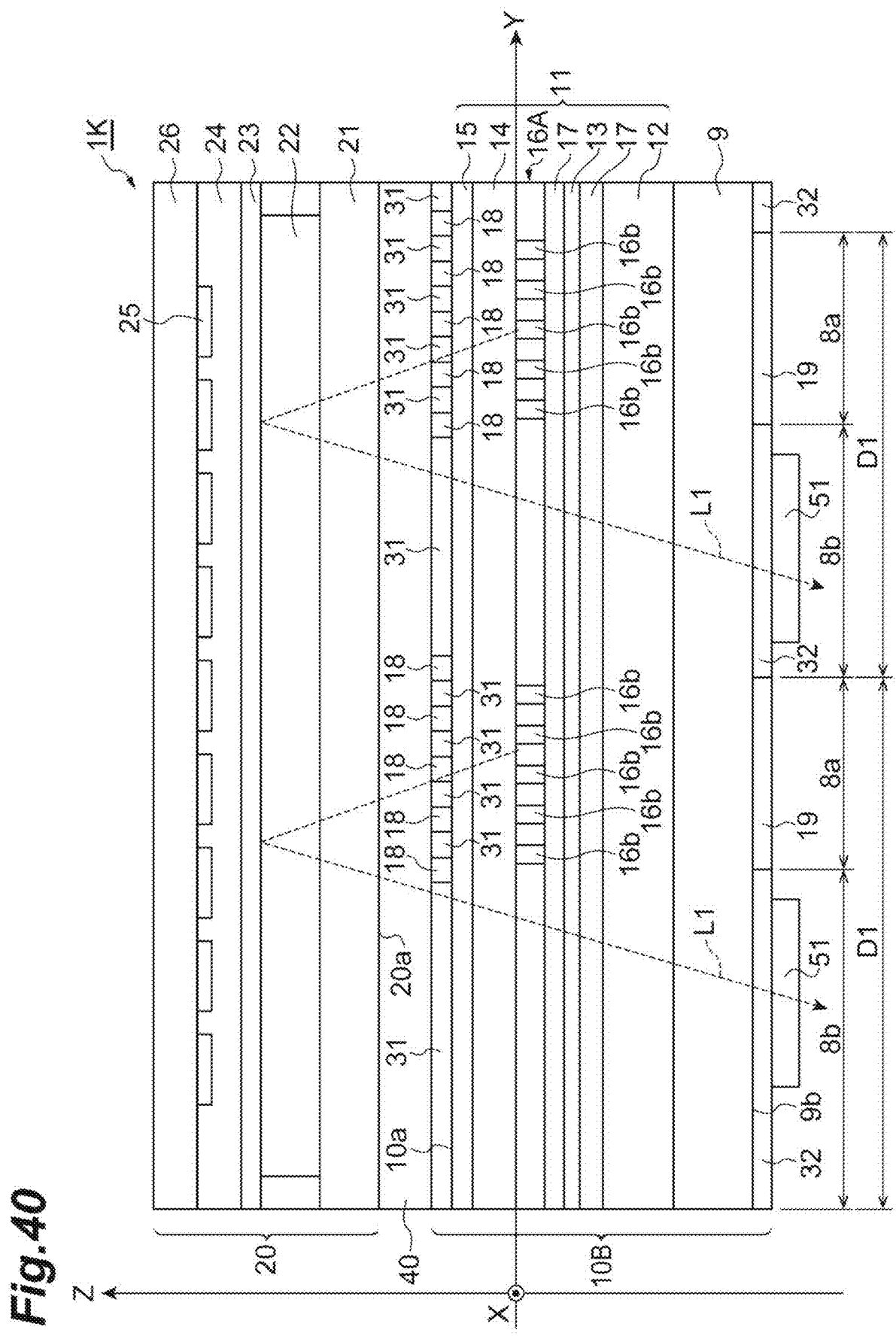
FIG. 40 is a schematic view illustrating a cross-sectional configuration of a light-emitting device according to an eleventh modification.

FIG. 40 is a schematic view illustrating a cross-sectional configuration of a light-emitting device 1K according to the present modification. The light-emitting device 1K further includes a plurality of wavelength conversion media 51 in addition to the configuration of the light-emitting device 1C illustrated in FIG. 14. Each of the wavelength conversion media 51 is provided on the anti-reflection film 32 of the second portion 8b in each of the unit regions D1. The light L1 outputted from the first portion 8a of each of the unit regions D1 is modulated by the spatial light modulator 20. Thereafter, the modulated light L1 passes through the second portions 8b of the respective unit regions D1 and the wavelength conversion medium 51 sequentially, and then, is outputted to the outside of the light-emitting device 1K.

Figure 41:
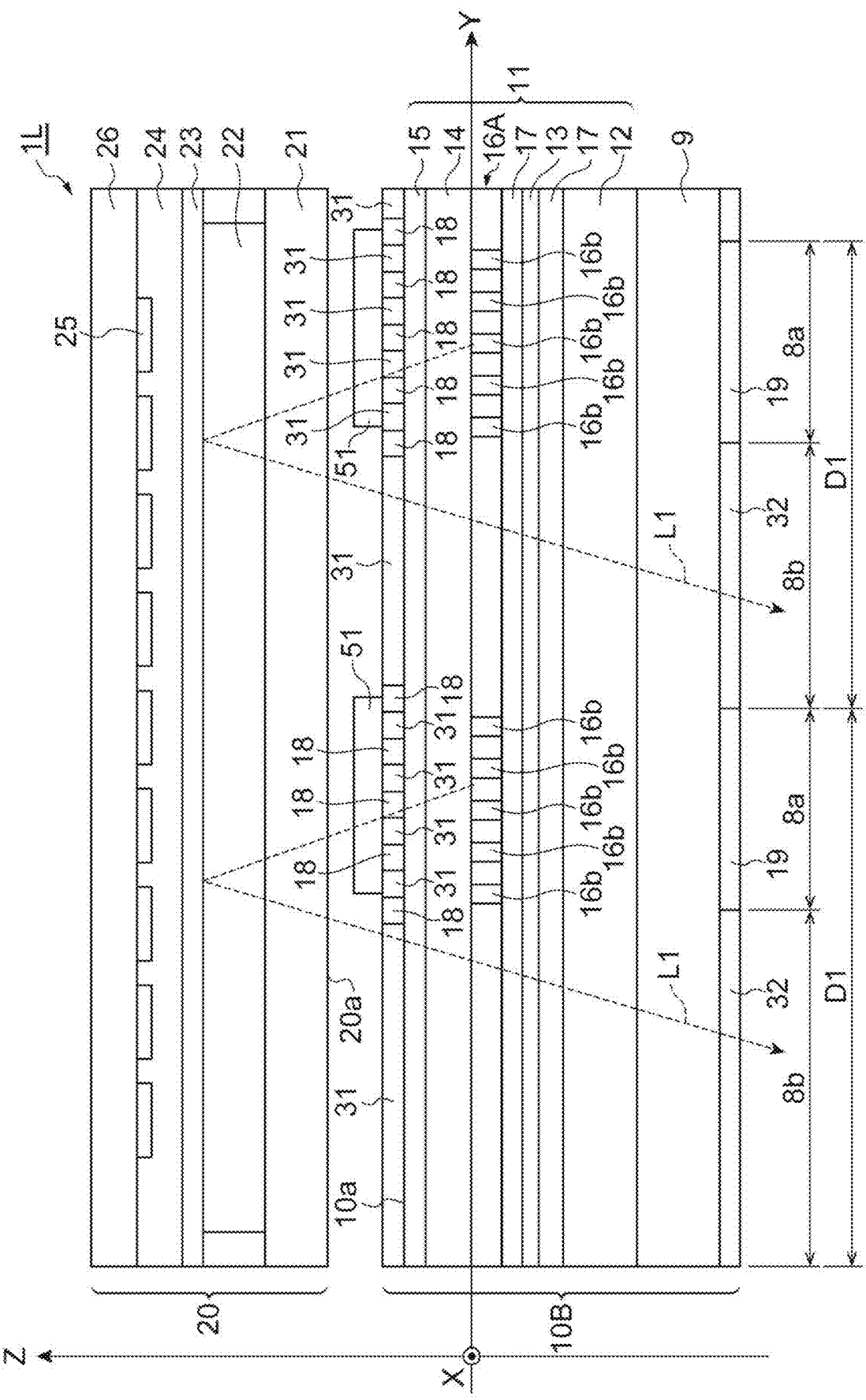
FIG. 41 is a schematic view illustrating a cross-sectional configuration of another light-emitting device according to the eleventh modification.

FIG. 41 is a schematic view illustrating a cross-sectional configuration of another light-emitting device 1L according to the present modification. This light-emitting device 1L has a structure in which the wavelength conversion medium 51 is provided between the first portion 8a of each of the unit regions D1 and the spatial light modulator 20, the structure obtained by removing the support substrate 40 from the configuration of the light-emitting device 1C illustrated in FIG. 14. For example, the wavelength conversion medium 51 is provided on the light output surface 10a so as to cover the opening 18a of the electrode 18. The light L1 outputted from the first portion 8a of each of the unit regions D1 is inputted to the spatial light modulator 20 through the wavelength conversion medium 51, and is modulated by the spatial light modulator 20. Further, the modulated light L1 passes through the second portion 8b of each of the unit regions D1 and is outputted to the outside of the light-emitting device 1L.

In the light-emitting devices 1K and 1L described above, the semiconductor light-emitting device 10B may be replaced with the semiconductor light-emitting device 10D according to the sixth modification. In that case, the wavelength conversion medium 51 is provided on the anti-reflection film 32 of the second portion 8b in each of the unit regions D2 in the light-emitting device 1K. In addition, the wavelength conversion medium 51 is provided between the first portion 8a of each of the unit regions D2 and the spatial light modulator 20 in the light-emitting device 1L. For example, the wavelength conversion medium 51 is provided on the back surface 9b so as to cover the opening 34a of the electrode 34.

Figure 42:
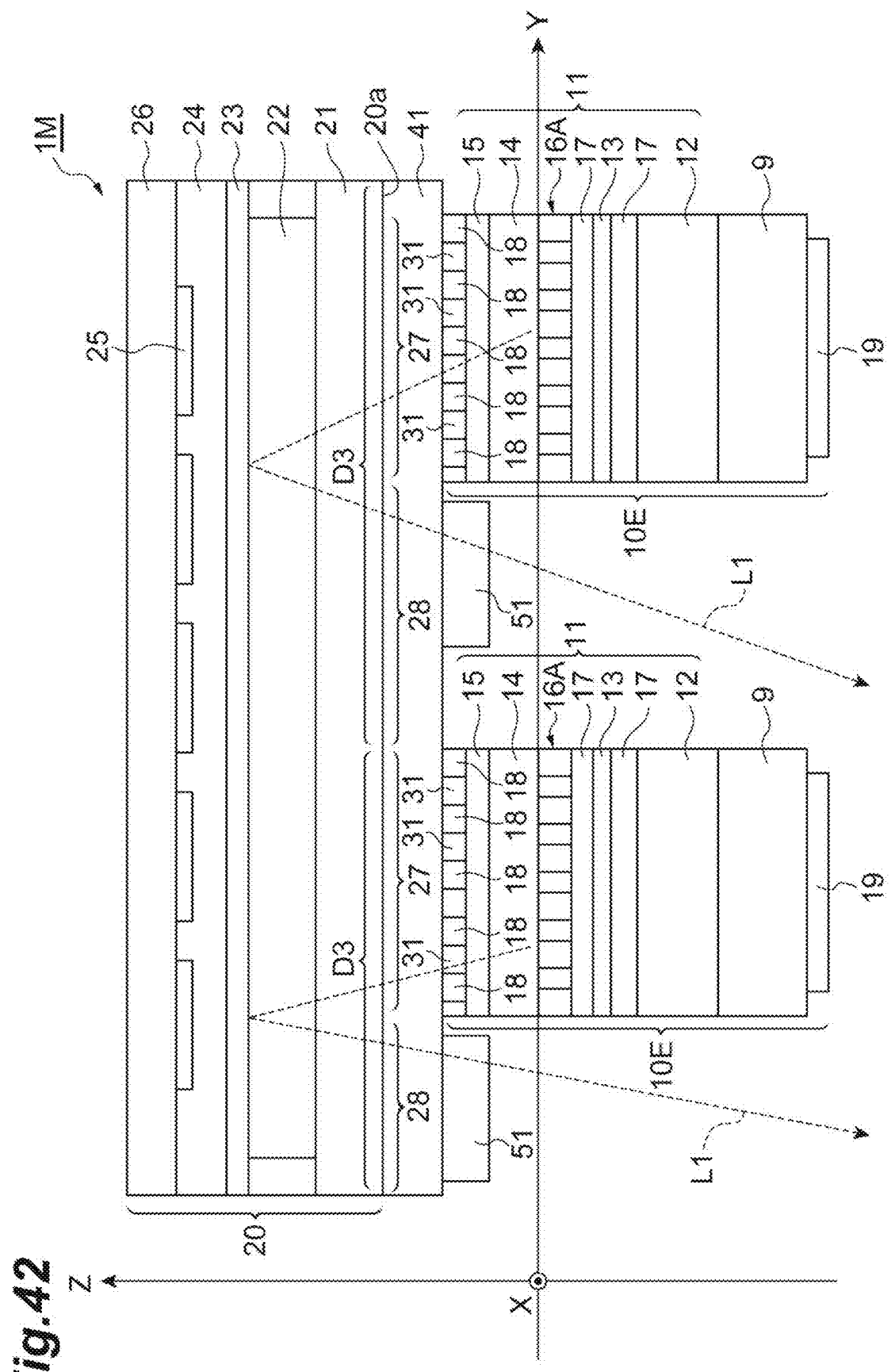
FIG. 42 is a perspective view illustrating a cross-sectional configuration of still another light-emitting device according to the eleventh modification.

FIG. 42 is a perspective view illustrating a cross-sectional configuration of still another light-emitting device 1M according to the present modification. The light-emitting device 1M further includes the plurality of wavelength conversion media 51 in addition to the configuration of the light-emitting device 1G according to the seventh modification. Each of the wavelength conversion media 51 is provided on the second region 28 of the light input/output surface 20a in each of the unit regions D3. For example, each of the wavelength conversion media 51 is provided on the surface of the support substrate 41 opposite to the spatial light modulator 20. The light L1 outputted from each of the semiconductor light-emitting devices 10E is inputted to the spatial light modulator 20. Thereafter, the modulated light L1 passes through the support substrate 41 and the wavelength conversion medium 51 and is outputted to the outside of the light-emitting device 1M.

Figure 43:
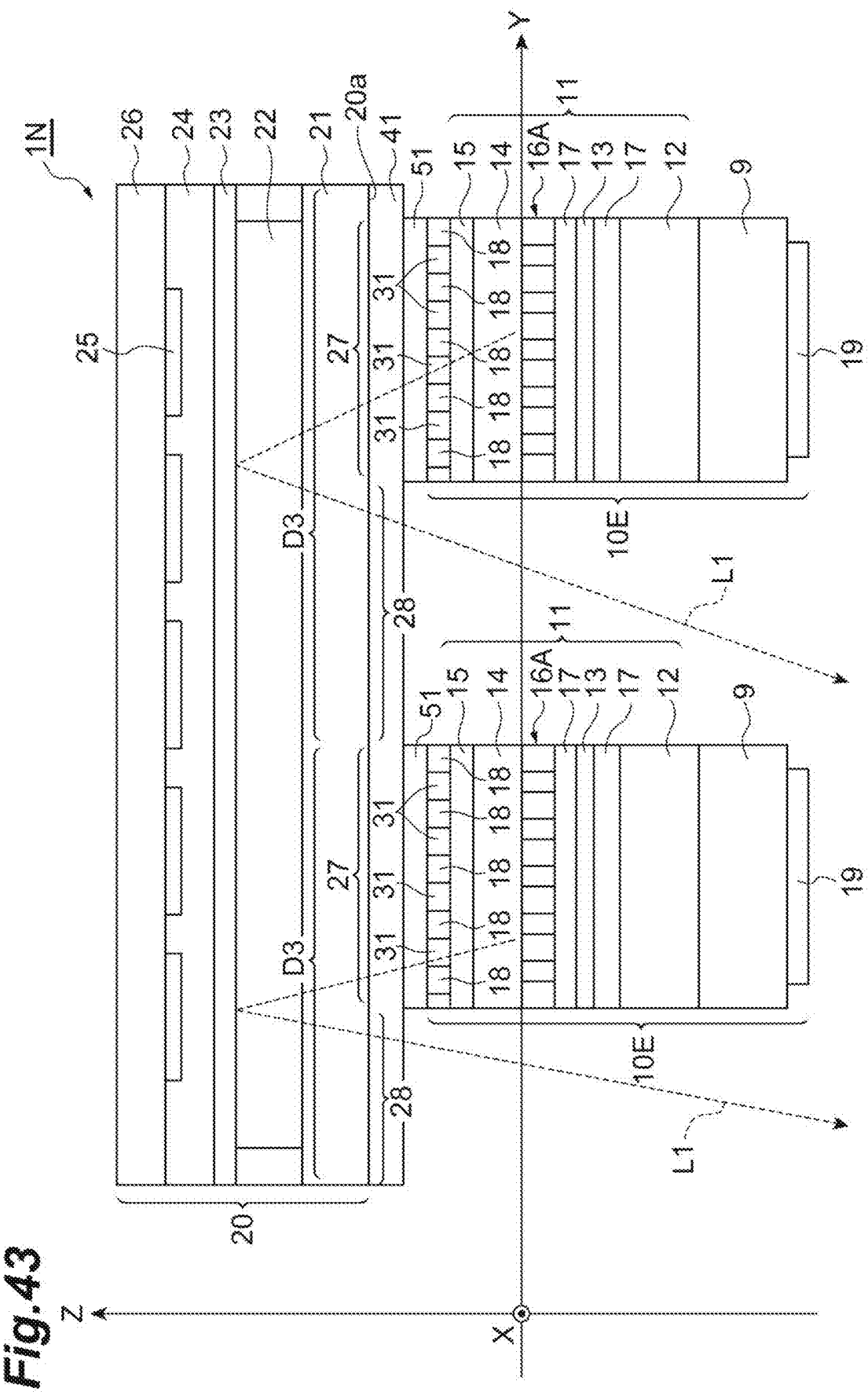
FIG. 43 is a perspective view illustrating a cross-sectional configuration of yet still another light-emitting device according to the eleventh modification.

FIG. 43 is a perspective view illustrating a cross-sectional configuration of yet still another light-emitting device 1N according to the present modification. The light-emitting device 1N further includes the plurality of wavelength conversion media 51 in addition to the configuration of the light-emitting device 1G of the seventh modification. Each of the wavelength conversion media 51 is provided between each of the semiconductor light-emitting devices 10E and the spatial light modulator 20. For example, each of the wavelength conversion media 51 is sandwiched between each of the semiconductor light-emitting devices 10E and the support substrate 41. The light L1 outputted from each of the semiconductor light-emitting devices 10E passes through the wavelength conversion medium 51 and the support substrate 41, and then, is inputted to the first region 27 of the spatial light modulator 20. Further, the light L1 modulated by the spatial light modulator 20 passes through the support substrate 41 from the second region 28, and then, is outputted to the outside of the light-emitting device 1N.

In the light-emitting devices 1M and 1N described above, the semiconductor light-emitting device 10E may be replaced with the semiconductor light-emitting device 10F according to the eighth modification. In that case, the wavelength conversion medium 51 is provided between each of the semiconductor light-emitting devices 10F and the spatial light modulator 20 in the light-emitting device 1N. For example, the wavelength conversion medium 51 is provided on the back surface 9b so as to cover the opening 34a of the electrode 34.

FIGS. 44A to 44C are views illustrating examples of an arrangement of conversion regions of red (R), green (G), and blue (B) in each of the wavelength conversion media 51. In these examples, unit regions respectively including red, green and blue conversion regions are arranged in a certain direction, and the red, green, and blue conversion regions are arranged in the respective unit regions in a direction intersecting the direction. In the examples illustrated in FIGS.

44A and 44B, the red, green, and blue conversion regions are arranged in the same direction in the respective unit regions. In addition, an arrangement order of conversion regions is different between adjacent unit regions in the example illustrated in FIG. 44C. For example, by arranging the red, green, and blue conversion regions to be adjacent to each other as in the above examples, a fine multi-color optical image can be obtained. These conversion regions may be provided so as to correspond (one by one) to each of the plurality of pixel electrodes 25 of the spatial light modulator 20, for example.

Twelfth Modification

Figure 45A:
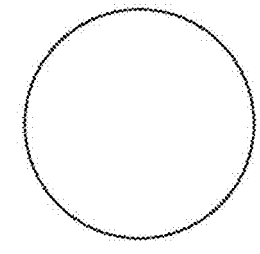
FIGS. 45A to 45G are views illustrating examples of a mirror-image symmetric shape among planar shapes of modified refractive index regions on an X-Y plane.
Figure 45B:
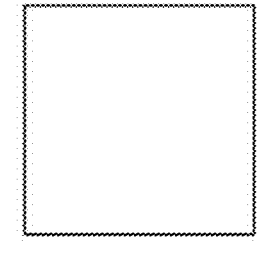
Figure 45C:
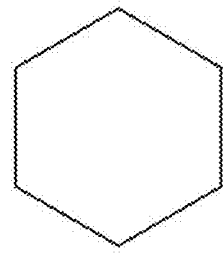
Figure 45D:
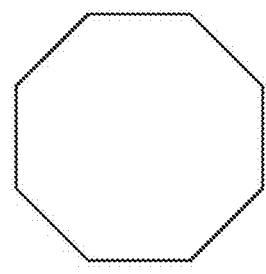
Figure 45E:
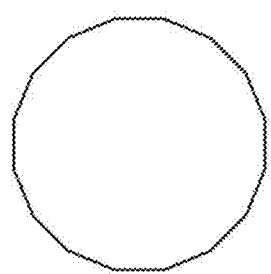
Figure 45F:
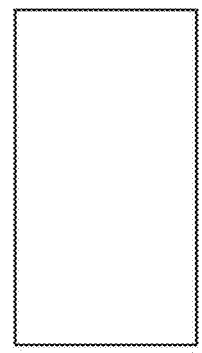
Figure 45G:
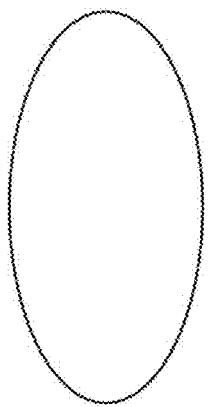

Although FIG. 4 of the above-described embodiment illustrates the example in which the shape of the modified refractive index region 16b on the X-Y plane (the design surface of the phase modulation layer 16A) is the circular shape, the modified refractive index region 16b may have a shape other than the circular shape. For example, the shape of the modified refractive index region 16b on the X-Y plane may have a mirror-image symmetry (line symmetry). Here, the mirror-image symmetry (line symmetry) represents that a planar shape of the modified refractive index region 16b positioned on one side of a straight line and a planar shape of the modified refractive index region 16b positioned on the other side of the straight line can be mirror-image symmetric (line symmetric) with each other with an arbitrary straight line along X-Y plane interposed therebetween. Examples of a planar shape having mirror-image symmetry (line symmetry) includes a perfect circle illustrated in FIG. 45A, a square illustrated in FIG. 45B, a regular hexagon illustrated in FIG. 45C, a regular octagon illustrated in FIG. 45D, a regular hexadecagon illustrated in FIG. 45E, a rectangle illustrated in FIG. 45F, an ellipse illustrated in FIG. 45G, and the like. Since the planar shape of the modified refractive index region 16b on the X-Y plane has the mirror-image symmetry (line symmetry) in this manner, an angle φ, formed between the X-axis and a vector from a lattice point of a virtual square lattice toward a gravity center of the corresponding modified refractive index region 16b can be determined with high accuracy in the phase modulation layer 16A (high-precision patterning is possible).

Figure 46A:
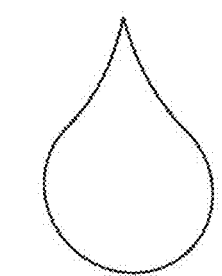
FIGS. 46A to 46K are views illustrating examples of shapes that do not have 180° rotational symmetry among the planar shapes of the modified refractive index regions on the X-Y plane.
Figure 46B:
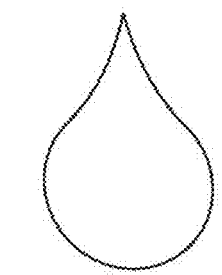
Figure 46C:
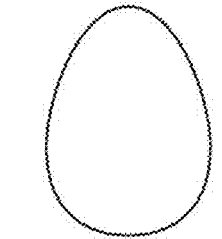
Figure 46D:
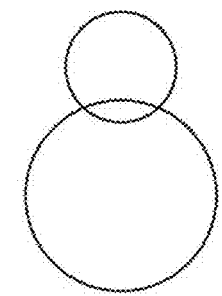
Figure 46E:
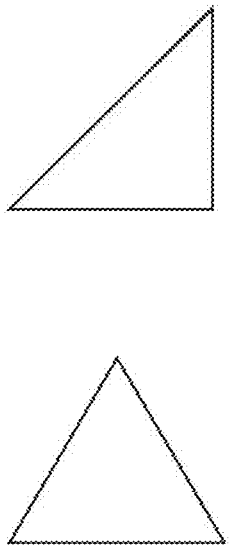
Figure 46F:
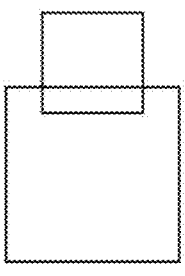
Figure 46G:
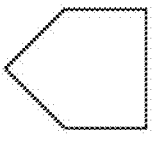
Figure 46H:
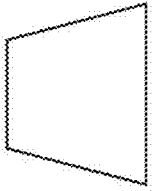
Figure 46I:
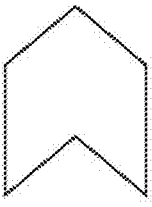
Figure 46J:
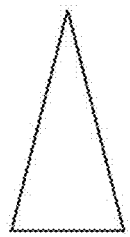
Figure 46K:
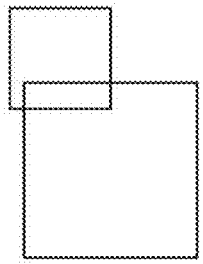

In addition, the planar shape of the modified refractive index region 16b on the X-Y plane may have a shape that does not have a 180-degree rotational symmetry. Examples of such a shape include an equilateral triangle illustrated in FIG. 46A, a right-angled isosceles triangle illustrated in FIG. 46B, a shape in which two circles or ellipses partially overlap with each other illustrated in FIG. 46C, an egg shape illustrated in FIG. 46D, a teardrop shape illustrated in FIG. 46E, an isosceles triangle illustrated in FIG. 46F, an arrow shape illustrated in FIG. 46G, a trapezoid illustrated in FIG. 46H, a pentagon illustrated in FIG. 46I, a shape in which two rectangles partially overlap with each other illustrated in FIG. 46J, a shape in which two rectangles partially overlap with each other without mirror-image symmetry illustrated in FIG. 46K, and the like. Incidentally, the egg shape is a shape deformed such that a dimension of an ellipse in a short-axis direction in the vicinity of one end portion along a long axis is smaller than a dimension in the short-axis direction in the vicinity of the other end portion. The teardrop shape is a shape obtained by deforming one end portion along the long axis of the ellipse into a sharp end portion protruding along a long-axis direction. The arrow shape is a shape in which one side of a rectangle is recessed in a triangle shape and a side opposing the one side is made sharp into a triangle shape. Since the planar shape of the modified refractive index region 16b on the X-Y plane does not have the 180-degree rotational symmetry in this manner, it is possible to obtain a higher light output.

Thirteenth Modification

Figure 47:
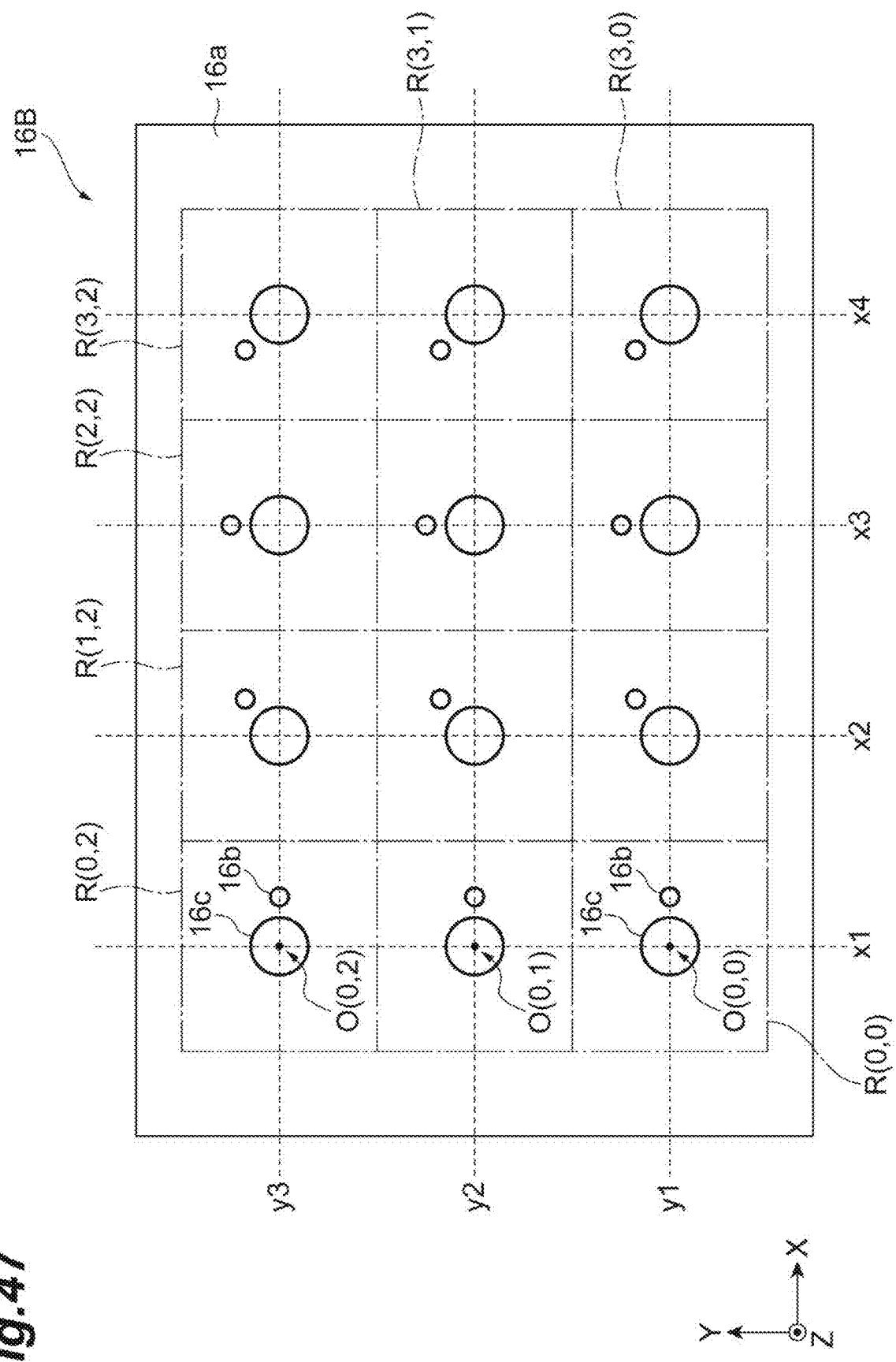
FIG. 47 is a plan view of a phase modulation layer according to a thirteenth modification.
Figure 48:
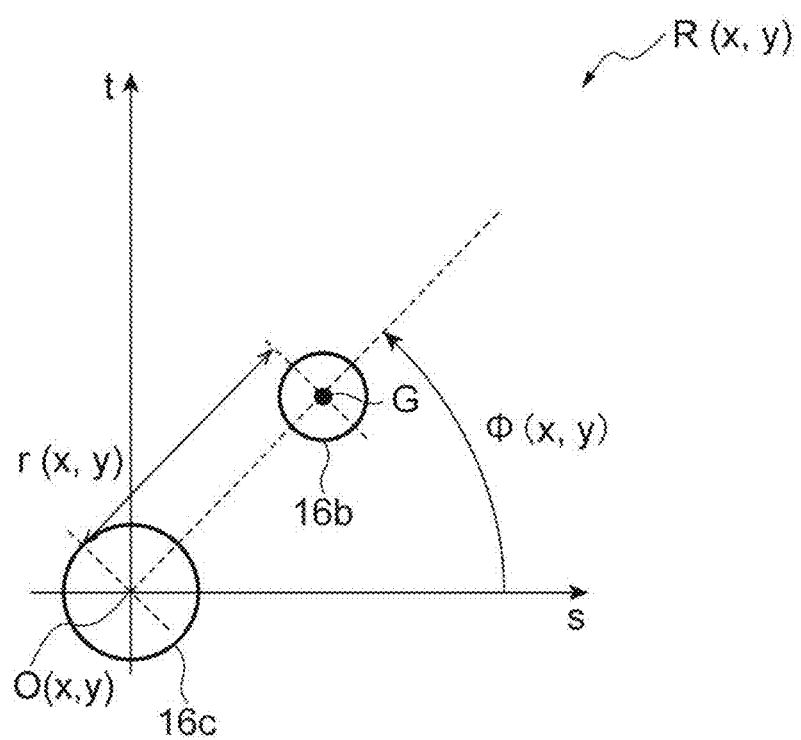
FIG. 48 is a graph illustrating a positional relationship of modified refractive index regions in the phase modulation layer according to the thirteenth modification.

FIG. 47 is a plan view of a phase modulation layer 16B according to a thirteenth modification of each of the above-described embodiments. The phase modulation layer 16A of the above-described embodiments may be replaced with the phase modulation layer 16B of the present modification. The phase modulation layer 16B of the present modification further includes a plurality of modified refractive index regions 16c, different from the plurality of modified refractive index regions 16b, in addition to the configuration of the phase modulation layer 16A of each of the above-described embodiment. Each of the modified refractive index regions 16c includes a periodic structure and is made of a second refractive index medium having a refractive index different from that of the first refractive index medium of the base layer 16a. Similarly to the modified refractive index region 16b, the modified refractive index region 16c may be a hole, or may have a structure in which a compound semiconductor is embedded in the hole. Here, an angle formed by a vector from the lattice point O toward the gravity center G and the s axis is also denoted by φ(x, y) in the present modification as illustrated in FIG. 48. Incidentally, a coordinate component x indicates a position of an x-th lattice point on the X axis, and a coordinate component y indicates a position of a y-th lattice point on the Y axis. When a rotation angle φ is 0°, a direction of the vector direction from the lattice point O toward the gravity center G coincides with the positive direction of the X axis. In addition, a length of the vector from the lattice point O toward the gravity center G is denoted by r(x, y). In one example, r(x, y) is constant (over the entire phase modulation layer 16B) regardless of the coordinate components x and y.

Each of the modified refractive index regions 16c is provided in each of the modified refractive index regions 16b with one-to-one correspondence. Further, each of the modified refractive index regions 16c is positioned on the lattice point O of the virtual square lattice, and the gravity center of each of the modified refractive index regions 16c coincides with the lattice point O of the virtual square lattice in one example. A planar shape of the modified refractive index region 16c is, for example, a circular shape, but may have various planar shapes similarly to the modified refractive index region 16b. FIGS. 49A to 49K illustrate examples of planar shapes and a relative relationship of the modified refractive index regions 16b and 16c on the X-Y plane. FIGS. 49A and 49B illustrates a mode in which the modified refractive index regions 16b and 16c have different figure shapes, and gravity centers thereof are separated from each other. FIGS. 49C and 49D illustrate a mode in which the modified refractive index regions 16b and 16c have the same shape, of gravity centers thereof are separated from each other, and parts thereof overlap with each other. FIG. 49E illustrates a mode in which the modified refractive index regions 16b and 16c have the same shape, and gravity centers thereof are separated from each other, and a relative angle of the modified refractive index regions 16b and 16c is arbitrarily set (rotated by an arbitrary angle) at each lattice point. FIG. 49F illustrates a mode in which the modified refractive index regions 16b and 16c have different figure shapes, and gravity centers thereof are separated from each other. FIG. 49G illustrates a mode in which the modified refractive index regions 16b and 16c have different figure shapes, gravity centers thereof are separated from each other, and a relative angle of the modified refractive index regions 16b and 16c is arbitrarily set (rotated by an arbitrary angle) for each lattice point. Among them, the two modified refractive index regions 16b and 16c rotate so as not to overlap with each other in FIGS. 49E and 49G.

In addition, the modified refractive index region 16b may be configured to include two regions 16b1 and 16b2 separated from each other as illustrated in FIGS. 49H to 49K. Further, a combined gravity center of the regions 16b1 and 6b2 may be separated from the gravity center of the modified refractive index region 16c, and an angle of a straight line connecting the regions 16b1 and 16b2 with respect to the X axis may be arbitrarily set for each lattice point. In addition, the regions 16b1 and 16b2 and the modified refractive index region 16c may have the same figure shape in this case as illustrated in FIG. 49H. Alternatively, two out of the regions 16b1 and 16b2 and the modified refractive index region 16c may have a figure different from the other as illustrated in FIG. 49I. In addition, an angle of the modified refractive index region 16c with respect to the X axis may be arbitrarily set for each lattice point in addition to the angle of the straight line connecting the regions 16b1 and 16b2 with respect to the X axis as illustrated in FIG. 49J. In addition, the angle of the straight line connecting the regions 16b1 and 16b2 with respect to the X axis may be arbitrarily set for each lattice point while maintaining mutually the same relative angles among the regions 16b1 and 16b2 and the modified refractive index region 16c as illustrated in FIG. 49K. Incidentally, among them, the regions 16b1 and 16b2 may rotate so as not to overlap with the modified refractive index region 16c in FIGS. 49J and 49K.

Figure 50:
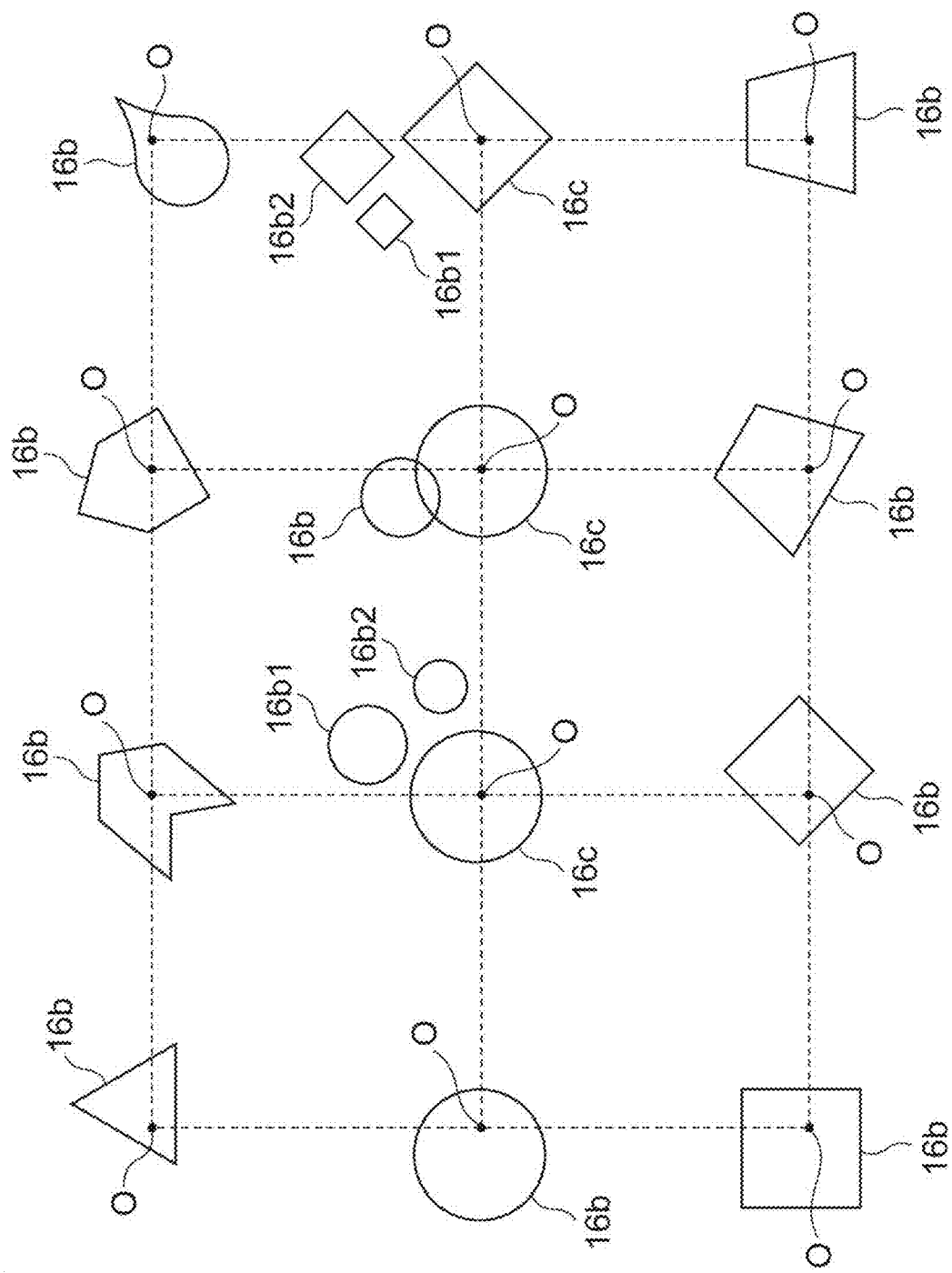
FIG. 50 is a view illustrating examples of the planar shapes of the modified refractive index regions on the X-Y plane.

The planar shapes of the modified refractive index regions on the X-Y plane may be the same between lattice points. That is, the modified refractive index regions may have the same figure at all lattice points and can be caused to overlap with each other between the lattice points by a translational operation or the translational operation and a rotational operation. In that case, it is possible to suppress generation of noise light and 0th-order light causing noise in an output beam pattern. Alternatively, the planar shapes of the modified refractive index regions on the X-Y plane are not necessarily the same between the lattice points, and the shapes may be different between adjacent lattice points, for example, as illustrated in FIG. 50.

For example, it is possible to suitably exhibit the effects of the above-described embodiments even with the configuration of the phase modulation layer as in the present modification.

Fourteenth Modification

Next, a case where an arrangement pattern of the modified refractive index regions 16b in the phase modulation layer 16A is determined by an on-axis shift scheme will be described. Incidentally, even when the on-axis shift scheme is applied as a method for determining the arrangement pattern of the modified refractive index regions 16b in the phase modulation layer 16A, instead of the above-described rotation scheme, a phase modulation layer thus obtained is applied to semiconductor light emitting modules according to the various embodiments described above. When the on-axis shift scheme is adopted, it is possible to align a polarization direction incident from a light source, and thus, it becomes possible to align the polarization direction of light incident on a spatial light modulator so that there are effects that the light utilization efficiency can be improved and unnecessary light can be suppressed.

Figure 51:
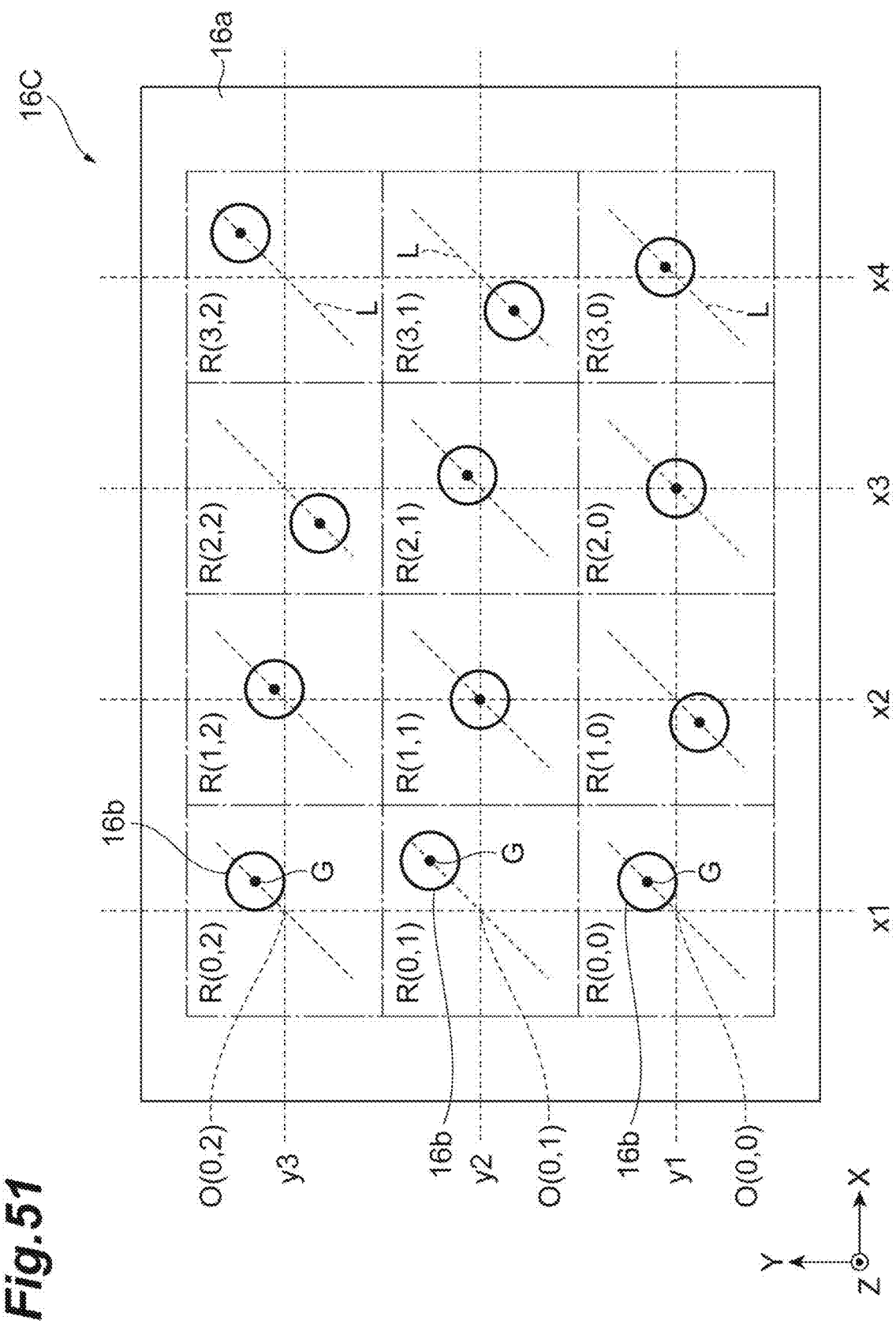
FIG. 51 is a view for describing an example of an arrangement pattern (on-axis shift scheme) of the modified refractive index regions in the phase modulation layer corresponding to the first portion.

FIG. 51 is a schematic view for describing the arrangement pattern (on-axis shift scheme) of the modified refractive index regions 16b in the phase modulation layer 16A. The phase modulation layer 16A includes the base layer 16a and the modified refractive index region 16b having a refractive index different from the refractive index of the base layer 16a. Here, a virtual square lattice defined on the X-Y plane is set in the phase modulation layer 16A, which is similar to the example of FIG. 4. One side of the square lattice is parallel to the X axis and the other side is parallel to the Y axis. At this time, unit constituent regions R each of which has a square shape with a lattice point O of the square lattice as the center thereof can be set two-dimensionally over a plurality of columns (x1 to x4) along the X axis and a plurality of rows (y1 to y3) along the Y axis. If a coordinate of each of the unit constituent regions R is given as a gravity center position of each of the unit constituent regions R, this gravity center position coincides with the lattice point O of the virtual square lattice. A plurality of modified refractive index regions 16b is provided one by one in each of the unit constituent regions R. A planar shape of the modified refractive index region 16b is, for example, a circular shape. The lattice point O may be positioned outside the modified refractive index region 16b or may be included in the modified refractive index region 16b.

Incidentally, a ratio of the area S of the modified refractive index region 16b occupying within one unit constituent region R is referred to as a filling factor (FF). When a lattice interval of the square lattice is a, the filling factor FF of the modified refractive index region 16b is given as $S/a^2$. Here, S is the area of the modified refractive index region 16b on the X-Y plane, and is given as $S=\pi(D/2)^2$ using a diameter D of a perfect circle when the shape of the modified refractive index region 16b is the perfect circle, for example. In addition, when the shape of the modified refractive index region 16b is a square shape, $S=LA^2$ is given using a length LA of one side of the square.

Figure 52:
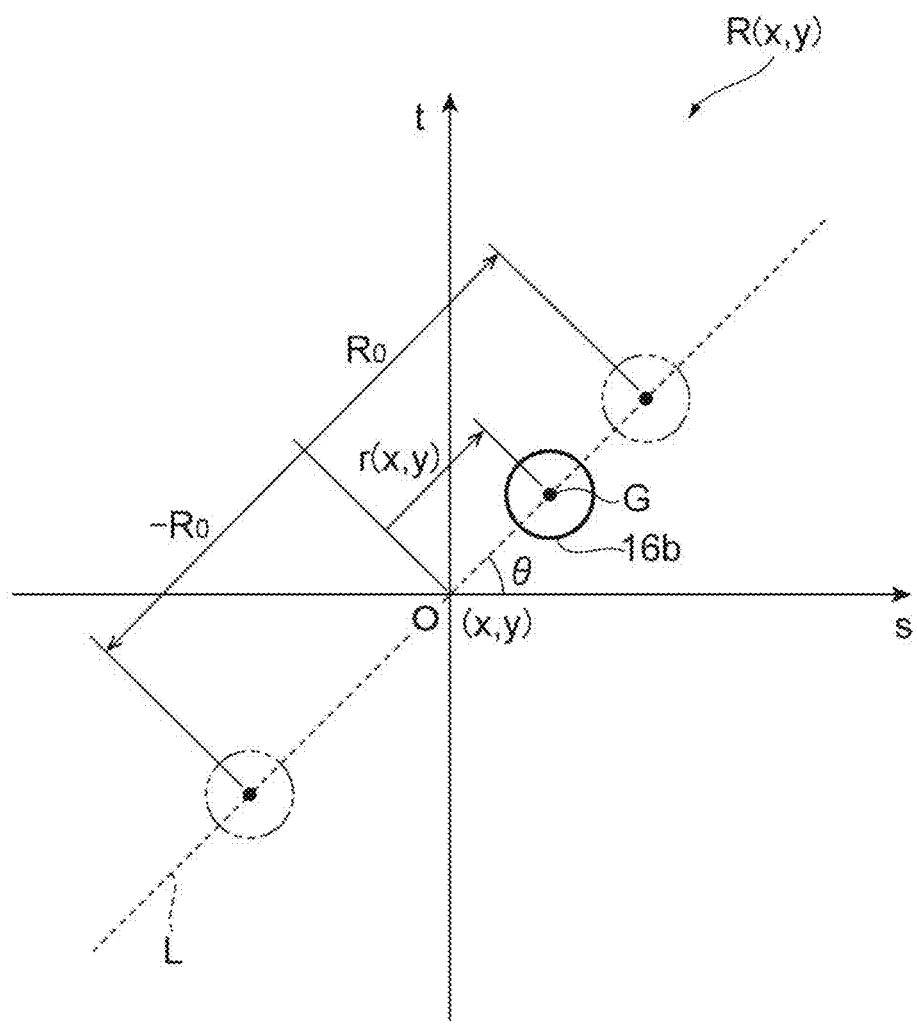
FIG. 52 is a graph for describing a positional relationship of a gravity center of the modified refractive index region and a lattice point in a virtual square lattice as an example of the arrangement pattern determined by the on-axis shift scheme.

FIG. 52 is a graph for describing a positional relationship of the gravity center G of the modified refractive index region 16b and the lattice point O(x, y) in the virtual square lattice as an example of the arrangement pattern determined by the on-axis shift scheme. As illustrated in FIG. 52, the gravity center G of each of the modified refractive index regions 16b is arranged on a straight line L. The straight line L is a straight line that passes through the corresponding lattice point O(x, y) of the unit constituent region R(x, y) and is inclined with respect to each side of the square lattice. In other words, the straight line L is the straight line that is inclined with respect to both the s axis and the t axis that define the unit constituent region R(x, y). A tilt angle of the straight line L with respect to the s-axis is θ. The tilt angle θ is constant inside the phase modulation layer 16A. The tilt angle θ satisfies 0°<θ<90°, and in one example, θ=45°. Alternatively, the tilt angle θ satisfies 180°<θ<270°, and in one example, θ=225°. When the tilt angle θ satisfies 0°<θ<90° or 180°<θ<270°, the straight line L extends from the first quadrant to the third quadrant of the coordinate plane defined by the s axis and the t axis. Alternatively, the tilt angle θ satisfies 90°<θ<180°, and in one example, θ=135°. Alternatively, the tilt angle θ satisfies 270°<θ<360°, and in one example, θ=3150. When the tilt angle θ satisfies 90°<θ<180° or 270°<θ<360°, the straight line L extends from the second quadrant to the fourth quadrant of the coordinate plane defined by the s axis and the t axis. In this manner, the tilt angle θ is an angle excluding 0°, 90°, 180°, and 270°. Here, a distance between the lattice point O(x, y) and the gravity center G is denoted by r(x, y). Here, x represents a position of an x-th lattice point on the X axis, and y represents a position of a y-th lattice point on the Y axis. When the distance r(x, y) is a positive value, the gravity center G is positioned in the first quadrant (or the second quadrant). When the distance r(x, y) is a negative value, the gravity center G is positioned in the third quadrant (or the fourth quadrant). When the distance r(x, y) is zero, the lattice point O and the gravity center G coincide with each other.

The distance r(x, y) between the gravity center G of each of the modified refractive index regions 16b and the corresponding lattice point O(x, y) of the unit constituent region R(x, y) illustrated in FIG. 51 is set for each of the modified refractive index regions 16b according to a target output beam pattern (optical image). The distribution of the distance r(x, y) has a specific value for each position determined by values of x (x1 to x4 in the example of FIG. 51) and y (y1 to y3 in the example of FIG. 51), but is not necessarily expressed by a specific function. The distribution of the distance r(x, y) is determined by extracting the phase distribution from the complex amplitude distribution obtained by inverse Fourier transform of the target output beam pattern. That is, as illustrated in FIG. 52, the distance r(x, y) is set to zero when the phase P(x, y) in the unit constituent region R(x, y) is $P_0$, the distance r(x, y) is set to the maximum value $R_0$ when the phase P(x, y) is $\pi+P_0$, and the distance r(x, y) is set to the minimum value $-R_0$ when the phase P(x, y) is $-\pi+P_0$. Thus, for the intermediate phase P(x, y) thereof, the distance r(x, y) is such that r(x, y)={P(x, y)−$P_0$}×$R_0$/π. Here, the initial phase $P_0$ can be set arbitrarily. When the lattice interval of the square lattice is a, the maximum value $R_0$ of r(x, y) is, for example, in the range of the following Formula (10).

$$0 \leq R_0 \leq \frac{a}{\sqrt{2}} \quad (10)$$

Incidentally, reproducibility of the beam pattern is improved by applying an iterative algorithm such as the Gerchberg-Saxton (GS) method which is generally used in hologram generation calculation at the time of obtaining the complex amplitude distribution from the target output beam pattern.

Incidentally, a relationship between the optical image obtained as the output beam pattern and the phase distribution P(x, y) in the phase modulation layer 16A is the same as that in the case of the rotation scheme described above (FIG. 5). Therefore, the phase modulation layer 16A is configured to satisfy the following condition under the above first precondition defining the square lattice, the above second precondition defined by the above Formulas (1) to (3), the above third precondition defined by the above Formulas (4) and (5), and the above fourth precondition defined by the above Formulas (6) and (7). That is, the corresponding modified refractive index region 16b is arranged in the unit constituent region R(x, y) such that the distance r(x, y) from the lattice point O(x, y) to the gravity center G of the corresponding modified refractive index region 16b satisfies a relationship of $$r(x,y)=C \times (P(x,y)-P_0)$$

C: a proportional constant, for example, $R_0/\pi$
$P_0$: an arbitrary constant, for example, 0.

That is, the distance r(x, y) is set to zero when the phase P(x, y) in the unit constituent region R(x, y) is $P_0$, is set to the maximum value $R_0$ when the phase P(x, y) is $\pi+P_0$, and is set to the minimum value $-R_0$ when the phase P(x, y) is $-\pi+P_0$. When it is desired to obtain a target output beam pattern, the output beam pattern may be subjected to inverse Fourier transform, and the distribution of the distance r(x, y) corresponding to the phase P(x, y) of the complex amplitude may be given to the plurality of modified refractive index regions 16b. The phase P(x, y) and the distance r(x, y) may be proportional to each other.

Incidentally, a far-field image after the Fourier transform of the laser beam can take various shapes such as a single spot shape or a plurality of spot shapes, an annular shape, a linear shape, a character shape, a double annular shape, and a Laguerre Gaussian beam shape. In addition, the output beam pattern is represented by angle information in the far field, and thus, the inverse Fourier transform may be performed after once converting the pattern to the angle information and then, converting the angle information to the wave number space in the case of a bit map image or the like in which the target output beam pattern is represented by two-dimensional position information.

As a method for obtaining the intensity distribution and the phase distribution from the complex amplitude distribution obtained by the inverse Fourier transform, for example, the intensity distribution A(x, y) can be calculated by using the abs function of numerical analysis software "MATLAB" of MathWorks, Inc., and the phase distribution P(x, y) can be calculated by using the angle function of MATLAB.

Figure 53A:
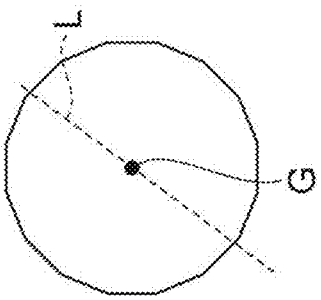
FIGS. 53A to 53G are views illustrating examples (on-axis shift scheme) of a planar shape of the modified refractive index region.
Figure 53B:
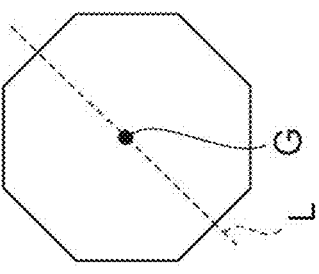
Figure 53C:
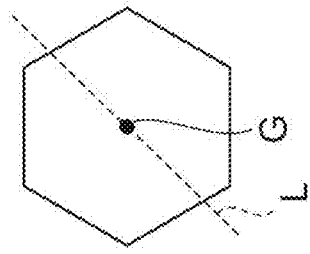
Figure 53D:
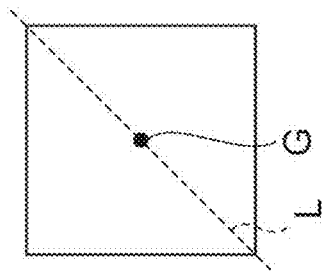
Figure 53E:
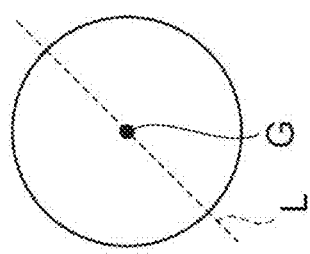
Figure 53F:
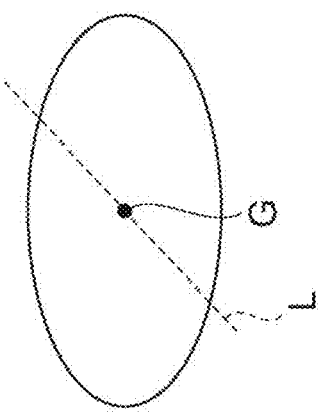
Figure 53G:
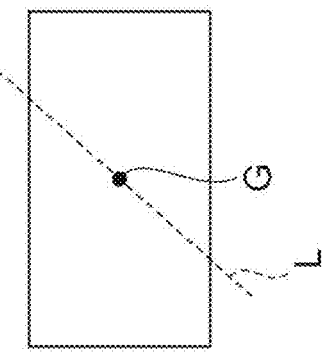

FIGS. 53A to 53G and 54A to 54K are views illustrating various examples (on-axis shift scheme) of the planar shape of the modified refractive index region. In the above example, the shape of the modified refractive index region 16b on the X-Y plane is the circular shape. However, the modified refractive index region 16b may have a shape other than the circular shape. For example, the shape of the modified refractive index region 16b may have mirror-image symmetry (line symmetry). Here, the mirror-image symmetry (line symmetry) represents that a planar shape of the modified refractive index region 16b positioned on one side of a straight line and a planar shape of the modified refractive index region 16b positioned on the other side of the straight line can be mirror-image symmetric (line symmetric) with each other with a certain straight line along X-Y plane interposed therebetween. Examples of the shape having mirror-image symmetry (line symmetry) includes a perfect circle illustrated in FIG. 53A, a square illustrated in FIG. 53B, a regular hexagon illustrated in FIG. 53C, a regular octagon illustrated in FIG. 53D, a regular hexadecagon illustrated in FIG. 53E, a rectangle illustrated in FIG. 53F, an ellipse illustrated in FIG. 53C, and the like. When the shape of the modified refractive index region 16b on the X-Y plane has the mirror-image symmetry (line symmetry) in this manner, the direction and position of the gravity center G of the modified refractive index region 16b corresponding to the lattice point O can be determined with high accuracy due to the simple shape in each of the unit constituent regions R of the virtual square lattice of the phase modulation layer 16A. That is, it is possible to perform patterning with high accuracy.

Figure 54A:
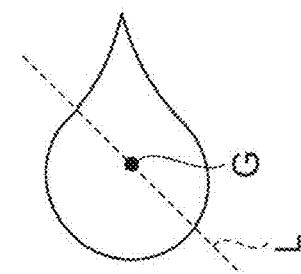
FIGS. 54A to 54K are views illustrating other examples (on-axis shift scheme) of the planar shape of the modified refractive index region.
Figure 54B:
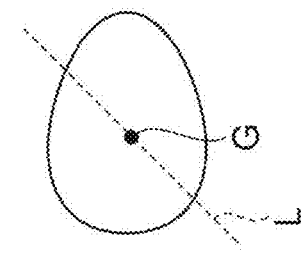
Figure 54C:
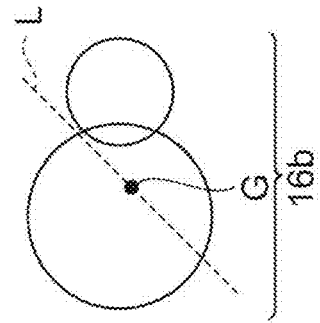
Figure 54D:
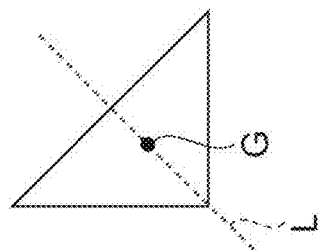
Figure 54E:
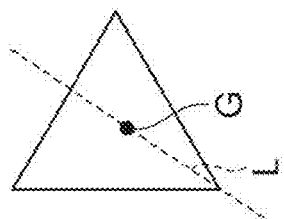
Figure 54F:
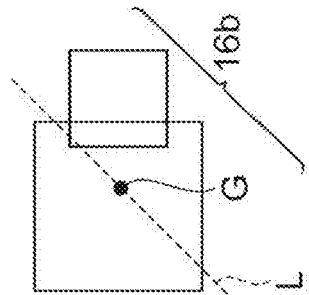
Figure 54G:
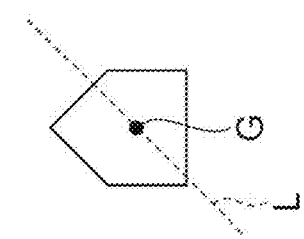
Figure 54H:
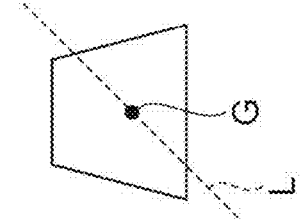
Figure 54I:
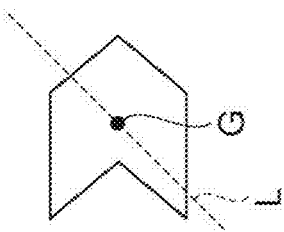
Figure 54J:
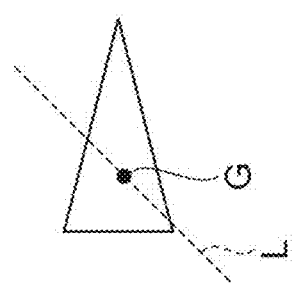
Figure 54K:
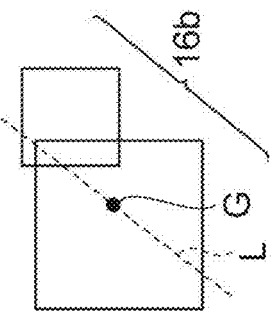

In addition, the shape of the modified refractive index region 16b on the X-Y plane may have a shape that does not have a 180-degree rotational symmetry. Examples of such a shape include an equilateral triangle illustrated in FIG. 54A, a right-angled isosceles triangle illustrated in FIG. 54B, a shape in which two circles or ellipses partially overlap with each other illustrated in FIG. 54C, an egg shape illustrated in FIG. 54D, a teardrop shape illustrated in FIG. 54E, an isosceles triangle illustrated in FIG. 54F, an arrow shape illustrated in FIG. 54G a trapezoid illustrated in FIG. 54H, a pentagon illustrated in FIG. 54I, a shape in which two rectangles partially overlap with each other illustrated in FIG. 54J, a shape in which two rectangles partially overlap with each other without mirror-image symmetry illustrated in FIG. 54K, and the like. Incidentally, the egg shape is a shape deformed such that a dimension of an ellipse in a short-axis direction in the vicinity of one end portion along a long axis is smaller than a dimension in the short-axis direction in the vicinity of the other end portion. The teardrop shape is a shape obtained by deforming one end portion along the long axis of the ellipse into a sharp end portion protruding along a long-axis direction. The arrow shape is a shape in which one side of a rectangle is recessed in a triangle shape and a side opposing the one side is made sharp into a triangle shape. Since the shape of the modified refractive index region 16b on the X-Y plane does not have the 180-degree rotational symmetry in this manner, it is possible to obtain a more intensive light output. Incidentally, the modified refractive index region 16b may be configured using a plurality of elements as illustrated in FIGS. 54J and 54K, and in this case, the gravity center G of the modified refractive index region 16b is a combined gravity center of the plurality of components.

Figure 56:
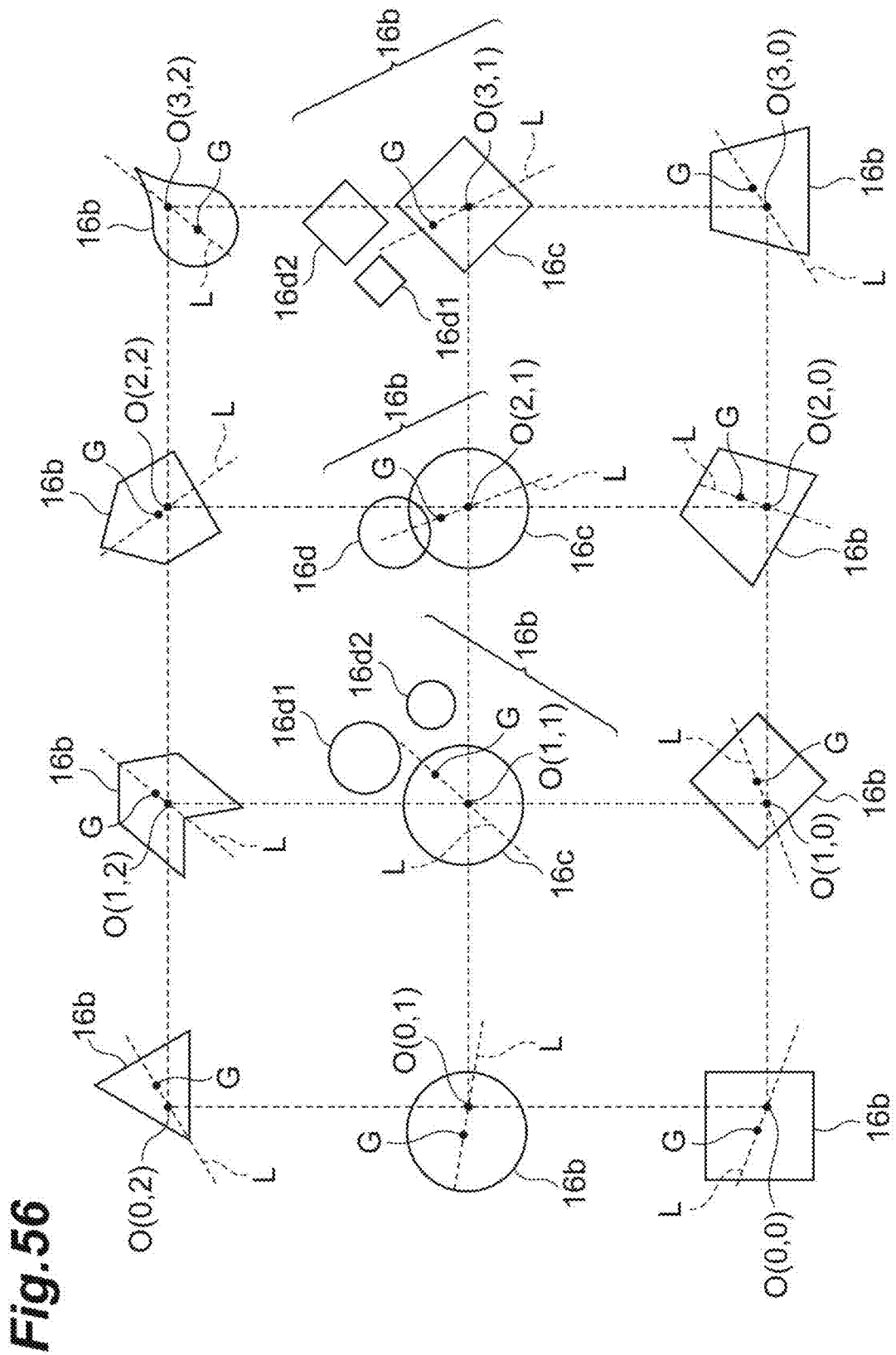
FIG. 56 is a view illustrating application examples (on-axis shift scheme) of the planar shape of the modified refractive index region.

FIGS. 55A to 55K are views illustrating still other examples (on-axis shift scheme) of the planar shape of the modified refractive index region. FIG. 56 is a view illustrating a second modification of the phase modulation layer in FIG. 51.

In the examples illustrated in FIGS. 55A to 55K and 56, each of the modified refractive index regions 16b includes a plurality of components 16c and 16d (each having a modified refractive index region). The gravity center G is a combined gravity center of all the components and is positioned on the straight line L. Both the components 16c and 16d have a refractive index different from a refractive index of the base layer 16a. Both the components 16c and 16d may be holes, or may be configured by embedding a compound semiconductor in the holes. In each of the unit constituent regions R, the components 16c are provided in one-to-one correspondence with the components 16d. Further, the combined gravity center G of the components 16c and 16d, is positioned on a straight line L that crosses the lattice point O of the unit constituent region R constituting the virtual square lattice. Incidentally, both the components 16c and 16d are included in the range of the unit constituent region R constituting the virtual square lattice. The unit constituent region R is a region surrounded by a straight line that bisects the lattice point of the virtual square lattice.

A planar shape of the component 16c is, for example, a circular shape, but can have various shapes such as various examples illustrated in FIGS. 53A to 53G and 54A to 54K. FIGS. 55A to 55K illustrate examples of shapes and a relative relationship of the components 16c and 16d on the X-Y plane. FIGS. 55A and 55B illustrate a mode in which both of the components 16c and 16d have the same figure shape. FIGS. 55C and 55D illustrate a mode in which both the components 16c and 16d have the same figure shape, and each part thereof overlap with each other. FIG. 55E illustrates a mode in which both the components 16c and 16d have the same figure shape, and a distance between the gravity centers of the components 16c and 16d is arbitrarily set for each lattice point. FIG. 55F illustrates a mode in which the components 16c and 16d have different figure shapes. FIG. 55G illustrates a mode in which the components 16c and 16d have different figure shapes, and a distance between the gravity centers of the components 16c and 16d is arbitrarily set for each lattice point.

In addition, the component 16d constituting a part of the modified refractive index region 16b may be constituted by two regions 16d1 and 16d2, which are separated from each other, as illustrated in FIGS. 55H to 55K. Further, a distance between a combined gravity center of the regions 16d1 and 16d2 (corresponding to the gravity center of the single component 16d) and the gravity center of the component 16c may be arbitrarily set for each lattice point. In this case, the regions 16d1 and 16d2 and the component 16c may have the same figure shape as illustrated in FIG. 55H. Alternatively, two out of the regions 16d1 and 16d2 and the component 16c may have a figure different from the other as illustrated in FIG. 55I. In addition, an angle of the component 16c with respect to the s-axis may be arbitrarily set for each of the unit constituent regions R in addition to an angle of a straight line connecting the regions 16d1 and 16d2 with respect to the s-axis as illustrated in FIG. 55J. In addition, the angle of the straight line connecting the regions 16d1 and 16d2 with respect to the s-axis may be arbitrarily set for each of the unit constituent regions R while maintaining mutually the same relative angles among the regions 16d1 and 16d2 and the component 16c as illustrated in FIG. 55K.

Incidentally, the planar shapes of the modified refractive index regions 16b may be the same between the unit constituent regions R. That is, the modified refractive index regions 16b may have the same figure in all the unit constituent region R, and can be caused to overlap with each other between the lattice points by a translational operation or the translational operation and a rotational operation. In that case, it is possible to suppress generation of noise light and 0th-order light causing noise in an output beam pattern. Alternatively, the planar shapes of the modified refractive index regions 16b are not necessarily the same between the unit constituent regions R, and the shapes may be different between adjacent unit constituting regions R, for example, as illustrated in FIG. 56. Incidentally, the center of the straight line L passing through each lattice point O is preferably set to coincide with the lattice point O in any case of FIGS. 53A to 53G 54A to 54K, 55A to 55K, and 56.

As described above, the same effects as those of the embodiment to which the phase modulation layer in which the arrangement pattern of the modified refractive index regions is determined by the rotation scheme is applied can be suitably achieved even with the configuration of the phase modulation layer in which the arrangement pattern of the modified refractive index regions is determined by the on-axis shift scheme.

Fifteenth Modification

Figure 57A:
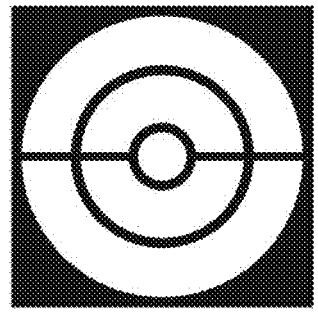
Figure 57B:
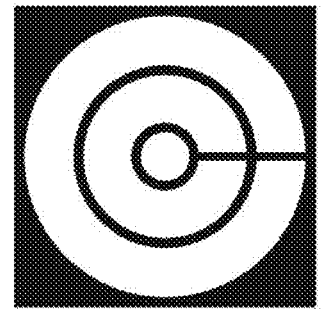

FIGS. 57A to 57E and 58A to 58G are views illustrating other example of a planar shape of the electrode 18 illustrated in FIG. 1 and the like, or the electrode 34 illustrated in FIG. 18 and the like. FIGS. 57A and 57B illustrate planar shapes in which a plurality of annular electrode portions having different diameters are arranged as concentric circles (so as to have a common center). The plurality of electrode portions are connected to each other by a linear electrode portion extending in the radial direction. The plurality of linear electrode portions may be provided as illustrated in FIG. 57A, or only one linear electrode portion may be provided as illustrated in FIG. 57B.

Figure 57C:
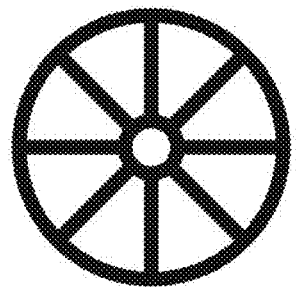
Figure 57D:
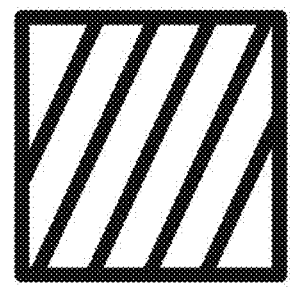
Figure 57E:
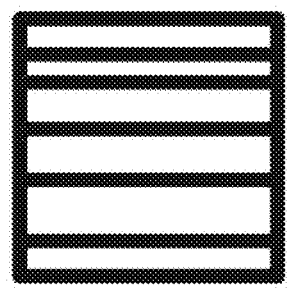

FIG. 57C illustrates a planar shape in which the plurality of linear electrode portions radially extend from a certain center point. These electrode portions are connected to each other at both ends through a pair of annular electrode portions having the center point as the center. FIG. 57D illustrates a case where the plurality of linear electrode portions in FIG. 10 are inclined with respect to the X-axis direction (or Y-axis direction). FIG. 57E illustrates a case where intervals between the plurality of linear electrode portions in FIG. 10 are not constant (non-periodic).

Figure 58A:
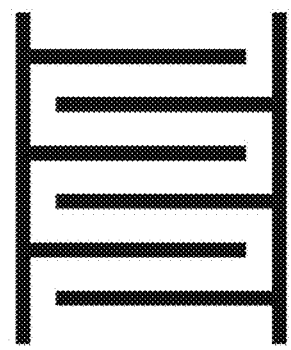
Figure 58B:
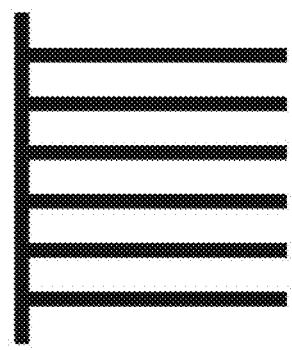

FIG. 58A illustrates a planar shape in which two comb-shaped electrodes, obtained by arranging the plurality of linear electrode portions extending in the X-axis direction (or Y-axis direction) in the Y-axis direction (or X-axis direction) and connecting one ends of the linear electrode portions to each other through another electrode portion extending in the Y-axis direction (or X-axis direction), face each other. The plurality of linear electrode portions of one comb-shaped electrode and the plurality of linear electrode portions of the other comb-shaped electrode are alternatingly arranged along the Y-axis direction (or X-axis direction). FIG. 58B illustrates a shape formed of only one comb-shaped electrode illustrated in FIG. 58A.

Figure 58C:
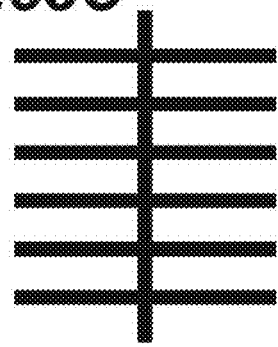
Figure 58D:
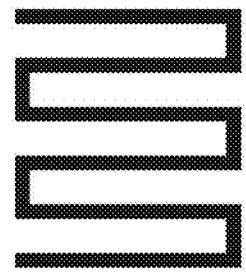
Figure 58E:
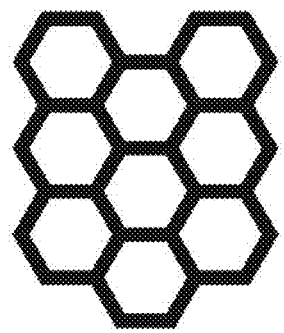
Figure 58F:
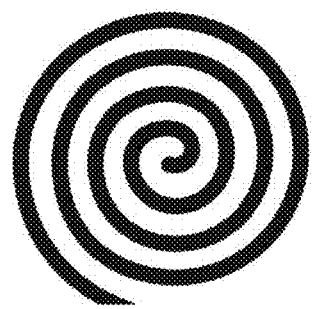
Figure 58G:
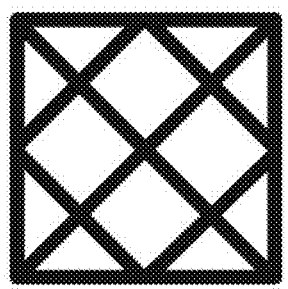

FIG. 58C illustrates a fishbone shape in which a plurality of linear electrode portions extending in the X-axis direction (or Y-axis direction) are arranged in the Y-axis direction (or X-axis direction) and centers thereof are connected to each other through another electrode portion extending in the Y-axis direction (or X-axis direction). FIG. 58D illustrates a square wave shape in which a plurality of linear electrode portions extending in the X-axis direction (or Y-axis direction) are connected alternately at one end and the other end. FIG. 58E illustrates a honeycomb shape in which a plurality of hexagonal unit structures are two-dimensionally arranged. FIG. 58F illustrates a spiral shape. FIG. 58G illustrates an oblique mesh shape in which a square lattice frame is inclined with respect to the X-axis direction and the Y-axis direction.

The planar shape of the electrode 18 or 34 is not limited to the square lattice shape as in the first embodiment (see FIG. 2), the stripe shape as in the first modification (see FIG. 10), and the frame shape (see FIG. 19) as in the fifth modification described above, but various planar shapes as illustrated in the present modifications are applicable. All the planar shapes illustrated in the present modifications include a portion positioned on the vicinity of the center of the active layer 13 and are shapes that allow the current to be efficiently dispersed to the center of the active layer 13. In addition, in the case of the stripe shape illustrated in FIG. 10, 57D, or 57E, the same effect as that of the lattice shape can be obtained (light extraction efficiency can be increased) with a smaller coverage than that of the lattice shape (in other words, with a larger aperture ratio than that of the lattice shape) regarding the current supply to the center of the active layer 13. The same description applies to the comb-shaped electrode illustrated in FIG. 58A or 58B or the fishbone shape illustrated in FIG. 58C. In addition, window function noise can be reduced in the case of the concentric shapes illustrated in FIGS. 57A and 57B. Here, the window function noise is a diffraction pattern generated when openings are periodically arranged. This diffraction pattern is generated along periodic structures when the periodic structures are arranged one-dimensionally or two-dimensionally. On the other hand, when the periodic structures are arranged concentrically, the diffraction pattern is dispersed in all directions perpendicular to the circumference, so that a peak value of the window function noise can be reduced.

The light-emitting device according to the invention is not limited to the above-described embodiments, and various other modifications can be made. For example, the semiconductor light-emitting device made of the semiconductor of GaAs-base, InP-base, and nitride-base (particularly, GaN-base) compounds has been exemplified in the above-described embodiments, but the light-emitting device of the present invention can include semiconductor light-emitting devices made of various semiconductor materials other than these.

In addition, the semiconductor light-emitting device applicable to the light-emitting device according to the present invention has a degree of freedom in terms of a material system, a film thickness, and a layer configuration. Here, a scaling rule holds regarding a so-called square lattice photonic crystal laser in which perturbation of the modified refractive index region from the virtual square lattice is zero. That is, when a wavelength becomes constant α times, the same standing wave state can be obtained by multiplying the entire square lattice structure by α. Similarly, it is possible to determine the structure of the phase modulation layer according to the scaling rule for a wavelength other than the above-described wavelengths in the invention. Therefore, it is also possible to realize the semiconductor light-emitting device that outputs visible light by using the active layer that emits light such as blue, green, and red, and applying the scaling rule depending on the wavelength.

REFERENCE SIGNS LIST 1A to 1N . . . light-emitting device; 8a . . . first portion; 8b . . . second portion; 9 . . . semiconductor substrate; 9a . . . main surface; 9b . . . back surface; 10A to 10F . . . semiconductor light-emitting device; 10a . . . light output surface; 11 . . . semiconductor laminate portion; 12 . . . lower cladding layer; 13 . . . active layer; 14 . . . upper cladding layer; 15 . . . contact layer; 16A, 16B . . . phase modulation layer; 16a . . . base layer; 16b, 16c, 16d . . . modified refractive index region; 17 . . . light guide layer; 18, 19, 33, 34 . . . electrode; 18a, 19a, 34a . . . opening; 20 . . . spatial light modulator; 20a . . . light input/output surface; 21 . . . common electrode; 22 . . . liquid crystal layer; 23 . . . reflection film; 24 . . . protective film; 25 . . . pixel electrode; 26 . . . circuit board; 27 . . . first region; 28 . . . second region; 31, 32 . . . anti-reflection film; 40, 41 . . . support substrate; 42 . . . element electrode; 42a . . . metal film; 42b . . . conductive adhesive; 43 . . . pad electrode; 44 . . . wiring; 51 . . . wavelength conversion medium; 100 . . . light-emitting device; 101 . . . photonic crystal layer; 102 . . . electrode; 102a . . . opening; 103 . . . anti-reflection film; 110 . . . semiconductor light-emitting device; D1 to D3 . . . unit region; G . . . gravity center; L . . . light; O . . . lattice point; and R . . . unit constituent region

The invention claimed is:

1. A light-emitting device comprising:
a semiconductor light-emitting device having a light output surface and outputting light in a direction inclined with respect to a normal direction of the light output surface; and
a reflection type spatial light modulator having a light input/output surface arranged so as to be partially face the light output surface, the reflection type spatial light modulator modulating at least one of a phase and an intensity of the light from the semiconductor light-emitting device inputted through the light input/output surface and outputting the modulated light from the light input/output surface, wherein the semiconductor light-emitting device comprises:
- a semiconductor substrate having a main surface and a back surface opposing the main surface;
- a semiconductor laminate portion including an active layer, a phase modulation layer, an upper surface, and a lower surface, the upper surface and the lower surface arranged to sandwich the active layer and the phase modulation layer, the semiconductor laminate portion arranged on the main surface of the semiconductor substrate such that the lower surface faces the main surface;
- a first electrode provided on the upper surface of the semiconductor laminate portion; and
- a second electrode provided on the back surface of the semiconductor substrate,
- wherein the light output surface of the semiconductor light-emitting device facing to the reflection type spatial light modulator is included in the upper surface of the semiconductor laminate portion or the back surface of the semiconductor substrate,
- wherein the phase modulation layer includes a base layer having a predetermined refractive index and a plurality of modified refractive index regions having a refractive index different from the refractive index of the base layer,
- wherein an area of the light output surface of the semiconductor light-emitting device is smaller than an area of the light input/output surface of the spatial light modulator, and
- wherein the plurality of modified refractive index regions are arranged so as to avoid a space through which the modulated light from the reflection type spatial light modulator passes.

2. The light-emitting device according to claim 1, wherein in a state where a virtual square lattice is set on a design surface of the phase modulation layer perpendicular to the normal direction, each of the plurality of modified refractive index regions is arranged such that a gravity center is separated from a corresponding lattice point of the virtual square lattice by a predetermined distance and a vector from the corresponding lattice point toward the gravity center has a predetermined rotation angle around the corresponding lattice point.

3. The light-emitting device according to claim 1, wherein in a state where a virtual square lattice is set on a design surface of the phase modulation layer perpendicular to the normal direction, each of the plurality of modified refractive index regions is arranged such that a gravity center is linear on a straight line having a predetermined length with a corresponding lattice point of the virtual square lattice as a midpoint in accordance with a predetermined phase angle.

4. The light-emitting device according to claim 1, wherein the light input/output surface of the reflection type spatial light modulator includes a first region facing the semiconductor light-emitting device and a second region arranged at a position different from the first region, and
relative positions of the spatial light modulator and the semiconductor light-emitting device are set such that the light from the semiconductor light-emitting device is inputted into the spatial light modulator through the first region and the modulated light is outputted from the second region to an outside of the semiconductor light-emitting device.

5. The light-emitting device according to claim 1, wherein the semiconductor light-emitting device includes a first portion extending from the upper surface of the semiconductor laminate portion to the back surface of the semiconductor substrate and having the light output surface and a second portion extending from the upper surface of the semiconductor laminate portion to the back surface of the semiconductor substrate and arranged at a position different from the first portion along the upper surface of the semiconductor laminate portion,
the first electrode is provided on an upper surface of the first portion, which constitutes a part of the upper surface of the semiconductor laminate portion, and the second electrode is provided on a back surface of the first portion, which constitutes a part of the back surface of the semiconductor substrate, and
relative positions of the semiconductor light-emitting device and the spatial light modulator are set such that the light, modulated after being inputted from the light output surface of the first portion to the light input/output surface of the spatial light modulator, passes through the second portion.

6. The light-emitting device according to claim 5, further comprising
an anti-reflection film provided on both of the upper surface of the second portion constituting a part of the upper surface of the semiconductor laminate portion and the back surface of the second portion constituting a part of the back surface of the semiconductor substrate.

7. The light-emitting device according to claim 6, wherein a part of the phase modulation layer included in the second portion is configured using only the base layer.

8. The light-emitting device according to claim 5, wherein a part of the phase modulation layer included in the second portion is configured using only the base layer.

9. The light-emitting device according to claim 1, further comprising
a light-transmissive support substrate provided between the semiconductor light-emitting device and the spatial light modulator and configured to fix the semiconductor light-emitting device to the spatial light modulator.

10. The light-emitting device according to claim 9, wherein
the support substrate includes a wiring configured to supply a current to an electrode closer to the spatial light modulator between the first electrode and the second electrode.

11. The light-emitting device according to claim 1, wherein
a planar shape, defined on a plane perpendicular to the normal direction, of an electrode closer to the spatial light modulator between the first electrode and the second electrode is any of a lattice shape, a stripe shape, a concentric shape, a radial shape, and a comb shape.

12. The light-emitting device according to claim 10, wherein
a planar shape, defined on a plane perpendicular to the normal direction, of the electrode closer to the spatial light modulator is any of a lattice shape, a stripe shape, a concentric shape, a radial shape, and a comb shape.

13. The light-emitting device according to claim 1, wherein
   the light outputted from the semiconductor light-emitting device is at least one of 1st-order light and −1st-order light.

\* \* \* \* \*